(12) United States Patent
Suzuki et al.

(10) Patent No.: US 7,898,032 B2
(45) Date of Patent: Mar. 1, 2011

(54) SEMICONDUCTOR DEVICE AND A METHOD OF MANUFACTURING THE SAME

(75) Inventors: Takaya Suzuki, Tokyo (JP); Takashi Ipposhi, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 165 days.

(21) Appl. No.: 11/672,487

(22) Filed: Feb. 7, 2007

(65) Prior Publication Data

US 2007/0221995 A1    Sep. 27, 2007

(30) Foreign Application Priority Data

Mar. 23, 2006    (JP) .............. 2006-081202

(51) Int. Cl.
*H01L 27/12* (2006.01)
(52) U.S. Cl. ...................... 257/350; 257/379
(58) Field of Classification Search .......... 257/350, 257/379, 536, 538
See application file for complete search history.

(56) References Cited

U.S. PATENT DOCUMENTS

| 5,466,484 A | * | 11/1995 | Spraggins et al. | ........... 438/385 |
| 6,320,241 B1 | | 11/2001 | Okamoto | |
| 6,627,954 B1 | * | 9/2003 | Seefeldt | ........... 257/350 |
| 6,693,315 B2 | | 2/2004 | Kuroda et al. | |
| 7,045,865 B2 | | 5/2006 | Amishiro et al. | |
| 7,221,026 B2 | * | 5/2007 | Bhattacharyya | ........... 257/350 |

FOREIGN PATENT DOCUMENTS

| CN | 1250229 A | 4/2000 |
| JP | 2002-158278 A | 3/2002 |
| JP | 2002-261244 A | 9/2002 |

* cited by examiner

*Primary Examiner*—Mark Prenty
(74) *Attorney, Agent, or Firm*—Miles & Stockbridge P.C.

(57) ABSTRACT

The present invention realizes the miniaturization of a semiconductor device. On a first insulation film, an island-like semiconductor layer and a second insulation film which surrounds the semiconductor layer are formed, and resistance elements (for example, poly-silicon resistance elements) which are formed of a conductive film are arranged to be overlapped to an upper surface of the semiconductor layer in plane.

39 Claims, 41 Drawing Sheets

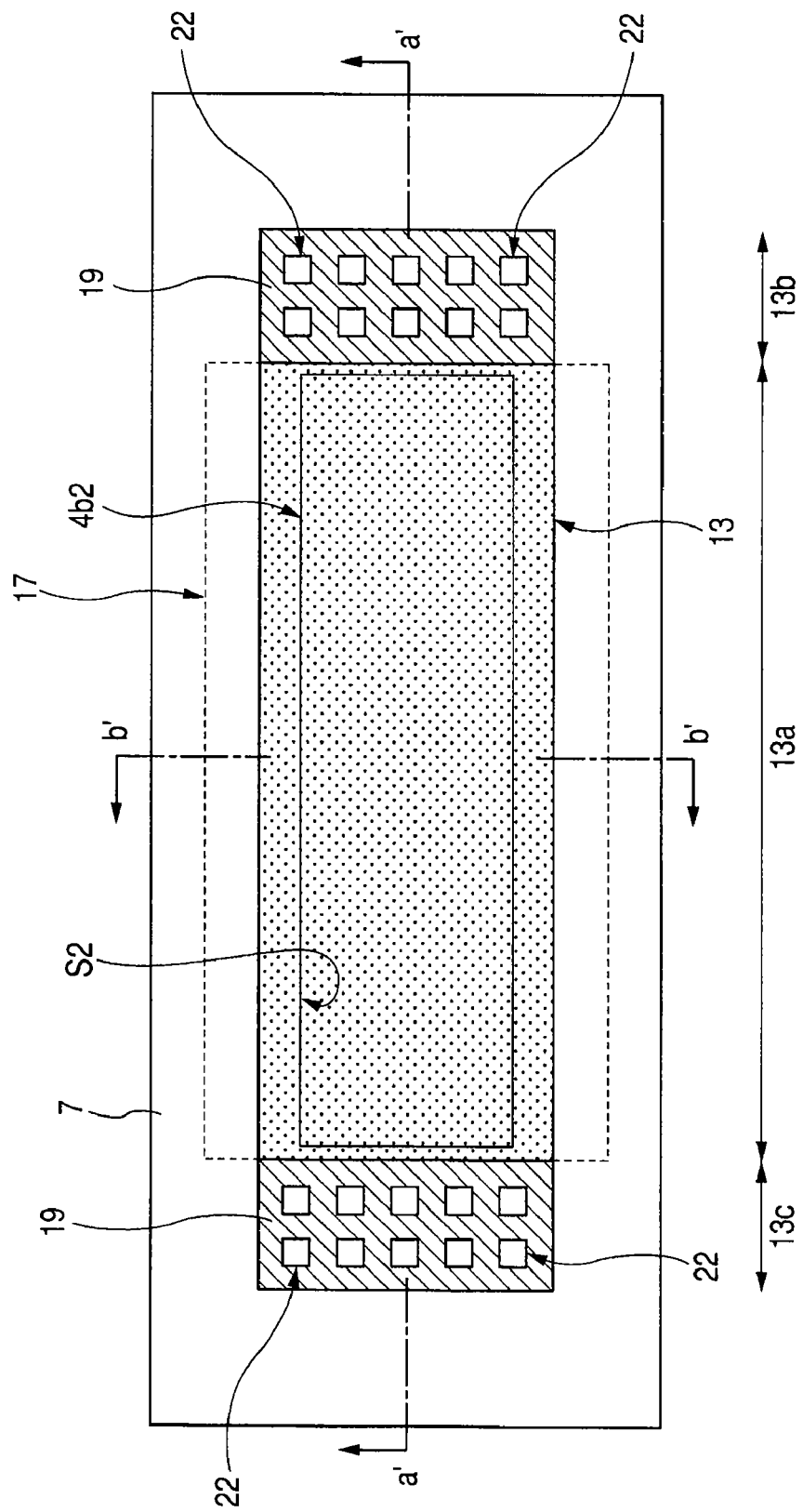

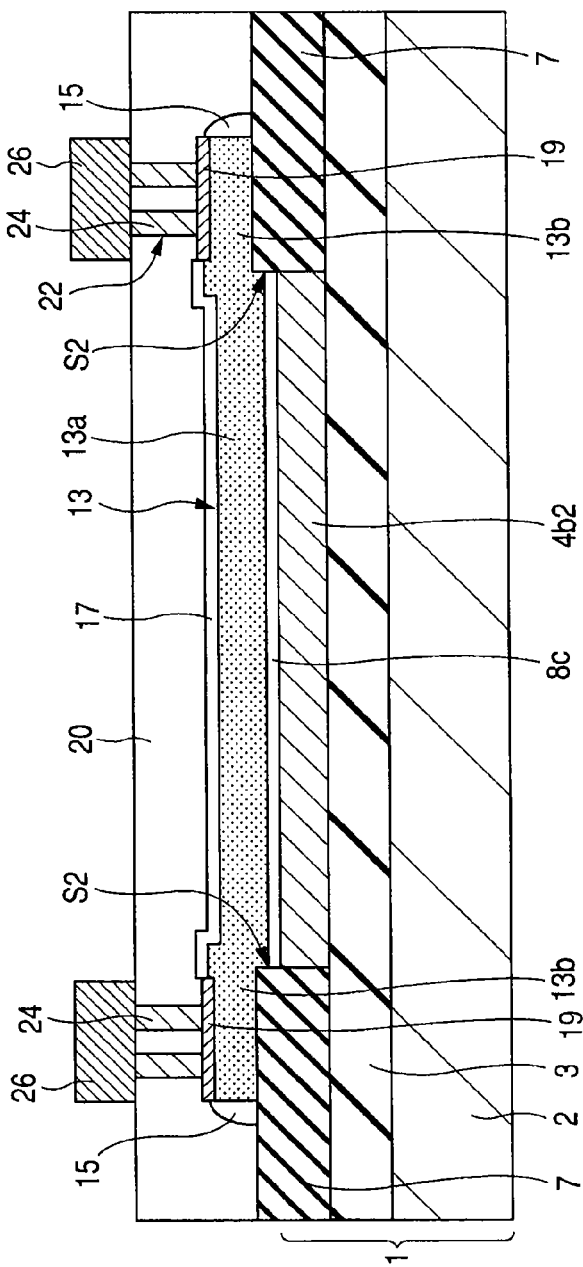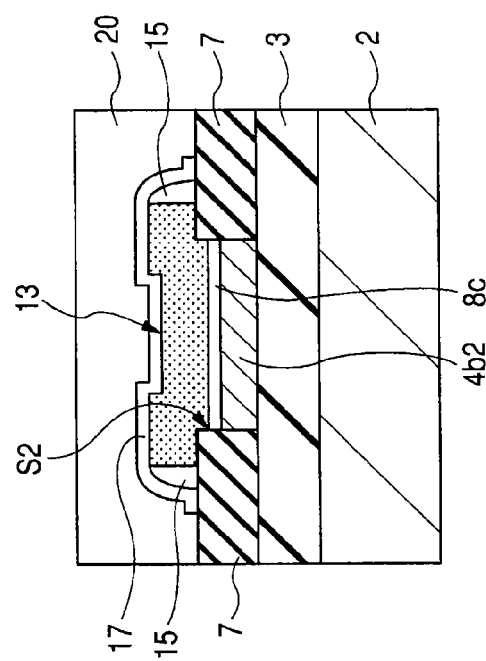
FIG. 5A
FIG. 5B

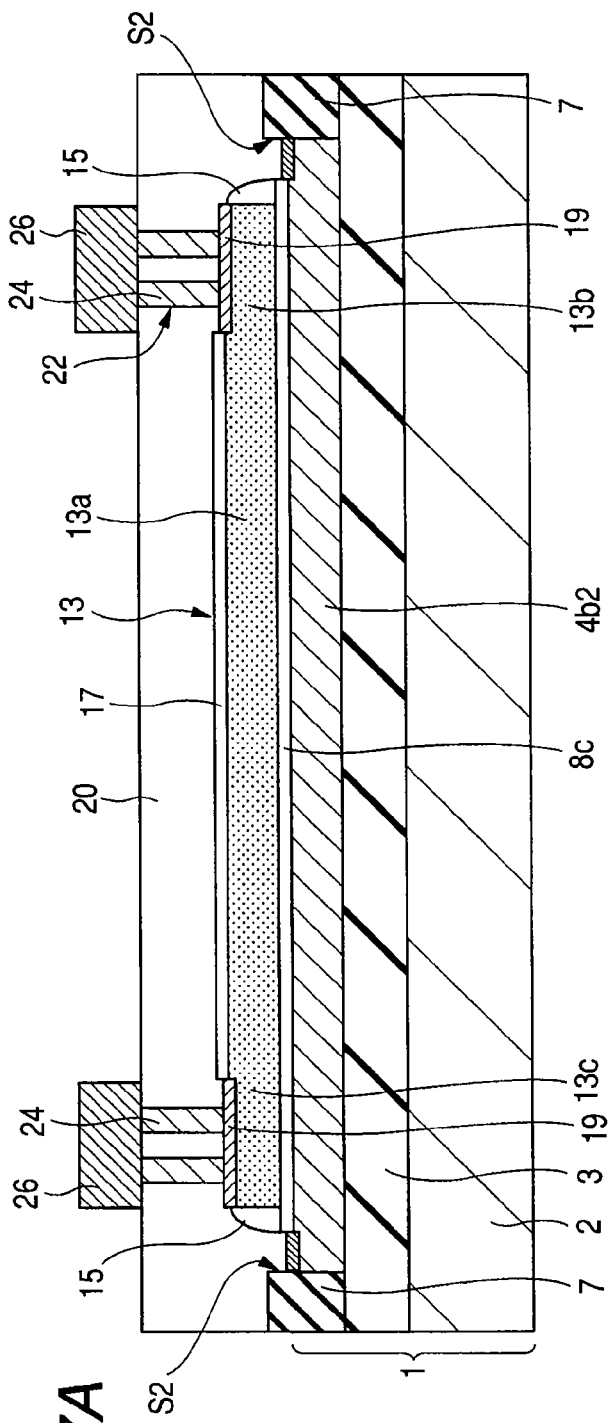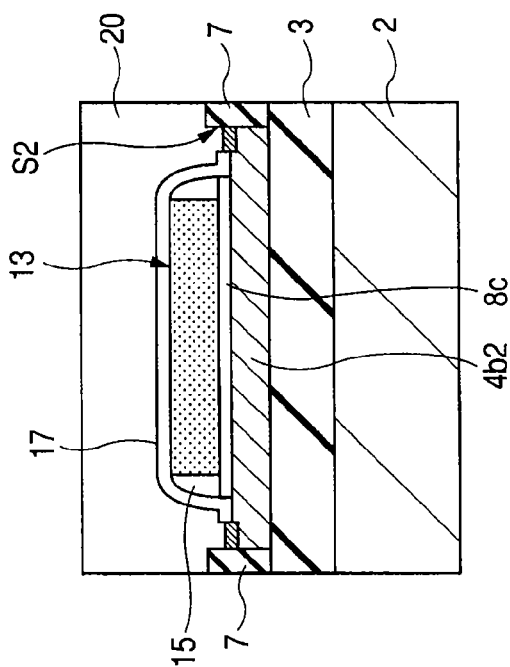
FIG. 27A
FIG. 27B

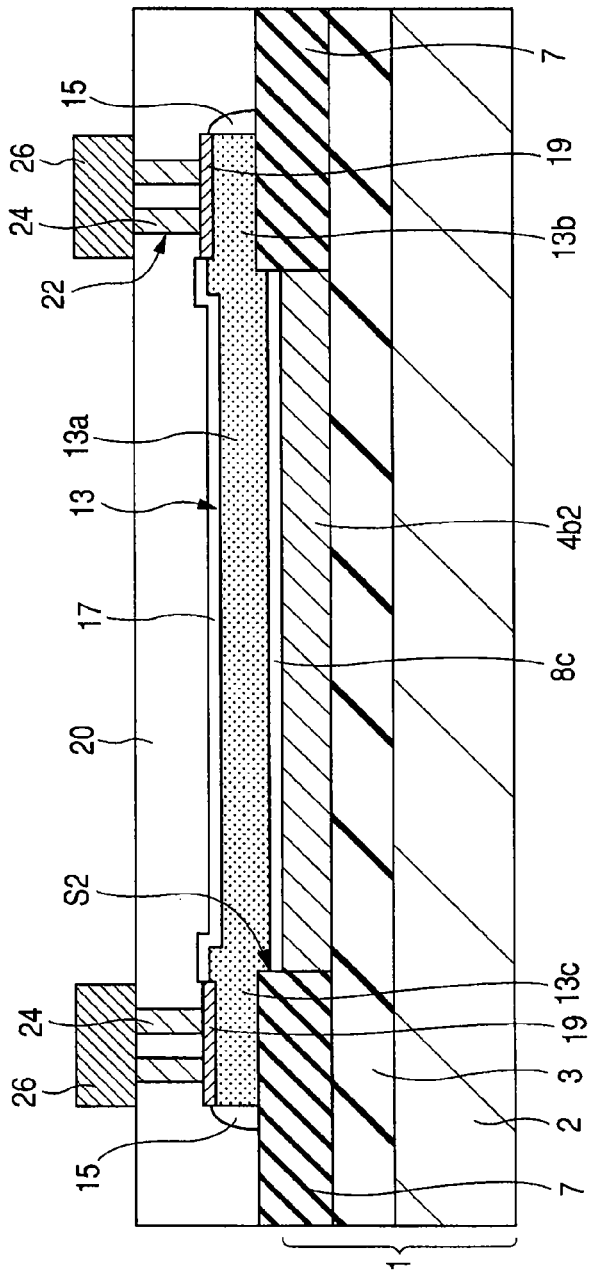
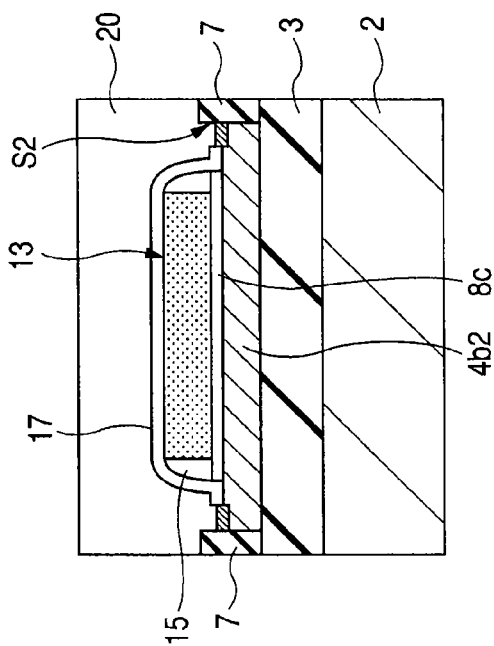
FIG. 29A
FIG. 29B

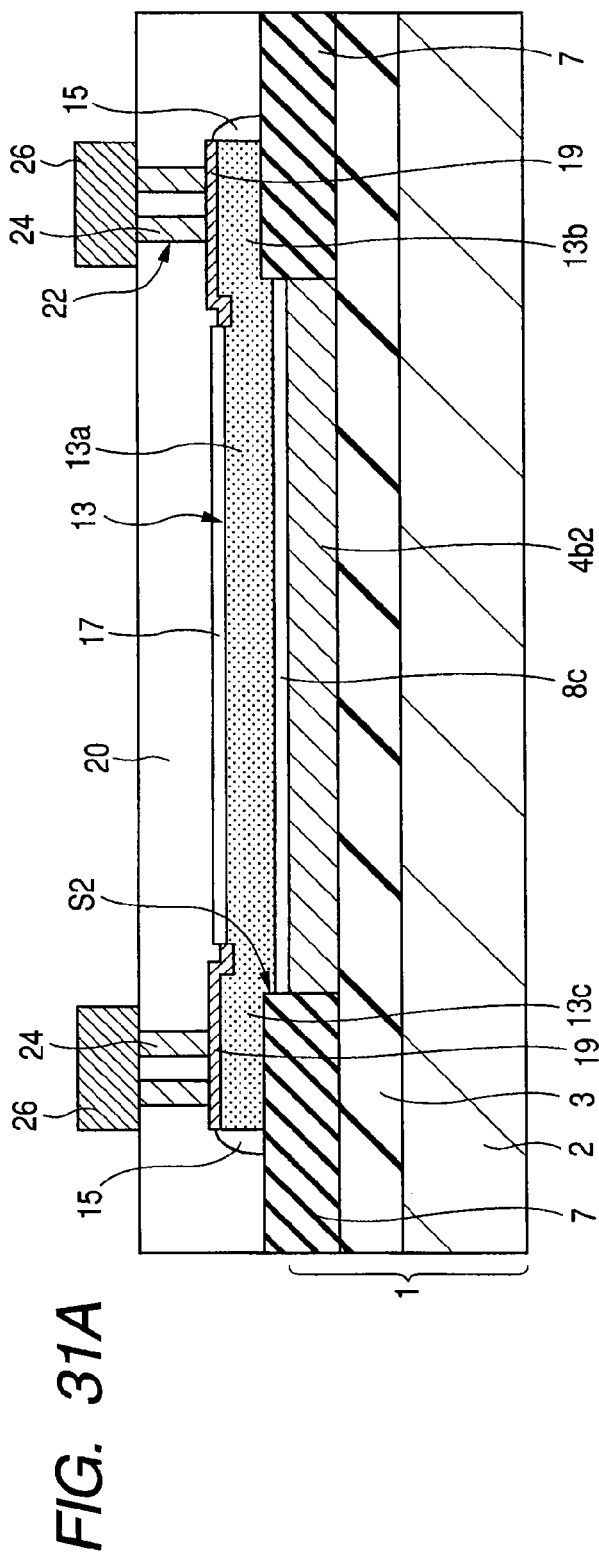
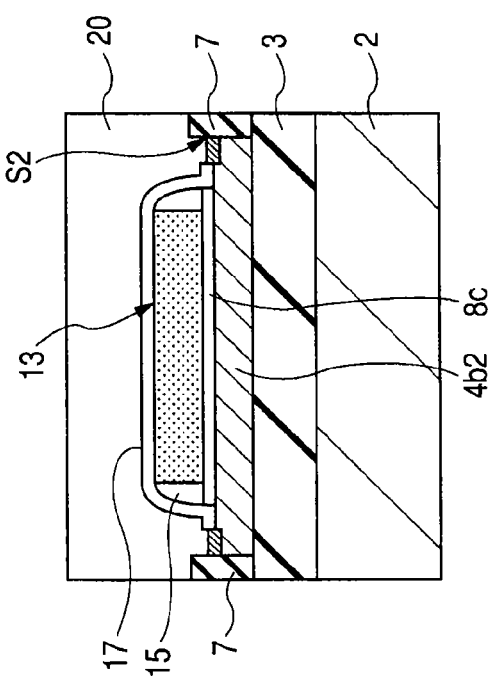
FIG. 31A
FIG. 31B

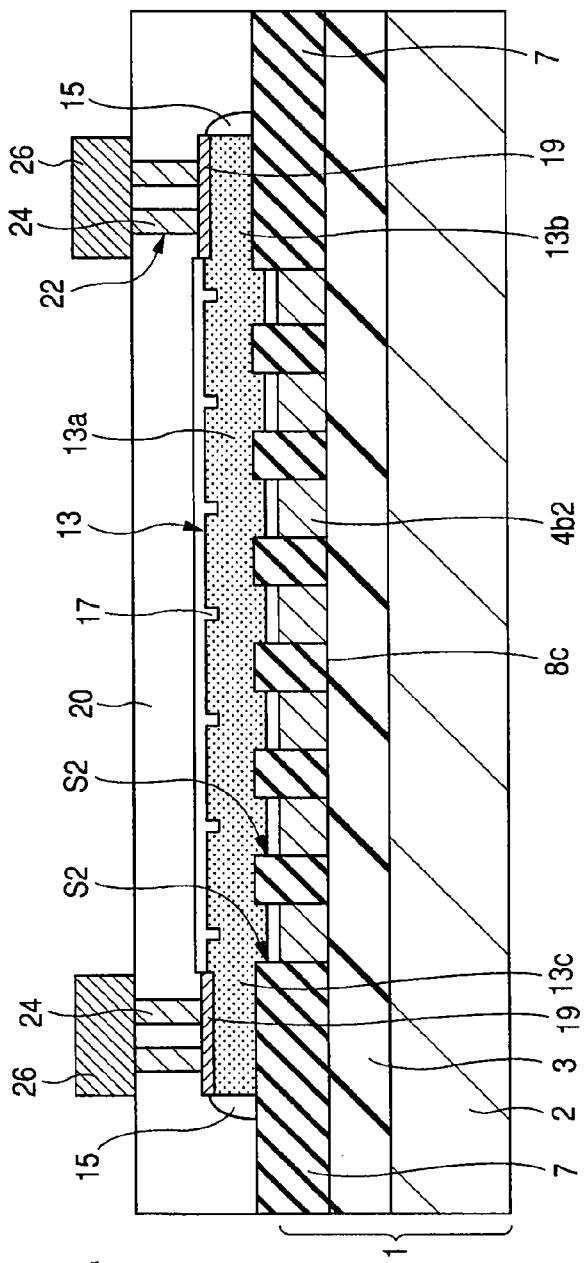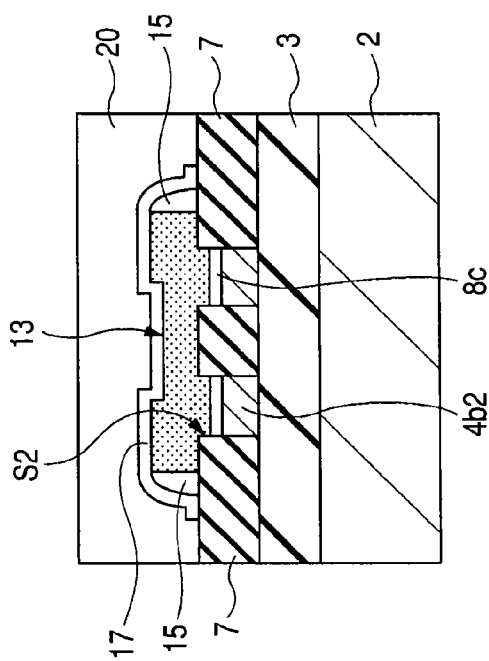
FIG. 33A
FIG. 33B

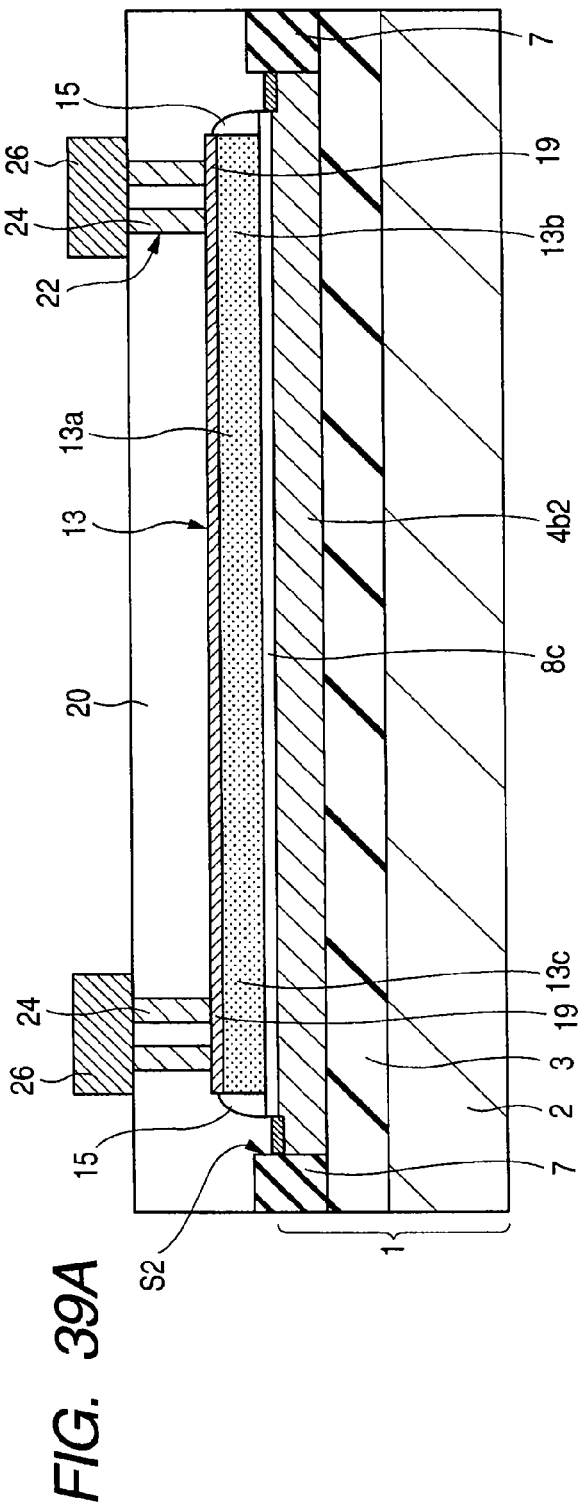
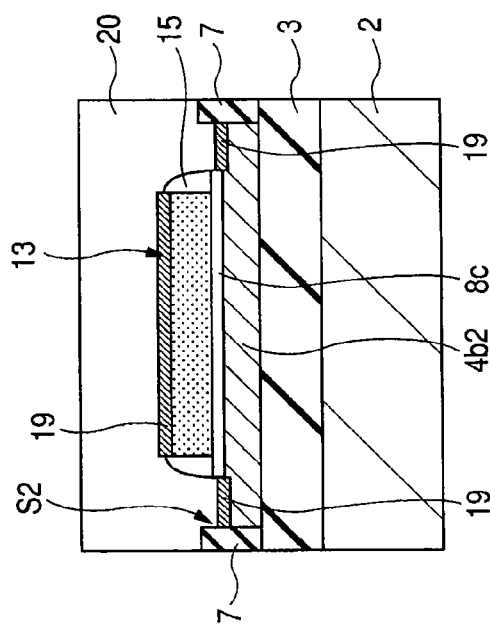
FIG. 39A
FIG. 39B

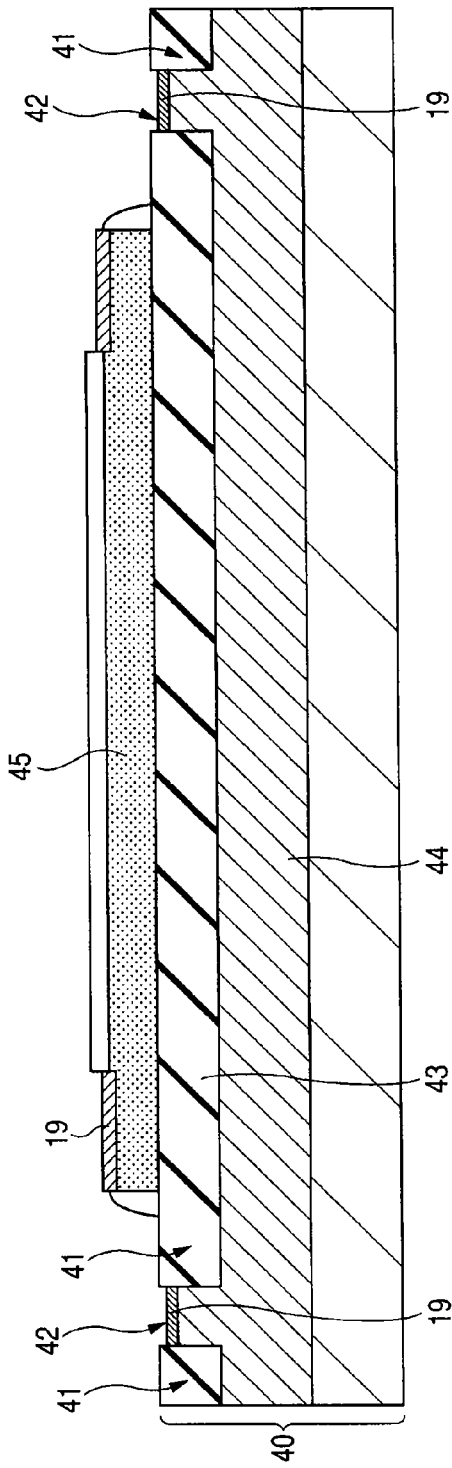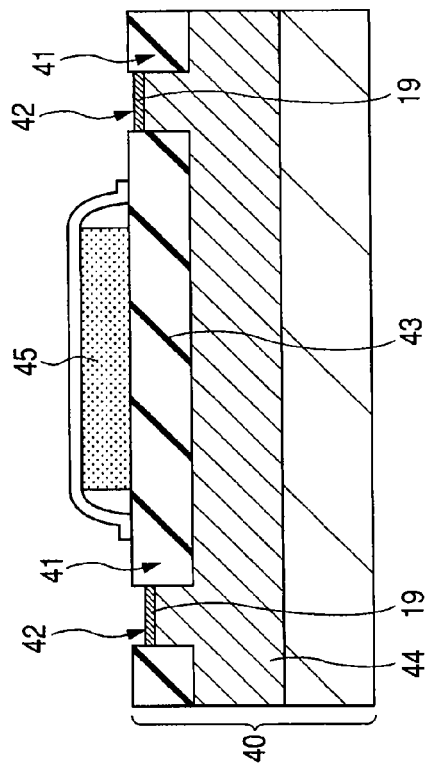

SEMICONDUCTOR DEVICE AND A METHOD OF MANUFACTURING THE SAME

CROSS-REFERENCE TO RELATED APPLICATION

The present application claims priority from Japanese patent application No. 2006-81202 filed on Mar. 23, 2006, the content of which is hereby incorporated by reference into this application.

BACKGROUND OF THE INVENTION

The present invention relates to a semiconductor device and a manufacturing technique thereof, and more particularly to a technique which is effectively applicable to a semiconductor device which includes resistance elements.

As one of element isolations which electrically isolate element forming regions on a main surface of a semiconductor substrate, there has been known a groove-type element isolation which is referred to as, for example, STI (Shallow Trench Isolation) or SGI (Shallow Groove Isolation). This groove-type element isolation is a technique which forms grooves by etching element isolation regions on the main surface of the semiconductor substrate and, thereafter, an insulation film is embedded in the inside of the grooves thus electrically isolating the element forming reigns. The element forming regions which are isolated by the groove-type element isolation are constituted of semiconductor layers (active layers) which are defined in an island shape, and the semiconductor layer has a periphery thereof surrounded by an insulation film which is embedded in the groove. The insulation film is embedded into the grooves such that an insulation film formed of a silicon oxide film, for example is stacked on the main surface of the semiconductor substrate using a CVD (Chemical Vapor Deposition) method in a state that the insulation film is filled in the inside of the grooves and, thereafter, the insulation film formed over the main surface of the semiconductor substrate is removed using, for example, a CMP (Chemical Mechanical Polishing) method so as to allow the insulation film to selectively remain in the grooves.

In the groove-type element isolation which uses the CMP method, when a width of the groove becomes relatively large, a polishing speed of the insulation film is locally increased and hence, a so-called dishing phenomenon in which a center portion of the insulation film which remains in the groove is indented is liable to be easily generated.

Japanese Unexamined Patent Publication No. 2002-158278 discloses a technique which suppresses a dishing phenomenon at the time of removing the insulation film on the main surface of the semiconductor substrate using the CMP method so as to allow the insulation film to selectively remain in the inside of the groove by forming a dummy semiconductor layer (dummy active layer) which differs from the semiconductor layer (active layer) used as the transistor element forming region in the element isolation region on the main surface of the semiconductor substrate.

Japanese Unexamined Patent Publication No. 2002-261244 discloses a technique which suppresses a dishing phenomenon at the time of removing an insulation film on a main surface of a semiconductor substrate using a CMP method so as to allow the insulation film to selectively remain in the inside of the grooves, thus enhancing the accuracy of resistance values of poly-silicon resistance elements formed over the insulation film (element isolation oxide film) in the inside of the groove.

SUMMARY OF THE INVENTION

In the manufacture of the semiconductor device, in electrically separating the element forming regions on the main surface of the semiconductor substrate using the groove-type element isolation, in order to suppress the lowering of flatness of a wafer attributed to a dishing phenomenon, a main surface of the wafer is divided into a plurality of imaginary regions in a mesh form, and an occupation ratio of a semiconductor layer (a ratio between the insulation film in the groove and the semiconductor layer) in each imaginary region is determined. There exists a de-facto standard that, for example, the main surface of the wafer is divided into a plurality of imaginary regions having a size of 20 [μm] square, and the occupation ratio of the semiconductor layer in each imaginary region is set to a value which falls within a range from 15 to 20% or more. When the imaginary region which does not satisfy the occupation ratio of the semiconductor layer exists, a dummy semiconductor layer (dummy active layer) is provided to the element isolation region to satisfy the occupation ratio of the semiconductor layer.

Here, as one of the elements which constitutes an integrated circuit, for example, a resistance element is named. Also with respect to this resistance element, resistance elements which have various structures have been known. For example, there has been known a diffusion resistance element which includes a diffusion layer (semiconductor region) which is formed by introducing impurities into the main surface of the semiconductor substrate, a poly-silicon resistance element which includes a poly-silicon film formed over the main surface of the semiconductor substrate and the like.

Since the poly-silicon resistance element can obtain a resistance value of high accuracy compared with the diffusion layer resistance element, the poly-silicon resistance element is popularly used in an analog-system circuit. In the analog-system circuit, a large number of poly-silicon resistance elements is used, and the large number of poly-silicon resistance elements is arranged in a predetermined region in a concentrated manner by taking the pull-around wiring and the connection of elements into consideration.

The poly-silicon resistance elements are formed in the same step as gate electrodes of MISFETs (Metal Insulator Semiconductor Field Effect Transistors) in general by taking the simplification of a manufacturing process into consideration and hence, the poly-silicon resistance elements are arranged in the element isolation regions formed over the main surface of the semiconductor substrate.

The poly-silicon resistance element has a larger planar size compared to the MISFET and, a large number of poly-silicon resistance elements are arranged in the predetermined region in a concentrated manner and hence, a broad element isolation region which allows the arrangement of the large number of poly-silicon resistance elements in a concentrated manner becomes necessary.

In electrically isolating element forming regions on the main surface of the semiconductor substrate using the groove-type element isolation, when a large number of poly-silicon resistance elements are arranged in the element isolation region in a concentrated manner, it is difficult satisfy an occupation ratio of the semiconductor layer.

Accordingly, the occupation ratio of the semiconductor layer is satisfied by forming the dummy semiconductor layer in the element isolation region in which the large number of poly-silicon resistance elements is arranged in a concentrated manner. However, since the dummy semiconductor layer cannot be arranged below the poly-silicon resistance elements, as shown in FIG. 40, FIG. 41A and FIG. 41B, the dummy semiconductor layer 42 is formed such that the dummy semiconductor layer 42 surrounds the poly-silicon resistance element 45.

Here, FIG. 40 is a schematic plan view showing the schematic constitution of resistance elements which are mounted on a conventional semiconductor device, and FIG. 41A and FIG. 41B are views showing the cross-sectional structure of a resistance element shown in FIG. 40, in which FIG. 41A is a schematic cross-sectional view taken along a line v-v' in FIG. 40 and FIG. 41B is a schematic cross-sectional view taken along a line w-w' in FIG. 40. In FIG. 40, FIG. 41A and FIG. 41B, numeral 40 indicates a semiconductor substrate, numeral 41 indicates a groove, numeral 42 indicates a dummy semiconductor layer (a dummy active layer), numeral 43 indicates an insulation film, numeral 44 indicates a well region, and numeral 45 indicates a poly-silicon resistance element.

The reason that the dummy semiconductor layer 42 cannot be arranged below the poly-silicon resistance element 45 is as follows. That is, when the dummy semiconductor layer 42 is arranged below the poly-silicon resistance element 45, the poly-silicon resistance element 45 is formed into the structure which easily receives the fluctuation of characteristics such as the change of a resistance value of the poly-silicon resistance element 45 due to the influence of a substrate bias effect. In the bulk structure, the poly-silicon resistance element 45 is formed over the well region 44 with the insulation film 43 interposed therebetween and hence, a parasitic capacitance is applied to the poly-silicon resistance element 45 due to the influence of the substrate bias. As shown in FIG. 41, the dummy semiconductor layer 42 is not arranged below the poly-silicon resistance element 45, a thickness of the insulation film 43 is increased and hence, a parasitic capacitance applied to the poly-silicon resistance element 45 is reduced. However, when the dummy semiconductor layer 42 is arranged below the poly-silicon resistance element 45, a thickness of the insulation film at a portion where the dummy semiconductor layer 42 is arranged is decreased and hence, the parasitic capacitance applied to the poly-silicon resistance element 45 is increased. Accordingly, when the dummy semiconductor layer 42 is arranged below the poly-silicon resistance element 45, the poly-silicon resistance element 45 is liable to receive the fluctuation of characteristics due to the influence of the bias effect.

A drawback which arises here is that since the poly-silicon resistance element 45 and the dummy semiconductor layer 42 are arranged in parallel in plane, an area of the element isolation region is increased thus impeding the miniaturization of the semiconductor device. Accordingly, inventors of the present invention made extensive studies on whether the dummy semiconductor layer can be arranged below the poly-silicon resistance element and have made the present invention.

Accordingly, it is an object of the present invention to provide a technique which can realize the miniaturization of a semiconductor device.

The above-mentioned and other objects and novel features of the present invention will become apparent from the description of this specification and attached drawings.

To briefly explain the summary of typical inventions disclosed in this specification, they are as follows.

The above-mentioned object can be achieved by forming an island-like semiconductor layer and a second insulation film which surrounds the semiconductor layer on a first insulation film, and by arranging a resistance element (for example, a poly-silicon resistance element) which is formed of a conductive film on the first insulation film such that the resistance element formed of a conductive film is overlapped to an upper surface of the semiconductor layer in plane.

Further, the above-mentioned object can be achieved by forming, on a first insulation film, an island-like first semiconductor layer which is used as a transistor element forming region, an island-like second semiconductor layer which serves to suppress a dishing phenomenon (serves to level a wafer and to increase an occupation ratio of the semiconductor layer) and is formed structurally independent (isolated individually) from the first semiconductor layer, and a second insulation film which embeds a gap between these semiconductor layers (surrounding these semiconductor layers), and by arranging a resistance element formed of a conductive film (for example, a poly-silicon resistance element) such that the resistance element is overlapped to an upper surface of the second semiconductor layer in plane.

To briefly explain advantageous effects obtained by the typical inventions among inventions disclosed in the present invention, they are as follows.

According to the present invention, it is possible to achieve miniaturization of the semiconductor device.

BRIEF DESCRIPTION OF THE DRAWINGS

FIG. 4 is a schematic plan view showing the resistance element shown in FIG. 2 in an enlarged manner;

FIG. 5A and FIG. 5B are views showing the cross-sectional structure of the resistance element shown in FIG. 4, in which FIG. 5A is a schematic cross-sectional view taken along a line a'-a' in FIG. 4, and FIG. 5B is a schematic cross-sectional view taken along a line b'-b' in FIG. 4;

FIG. 27A and FIG. 27B are views showing the cross-sectional structure of the resistance element shown in FIG. 26, in which FIG. 27A is a schematic cross-sectional view taken along a line c'-c' in FIG. 26, and FIG. 27B is a schematic cross-sectional view taken along a line d'-d' in FIG. 26;

FIG. 29A and FIG. 29B are views showing the cross-sectional structure of the resistance element shown in FIG. 28, in which FIG. 29A is a schematic cross-sectional view taken along a line e'-e' in FIG. 28, and FIG. 29B is a schematic cross-sectional view taken along a line f'-f' in FIG. 28;

FIG. 31A and FIG. 31B are views showing the cross-sectional structure of the resistance element shown in FIG. 30, in which FIG. 31A is a schematic cross-sectional view taken along a line g'-g' in FIG. 30, and FIG. 31B is a schematic cross-sectional view taken along a line h'-h' in FIG. 30;

FIG. 33A and FIG. 33B are views showing the cross-sectional structure of the resistance element shown in FIG. 32, in which FIG. 33A is a schematic cross-sectional view taken along a line i'-i' in FIG. 32, and FIG. 33B is a schematic cross-sectional view taken along a line j'-j' in FIG. 32;

FIG. 37A and FIG. 37B are views showing the cross-sectional structure of the resistance element shown in FIG. 36, in which FIG. 37A is a schematic cross-sectional view taken along a line k'-k' in FIG. 36, and FIG. 37B is a schematic cross-sectional view taken along a line l'-l' in FIG. 36;

FIG. 39A and FIG. 39B are views showing the cross-sectional structure of the resistance element shown in FIG. 38, in which FIG. 39A is a schematic cross-sectional view taken along a line m'-m' in FIG. 38, and FIG. 39B is a schematic cross-sectional view taken along a line n'-n' in FIG. 39;

FIG. 41A and FIG. 41B are views showing the cross-sectional structure of the resistance element shown in FIG. 40, in which FIG. 41A is a schematic cross-sectional view taken along a line v'-v' in FIG. 40, and FIG. 41B is a schematic cross-sectional view taken along a line w'-w' in FIG. 40.

DETAILED DESCRIPTION OF THE PREFERRED EMBODIMENTS

Hereinafter, embodiments of the present invention are explained in detail in conjunction with drawings. Here, in all drawings for explaining the embodiments, parts having identical functions are given same numerals and their repeated explanation is omitted.

Embodiment 1

In an embodiment 1, the explanation is made with respect to an example in which the present invention is applied to a semiconductor device which includes a low breakdown voltage MISFET, a high breakdown voltage MISFET and resistance elements.

Figure 1:
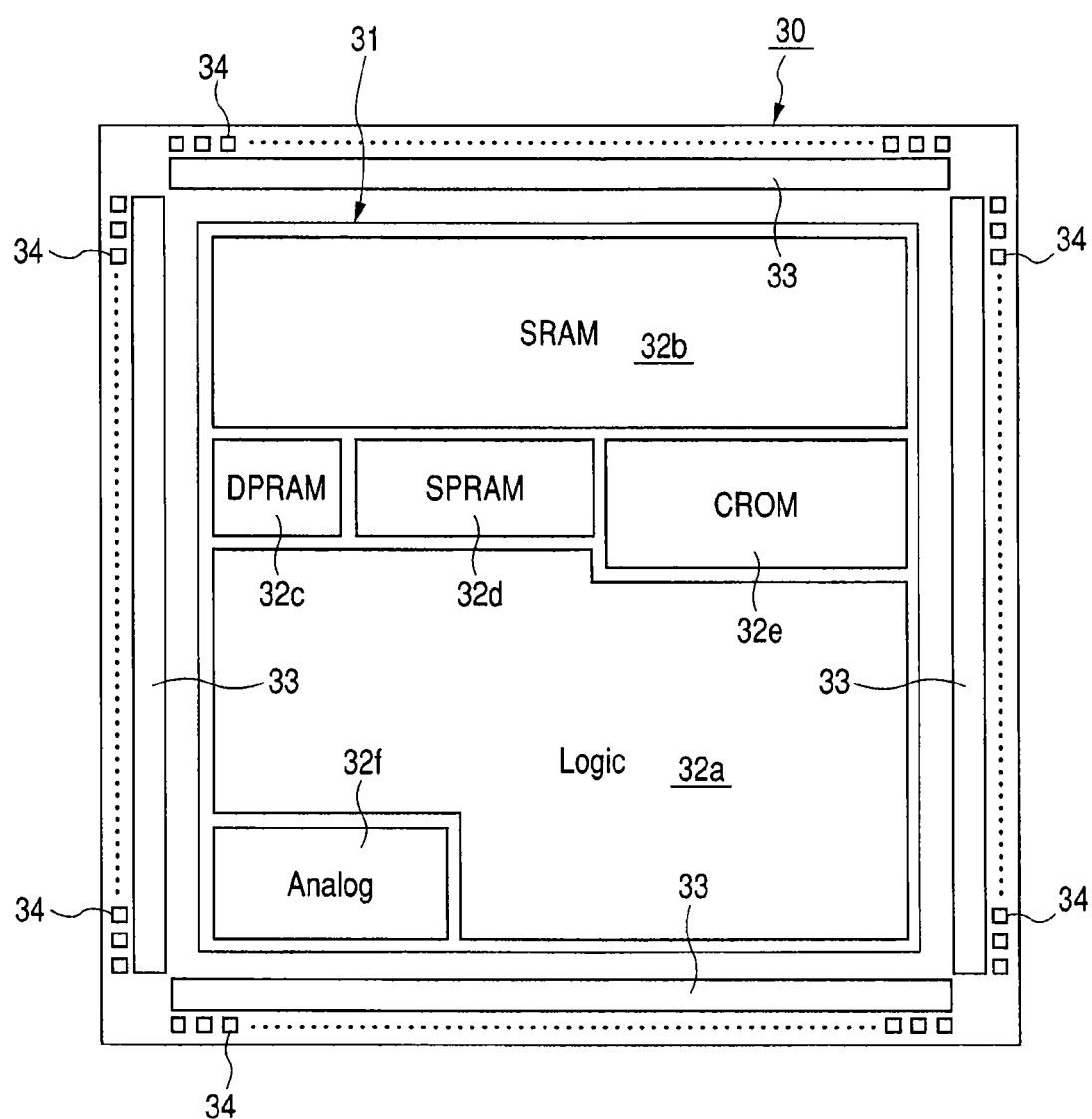
FIG. 1 is a schematic plan view showing a layout of an integrated circuit which is mounted on a semiconductor device of an embodiment 1 according to the present invention.
Figure 2:
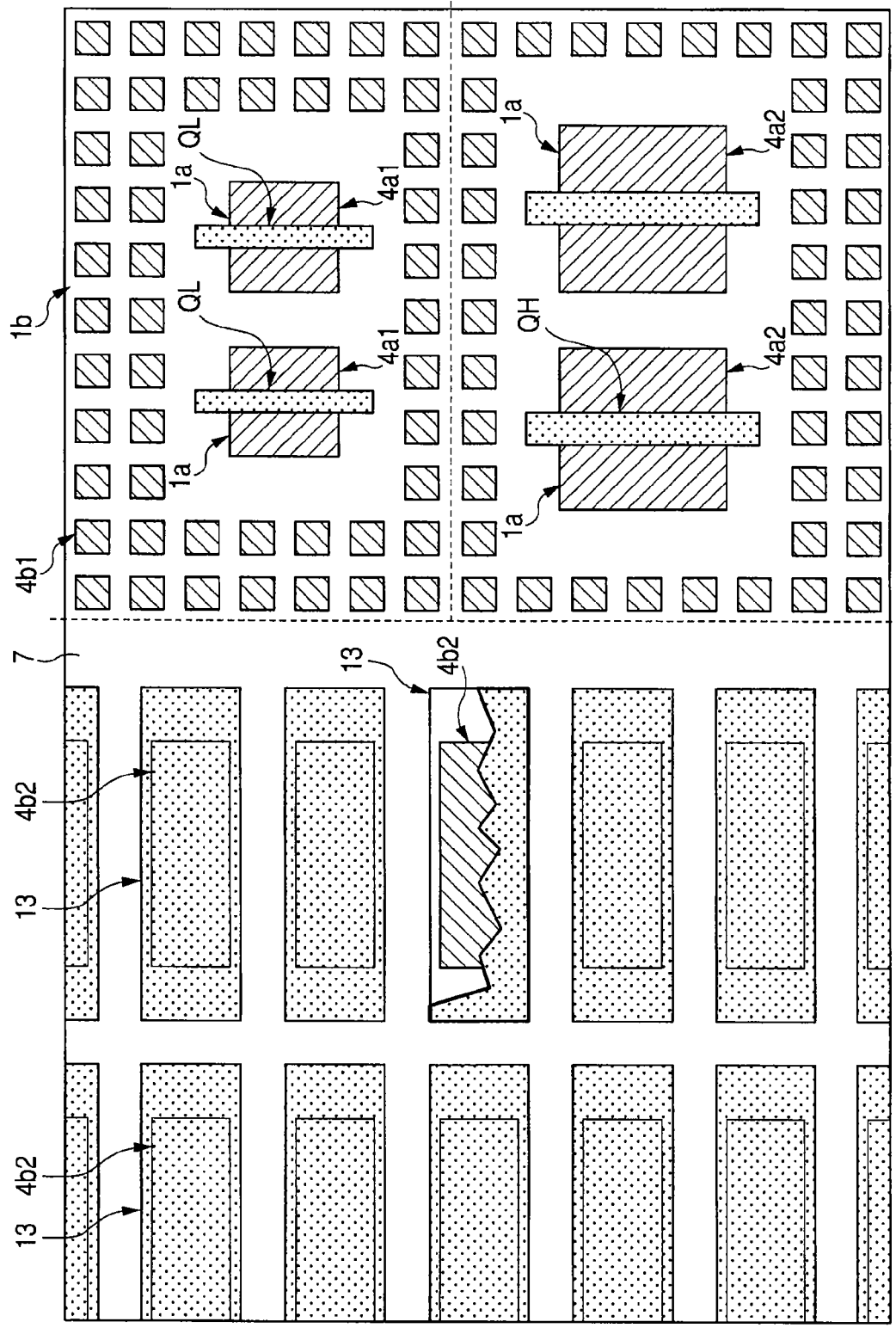
FIG. 2 is a schematic plan view of the semiconductor device of the embodiment 1 according to the present invention, wherein a first region on which a low breakdown voltage MISFET is formed, a second region on which a high breakdown voltage MISFET is formed and, a third region on which a plurality of resistance elements are formed are collectively shown in one drawing.
Figure 3:
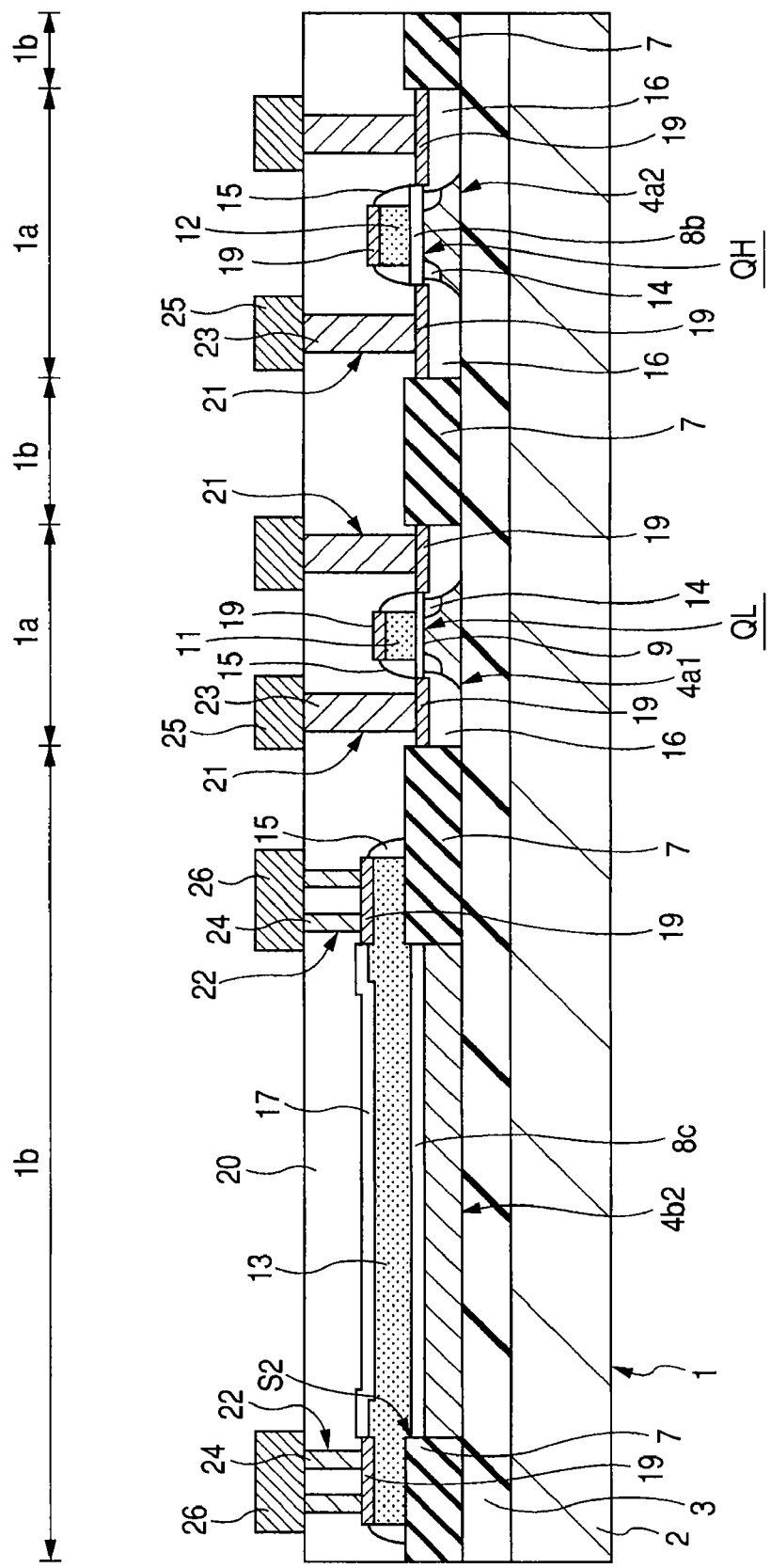
FIG. 3 is a schematic cross-sectional view collectively showing the cross-sectional structure of the low breakdown voltage MISFET, the high breakdown voltage MISFET and, the resistance element shown in FIG. 2 in one drawing.

FIG. 1 to FIG. 25 are views of the semiconductor device of the embodiment 1 according to the present invention, in which FIG. 1 is a schematic plan view showing a layout of an integrated circuit which is mounted on the semiconductor device;

FIG. 2 is a schematic plan view of the semiconductor device, wherein a first region on which the low breakdown voltage MISFET is formed, a second region on which the high breakdown voltage MISFET is formed and, a third region on which the resistance elements are formed are collectively shown in one drawing;

FIG. 3 is a schematic cross-sectional view collectively showing the cross-sectional structure of the low breakdown voltage MISFET, the high breakdown voltage MISFET and, the resistance elements shown in FIG. 2 in one drawing;

FIG. 4 is a schematic plan view showing the resistance element shown in FIG. 2 in an enlarged manner;

FIG. 5A and FIG. 5B are views showing the cross-sectional structure of the resistance element shown in FIG. 4, in which FIG. 5A is the schematic cross-sectional view taken along a line a'-a' in FIG. 4, and FIG. 5B is a schematic cross-sectional view taken along a line b'-b' in FIG. 4; and FIG. 6 to FIG. 25 are schematic cross-sectional views showing manufacturing steps of the semiconductor device.

As shown in FIG. 1, the semiconductor device of the embodiment 1 is mainly constituted of a semiconductor base body 1 in which a planar surface thereof which intersects the thickness direction thereof is formed in a rectangular shape. An integrated circuit is formed over a main surface of the semiconductor base body 1. The integrated circuit, although not limited to the constitution shown in the drawing, includes a logic arithmetic operation circuit module 32a, a SRAM (Static Random Access Memory) circuit module 32b, a DPRAM circuit module 32c, a SPRAM circuit module 32d, a CROM circuit module 32e, an analog circuit module 32f and the like, and these modules are arranged in an internal circuit forming part 31 which is formed over the main surface of the semiconductor base body 1. Around the internal circuit forming part 31, a plurality of electrode pads (bonding pads) 34 is arranged along respective sides of the semiconductor base body 1, and between the internal circuit forming part 31 and the electrode pads 34, four input/output cell forming parts 33 are arranged corresponding to the respective sides of the semiconductor base body 1. A plurality of cells each of which is constituted of an input/output buffer circuit is arranged in four input/output cell forming parts 33 along the arrangement directions of the electrode pads 34.

In the logic arithmetic operation circuit module 32a, as elements which constitute circuits, the low breakdown voltage MISFET (Metal Insulator Semiconductor Field Effect Transistor)-QL shown in FIG. 2 is used. In the input/output buffer circuit, as elements which constitute circuits, the high breakdown voltage MISFET (Metal Insulator Semiconductor Field Effect Transistor)-QH shown in FIG. 2 is used.

In the analog circuit module 32f, analog circuits such as an A/D converter and a D/A converter which constitute reference voltage sources using a plurality of resistance elements 13 shown in FIG. 2 are arranged. In these analog circuits, as shown in FIG. 2, the resistance elements 13 is arranged in a predetermined region in a concentrated manner so as to facilitate the pulling around of lines and the connection of elements.

Here, the low breakdown voltage MISFET and the high breakdown voltage MISFET are respectively incorporated in the inside of one semiconductor base body (semiconductor chip) in the form of the CMOS constitution (a pair of a p-channel-conductive-type MISFET and an n-channel-conductive-type MISFET). In the following explanation, however, the explanation of the p-channel-conductive-type MISFET is omitted.

Further, although a MISFET is a kind of insulated gate type transistor, the MISFET includes a transistor in which a gate electrode is formed of a conductive material other than metal.

Further, in the MISFET, a region in which a current path (a channel) which connects a source region and a drain region is formed is referred to as a channel forming region, and a MISFET in which an electron channel (conductive path) is formed in the channel forming region which is defined between the source region and the drain region is referred to as an n-channel-conductive-type (or simply referred to as an n-type), and a MISFET in which a hole channel is formed in the channel forming region which is defined between the source region and the drain region is referred to as a p-channel-conductive-type (or simply referred to as a p-type).

Further, in the MISFET, the MISFET in which a gate insulation film is formed of a silicon oxide film is generally referred to as a MOSFET (Metal Oxide Semiconductor Field Effect Transistor).

The semiconductor base body 1 is, as shown in FIG. 2 and FIG. 3, configured to mainly include a support substrate 2, an insulation film 3 which is formed over the support substrate 2, semiconductor layers ($4a1$, $4a2$, $4b1$, $4b2$) which are formed over the insulation film 3 and are formed in an island shape, and an insulation film 7 which is formed over the insulation film 3 such that the insulation film 7 is embedded between these semiconductor layers (surrounding these semiconductor layers). The support substrate 2 and the semiconductor layers ($4a1$, $4a2$, $4b1$, $4b2$) are made of single-crystal silicon, for example, and the insulation film 3 and the insulation film 7 are formed of a silicon oxide film, for example. That is, the semiconductor base body 1 of the embodiment 1 has the so-called SOI (Silicon On Insulator) structure in which a silicon layer is formed over an insulation film.

The main surface of the semiconductor base body 1 is configured to include an element forming region (an active region) $1a$ which forms a transistor element thereon and an element isolation region (a non-active region) $1b$ which electrically isolates the element forming regions $1a$, wherein the element forming region $1a$ is constituted of island-like semiconductor layers ($4a1$, $4a2$), and the element isolation region $1b$ is constituted of island-like semiconductor layers ($4b1$, $4b2$) and the insulation film 7.

The semiconductor layers ($4a1$, $4a2$) in the element forming region $1a$ and the semiconductor layers ($4b1$, $4b2$) in the element isolation region $1b$ are formed in an island shape by patterning a semiconductor layer 4 (see FIG. 6) which is formed over the insulation film 3. The insulation film 7 in the element isolation region $1b$ is formed such that after the island-like semiconductor layers ($4a1$, $4a2$, $4b1$, $4b2$) are formed by patterning the semiconductor layer 4, the insulation film 7 is formed over the whole surface of the insulation film 3 including these island-like semiconductor layers in a state that the insulation film is embedded between these island-like semiconductor layers (see FIG. 10) and, thereafter, the insulation film 7 is removed (grinded/polished) using a CMP (Chemical Mechanical Polishing) method so as to allow the insulation film 7 to selectively remain between the island-like semiconductor layers (see FIG. 11).

The island-like semiconductor layers ($4a1$, $4a2$) are provided as the transistor element forming region, and the island-like semiconductor layers ($4b1$, $4b2$) are provided aiming at the suppression of a dishing phenomenon at the time of polishing the insulation film 7 using the CMP method (aiming at the leveling of a wafer and the increase of an occupation ratio of the semiconductor layer). The island-like semiconductor layers ($4b1$, $4b2$) are formed structurally independent (isolated individually) from the island-like semiconductor layers (4a1, 4b2) which are used as the transistor element forming regions.

That is, the main surface of the semiconductor base body 1 is configured to include the island-like semiconductor layers (4a1, 4a2) formed over the insulation film 3 which constitutes the transistor element forming regions, the island-like semiconductor layers (4b1, 4b2) which serve to suppress the dishing phenomenon and is formed over the insulation film 3 structurally independent (isolated individually) from the island-like semiconductor layers (4a1, 4a2) which constitute the transistor element forming region, and the insulation film 7 which is formed over the insulation film 3 such that the insulation film 7 is embedded between the island-like semiconductor layers (surrounding the respective island-like semiconductor layers).

A plurality of semiconductor layers 4a1 and 4a2 is provided. The semiconductor layers 4b1 is arranged around the semiconductor layers 4a1 and 4a2 in the element isolation region 1b. The semiconductor layers 4b2 is arranged in a region where a plurality of resistance elements 13 is arranged in a concentrated manner in the element isolation region 1b.

Impurities are introduced into the semiconductor layers 4a1 and 4a2 thus imparting p-type conductivity to the semiconductor layers 4a1 and 4a2. Impurities are basically not introduced into the semiconductor layers 4b1 and 4b2 and hence, the semiconductor layers 4b1 and 4b2 exhibit the impurity concentration lower than the impurity concentration of the intrinsic semiconductor or the semiconductor layers (4a1, 4a2).

An n-channel-conductive-type low breakdown voltage MISFET-QL is formed over the semiconductor layer 4a1. An n-channel-conductive-type high breakdown voltage MISFET-QH is formed over the semiconductor layer 4a2.

The low breakdown voltage MISFET-QL is, as shown in FIG. 3, configured to mainly include a channel forming region, an insulation film 9 which is used as a gate insulation film, a gate electrode 11, a source region and a drain region. The insulation film 9 is formed over a main surface of the semiconductor layer 4a1. The gate electrode 11 is formed over the main surface of the semiconductor layer 4a1 by way of the insulation film 9. The channel forming region is formed over a surface layer portion of the semiconductor layer 4a1 which is arranged directly below the gate electrode 11. The source region and the drain region are formed over the surface layer portion of the semiconductor layer 4a1 in a state that the channel forming region is sandwiched between the source region and the drain region in the longitudinal direction of a channel (in the longitudinal direction of a gate) of the channel forming region.

The high breakdown voltage MISFET-QH is, as shown in FIG. 3, configured to mainly include a channel forming region, an insulation film 8b which is used as a gate insulation film, a gate electrode 12, a source region and a drain region. The insulation film 8b is formed over a main surface of the semiconductor layer 4a2. The gate electrode 12 is formed over the main surface of the semiconductor layer 4a2 by way of the insulation film 8b. The channel forming region is formed over a surface layer portion of the semiconductor layer 4a2 which is arranged directly below the gate electrode 12. The source region and the drain region are formed over the surface layer portion of the semiconductor layer 4a2 in a state that the channel forming region is sandwiched between the source region and the drain region in the longitudinal direction of channel (in the longitudinal direction of gate) of the channel forming region.

To obtain high breakdown strength, the high breakdown voltage MISFET-QH is formed such that the insulation film 8b has a thickness larger than a thickness of the insulation film 9 of the low breakdown voltage MISFET-QL (8b>9). Further, a channel length (CL1) is larger than a channel length (CL2) of the low breakdown voltage MISFET-QL (CL1>CL2).

In the low breakdown voltage and the high breakdown voltage MISFETs (QL, QH), the source region and the drain region are constituted of a pair of n-type semiconductor regions 14 which constitutes an extension region and a pair of n-type semiconductor regions 16 which constitutes a contact region. The pair of n-type semiconductor regions 14 is formed over the main surface of the semiconductor layers (4a1, 4a2) in a state that the n-type semiconductor regions 14 are aligned with the gate electrodes (11, 12). The pair of n-type semiconductor regions 16 is formed over the main surface of the semiconductor layers (4a1, 4a2) in a state that the n-type semiconductor regions 16 are aligned with sidewall spacers 15 which are arranged on side walls of the gate electrodes (11, 12).

The n-type semiconductor regions 14 which constitute the extension region have the impurity concentration lower than the impurity concentration of the n-type semiconductor regions 16 which constitute the contact region. That is, the low breakdown voltage MISFET-QL and the high breakdown voltage MISFET-QH of this embodiment 1 adopt the LDD (Lightly Doped Drain) structure in which the impurity concentration at a channel-forming-region-side of the drain region is lowered.

In the low and high breakdown voltage MISFETs (QL, QH), the respective insulation films (9, 8b) which are used as gate insulation films are formed of a silicon oxide film, for example. The respective gate electrodes (11, 12) are mainly formed of, for example, poly-silicon films which constitutes a semiconductor film.

To lower the resistance, a silicide layer (a metal-semiconductor reaction layers) 19 is formed over surfaces of the respective gate electrodes (11, 12) and surfaces of the respective n-type semiconductor regions 16. The silicide layer 19 is formed to be aligned with side wall spacers 15 using a silicide technique, for example. A cobalt silicide (CoSi2) layer is used as the silicide layer 19, for example. Further, although the cobalt silicide layer is exemplified as the silicide layer 19 in this embodiment, the silicide layer 19 is not limited to the cobalt silicide layer and, the silicide layer 19 may be made of other material such as titanium silicide (TiSi2) or nickel silicide (NiSi2).

The low breakdown voltage MISFET-QL and the high breakdown voltage MISFET-QH are covered with an interlayer insulation film 20 which is formed over the main surface of the semiconductor base body 1. The interlayer insulation film 20 is formed of a silicon oxide film, for example. Connection holes 21 are formed above the respective n-type semiconductor regions 16 of the low breakdown voltage and the high breakdown voltage MISFETs (QL, QH) such that the connection holes 21 reach the silicide layer 19 after penetrating the interlayer insulation film 20 from a surface of the interlayer insulation film 20, and conductive plugs 23 are embedded in the inside of the connection holes 21. The respective n-type semiconductor regions 16 are electrically connected to lines 25 which are extended above the interlayer insulation film 20 by way of the silicide layers 19 and the conductive plugs 23.

Here, although not shown in the drawing, the respective gate electrodes of the low breakdown voltage and the high breakdown voltage MISFETs (QL, QH) are electrically connected to the lines which are extended above the interlayer insulation film 20.

A plurality of resistance elements 13 is, as shown in FIG. 2, arranged in a concentrated manner in the element isolation region 1b which is formed over the main surface of the semiconductor base body 1. The resistance element 13 has, as shown in FIG. 4, a planar shape which intersects the thickness direction thereof and is formed in a rectangular shape having long sides and short sides. In this embodiment 1, the resistance element 13 has a rectangular planar shape of 7 [μm]×2 [μm], for example.

The resistance element 13 is, as shown in FIG. 4, FIG. 5A and FIG. 5B, configured to include a body portion 13a, a contact portion 13b which is coupled to one end side of the body portion 13a, and a contact portion 13c which is coupled to another end side of the body portion 13a opposite to one end side of the body portion 13a. The body portion 13a and the contact portions (13b, 13c) are mainly formed of, for example, a poly-silicon film which constitutes a semiconductor film. On upper surfaces of the contact portions (13b, 13c), the silicide layer 19 is formed for reducing the contact resistance with lines above the contact portions (13b, 13c). The silicide layer 19 is not formed over the body portion 13a. That is, the resistance element 13 is mainly formed of the poly-silicon film (polycrystalline silicon film), and the resistance element 13 is configured such that the silicide layer 19 is formed over both end portions of the poly-silicon film which are positioned at sides opposite to each other.

The resistance element 13 is, as shown in FIG. 3, FIG. 5A and FIG. 5B, covered with the interlayer insulation film 20 which is formed over the main surface of the semiconductor base body 1. Connection holes 22 are formed above the respective contact portions (13b, 13c) of the resistance elements 13 such that the connection holes 22 reach the silicide layer 19 after penetrating the interlayer insulation film 20 from the surface of the interlayer insulation film 20, and conductive plugs 24 are embedded in the inside of the connection holes 22. The respective contact portions (13b, 13c) are electrically connected to lines 26 which are extended above the interlayer insulation film 20 by way of the silicide layers 19 and the conductive plugs 24.

The resistance element 13 is formed together with (in the same step as) the gate electrodes (11, 12) of the low and high breakdown voltage MISFETs (QL, QH), and the silicide layers 19 of the resistance element 13 are also formed together with (in the same step as) the gate electrodes (11, 12) and the silicide layers 19 of the n-type semiconductor regions 16.

The resistance element 13 is, in the element isolation region 1b formed on the main surface of the semiconductor base body 1, as shown in FIG. 4, FIG. 5A and FIG. 5B, arranged to be overlapped to the upper surface of the semiconductor layer 4b2 in plane. In this embodiment 1, the resistance element 13 is arranged to be overlapped to the whole semiconductor layer 4b2 in plane. The semiconductor layer 4b2 has a planner shape which intersects the thickness direction thereof and is formed in a rectangular shape having long sides and short sides. In this embodiment 1, the semiconductor layer 4b2 has a planar size smaller than a planar size of the resistance element 13. That is, the semiconductor layer 4b2 is formed into a rectangular planar shape of 4.8 [μm]×1.6 [μm], for example.

The resistance element 13 is arranged to cover the whole semiconductor layer 4b2 in a state that the long sides (or the short sides) of the resistance element 13 are arranged to extend along the same direction as the long sides (or the short sides) of the semiconductor layer 4b2.

An upper surface of the semiconductor layer 4b2 is, as shown in FIG. 5A and FIG. 5B, covered with an insulation film 8c. An upper surface of the insulation film 8c has a height lower than an upper surface of the insulation film 7 and hence, a stepped portion S2 attributed to the difference in height (height difference) between the insulation film 8c and the insulation film 7 is formed along an outer periphery of the semiconductor layer 4b2. The insulation film 8c is arranged between the semiconductor layer 4b2 and the resistance element 13 so as to electrically insulate the resistance element 13 from the semiconductor layer 4b2.

The body portion 13a of the resistance element 13 traverses the stepped portion S2 in the long-side direction and the short-side direction and is arranged to extend over (astride) the semiconductor layer 4b2 (over the insulation film 8c) and the insulation film 7. The respective contact portions (13b, 13c) of the resistance element 13 are arranged over the insulation film 7, and the silicide layers 19 of the respective contact portions are also arranged over the insulation film 7 while the silicide layers 19 of the respective contact portions are not arranged over the semiconductor layer 4b2.

In the resistance element 13, the upper surface of the body portion 13a is covered with an insulation film 17, and the silicide layers 19 of the respective contact portions (13a, 13b) are formed to be aligned with the insulation film 17 which is formed over the upper surface of the body portion 13a.

The semiconductor layers 4a1 and 4a2 are coupled to lines which serve to fix potentials of the respective semiconductor layers to predetermined potentials, and the potentials are fixed at the time of operating an integrated circuit. The semiconductor layers 4b1 and 4b2 are not coupled to lines which serve to fix potentials of the respective semiconductor layers to predetermined potentials and hence, the semiconductor layers 4b1 and 4b2 are held in a floating state in potential even when the integrated circuit is operated.

Next, the manufacture of the semiconductor device of the embodiment 1 is explained in conjunction with FIG. 6 to FIG. 25.

Figure 6:
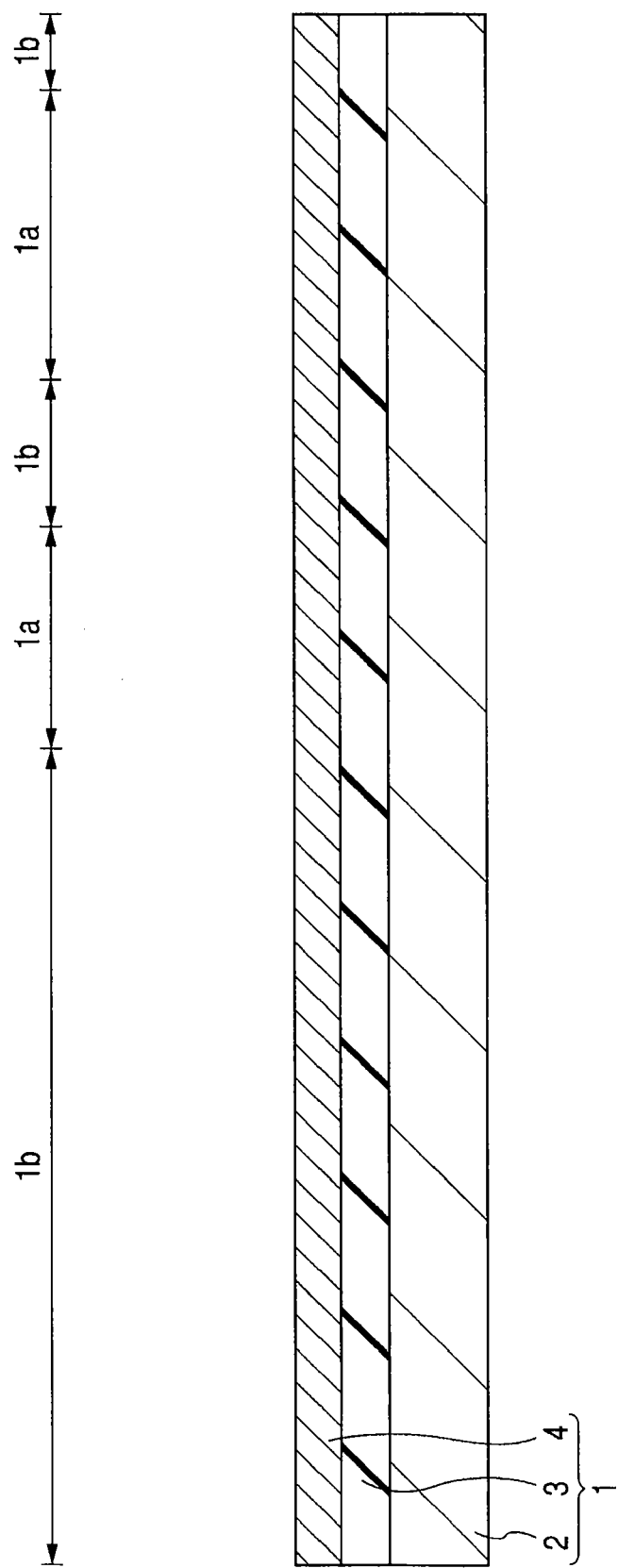
FIG. 6 is a schematic cross-sectional view showing a manufacturing step of the semiconductor device of the embodiment 1 according to the present invention.

First of all, the semiconductor base body 1 shown in FIG. 6 is prepared. The semiconductor base body 1 has the so-called SOI structure in which, as shown in FIG. 6, the semiconductor layer 4 is formed over a support substrate 2 by way of the insulation film 3. The support substrate 2 and the semiconductor layer 4 are made of mono-crystalline silicon, for example, and the insulation film 3 is formed of a silicon oxide film.

Figure 7:
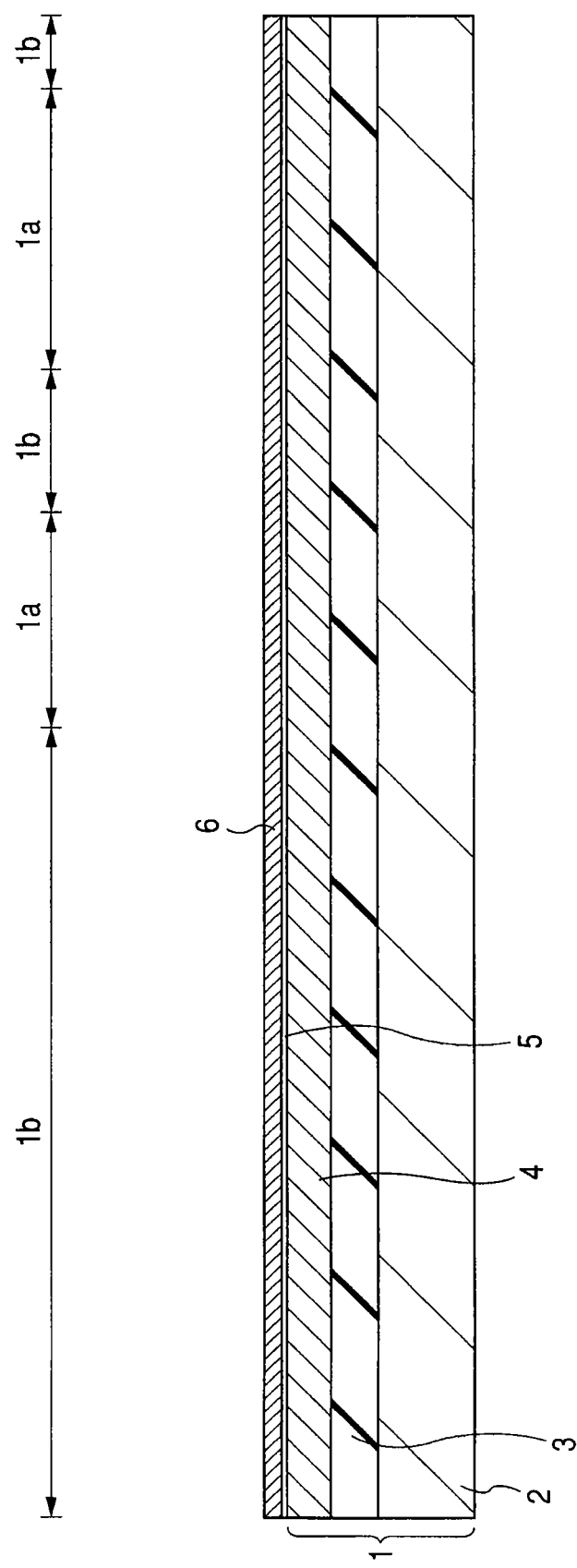
FIG. 7 is a schematic cross-sectional view showing a manufacturing step of the semiconductor device which follows FIG. 6.

Next, as shown in FIG. 7, a main surface of the semiconductor layer 4 is thermally oxidized to form a silicon oxide film 5 having a thickness of approximately 5 to 15 [nm], for example and, thereafter, a silicon nitride film 6 having a thickness of approximately 150 [nm], for example, is formed over the silicon oxide film 5 as an oxidation prevention film using a CVD (Chemical Vapor Deposition) method. The silicon oxide film 5 constitutes a buffer film for suppressing a drawback that when the silicon nitride film 6 is directly formed over the semiconductor layer 4, a thermal strain remains on the surface thereof and causes a crystalline defect.

Figure 8:
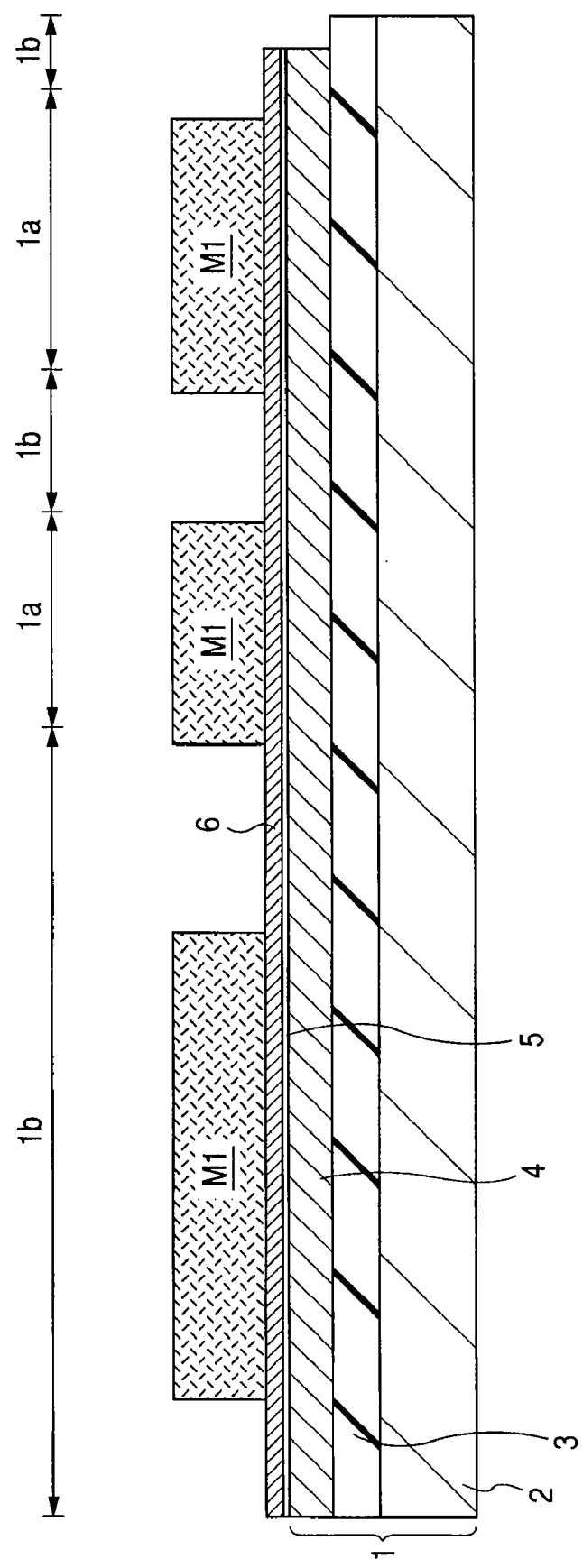
FIG. 8 is a schematic cross-sectional view showing a manufacturing step of the semiconductor device which follows FIG. 7.

Next, as shown in FIG. 8, a mask M1 which is formed of a photoresist film, for example, is formed over the silicon nitride film 6. The mask M1 is formed in a pattern in which the mask M1 covers the element forming region 1a on the main surface of the semiconductor base body 1 and covers regions in which island-like semiconductor layers (4b1, 4b2) are formed in the element isolation region 1b on the main surface of the semiconductor base body 1. That is, the mask M1 is formed in a pattern in which a region where the insulation film 7 is formed in the element isolation region is exposed.

Here, in FIG. 6 to FIG. 25, the illustration of the region where the island-like semiconductor layer 4b1 is formed is omitted.

Figure 9:
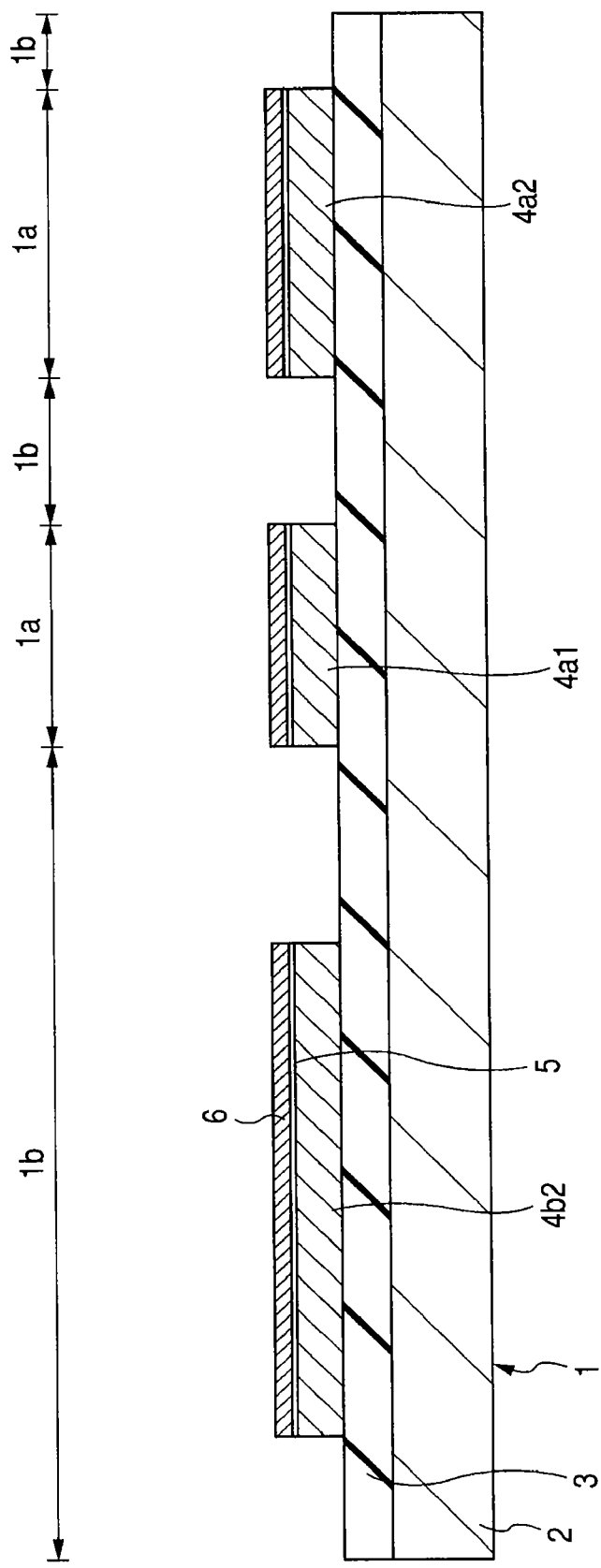
FIG. 9 is a schematic cross-sectional view showing a manufacturing step of the semiconductor device which follows FIG. 8.

Next, using the mask M1 as an etching mask, the silicon nitride film 6, the silicon oxide film 5 and the semiconductor layer 4 are sequentially formed by patterning and, as shown in FIG. 9, the island-like semiconductor layers (4a1, 4a2) are formed in the element forming region 1a and, at the same time, the island-like semiconductor layer 4b2 is formed in the element isolation region 1b. In the element isolation region 1b, although not shown in the drawing, the island-like semiconductor layer 4b1 is also formed.

The semiconductor layers (4a1, 4a2) are formed as regions for forming transistor elements. The semiconductor layers (4b1, 4b2) are formed aiming at the suppression of a dishing phenomenon at the time of polishing the insulation film 7 using a CMP method (aiming at the leveling of a wafer and the increase of an occupation ratio of the semiconductor layer) in succeeding steps. The semiconductor layer 4b2 is formed in a region where the resistance elements 13 are arranged in the element isolation region 1b. The patterning of the semiconductor layer 4 is performed such that the semiconductor layers used for forming regions of the transistor elements (4a1, 4a2) and the semiconductor layers which are provided for suppressing the dishing phenomenon (4b1, 4b2) become structurally independent from each other (individually separated from each other).

Figure 10:
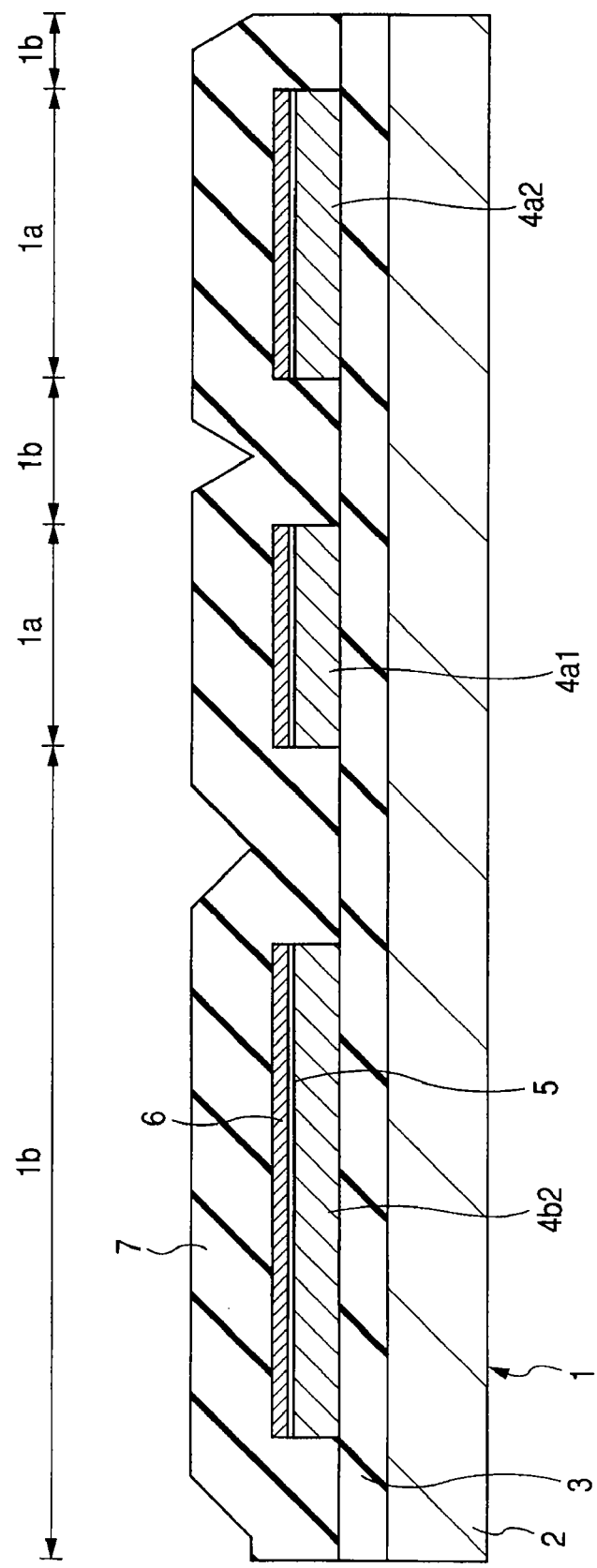
FIG. 10 is a schematic cross-sectional view showing a manufacturing step of the semiconductor device which follows FIG. 9.

Next, the mask M1 is removed and, thereafter, as shown in FIG. 10, the insulation film 7 which is formed of silicon oxide film, for example, is formed over the whole surface of the insulation film 3 including the island-like semiconductor layers using the CVD method in a state that the insulation film 7 is embedded between the island-like semiconductor layers (4a1, 4a2, 4b1, 4b2).

Figure 11:
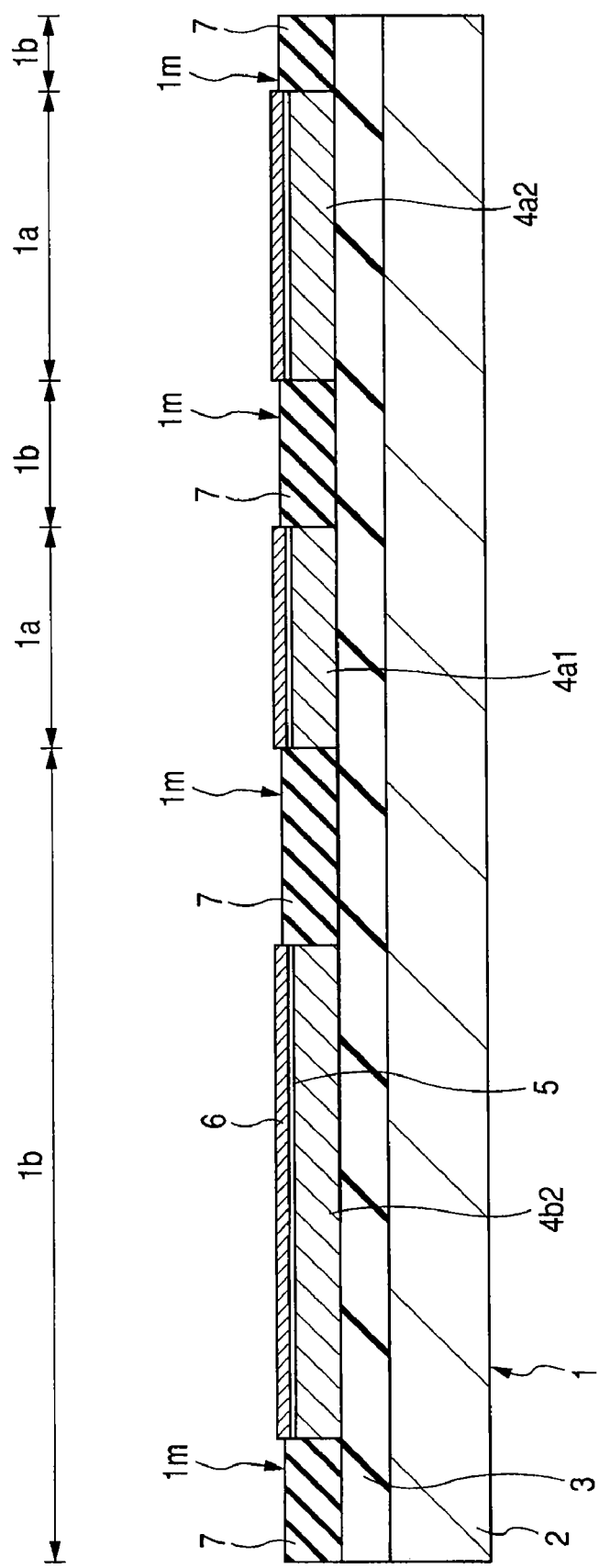
FIG. 11 is a schematic cross-sectional view showing a manufacturing step of the semiconductor device which follows FIG. 10.

Next, the insulation film 7 is leveled by polishing the insulation film 7 using a CMP method so as to allow the insulation film 7 to selectively remain between the respective semiconductor layers (4a1, 4a2, 4b1, 4b2). Due to this step, as shown in FIG. 11, the insulation film 7 is selectively embedded between the respective semiconductor layers (4a1, 4a2, 4b1, 4b2) and hence, the respective semiconductor layers are surrounded by the insulation film 7.

Further, due to such a step, the main surface of the semiconductor base body 1 includes the island-like semiconductor layers (4a1, 4a2) formed over the insulation film 3 as the transistor element forming regions and the island-like semiconductor layers (4b1, 4b2) which serve to suppress a dishing phenomenon and are formed over the insulation film 3 structurally independent from the island-like semiconductor layers (4a1, 4a2).

Here, in this step, the silicon nitride film 6 which is used as the oxidation prevention film functions as a stopper which prevents the semiconductor layers (4a1, 4a2, 4b1, 4b2) arranged below the silicon nitride film 6 from being polished.

Figure 12:
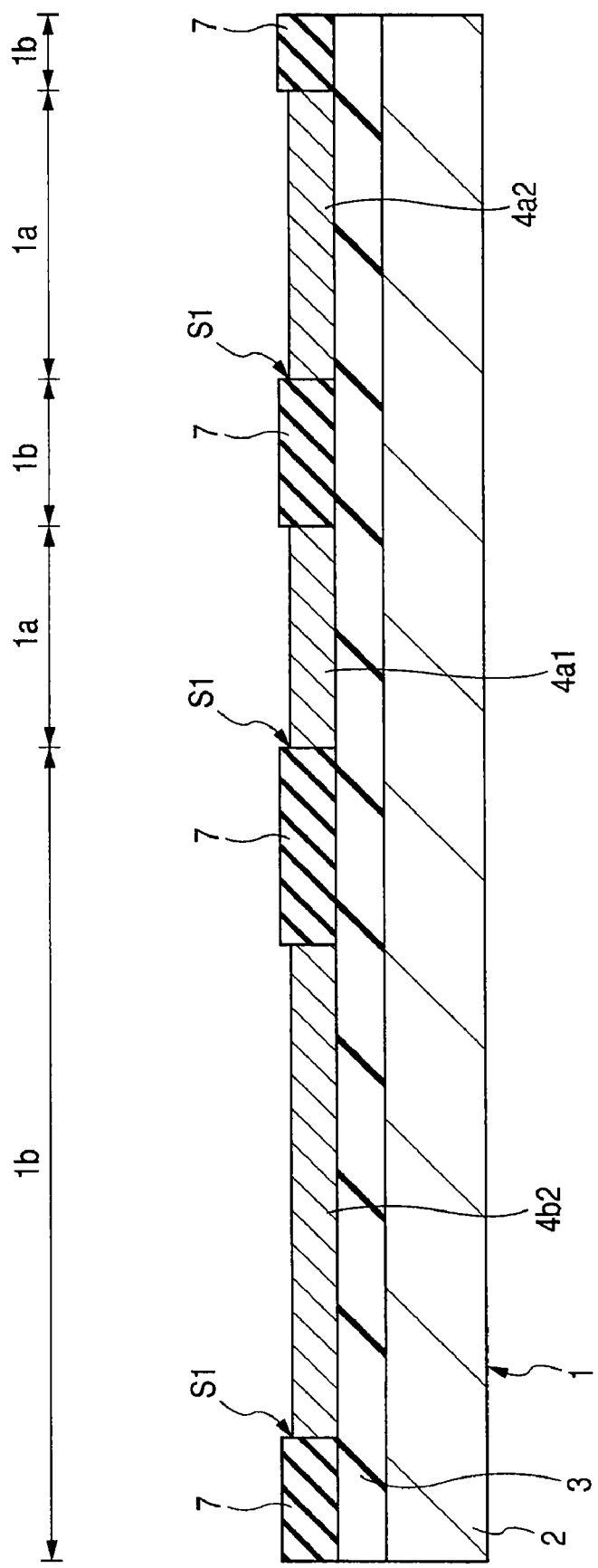
FIG. 12 is a schematic cross-sectional view showing a manufacturing step of the semiconductor device which follows FIG. 11.

Next, by applying a thermal treatment, the insulation film 7 between the respective semiconductor layers (4a1, 4a2, 4b1, 4b2) is densified (baked) and, thereafter, as shown in FIG. 12, the silicon nitride film 6 and the silicon oxide film 5 are removed. In this step, the upper surfaces of the respective semiconductor layers (4a1, 4a2, 4b1, 4b2) have heights lower than the upper surface of the insulation film 7 and hence, the stepped portions S1 attributed to the difference in height (height difference) between the respective semiconductor layers and the insulation film 7 are formed along the outer peripheries of the respective semiconductor layers.

Figure 13:
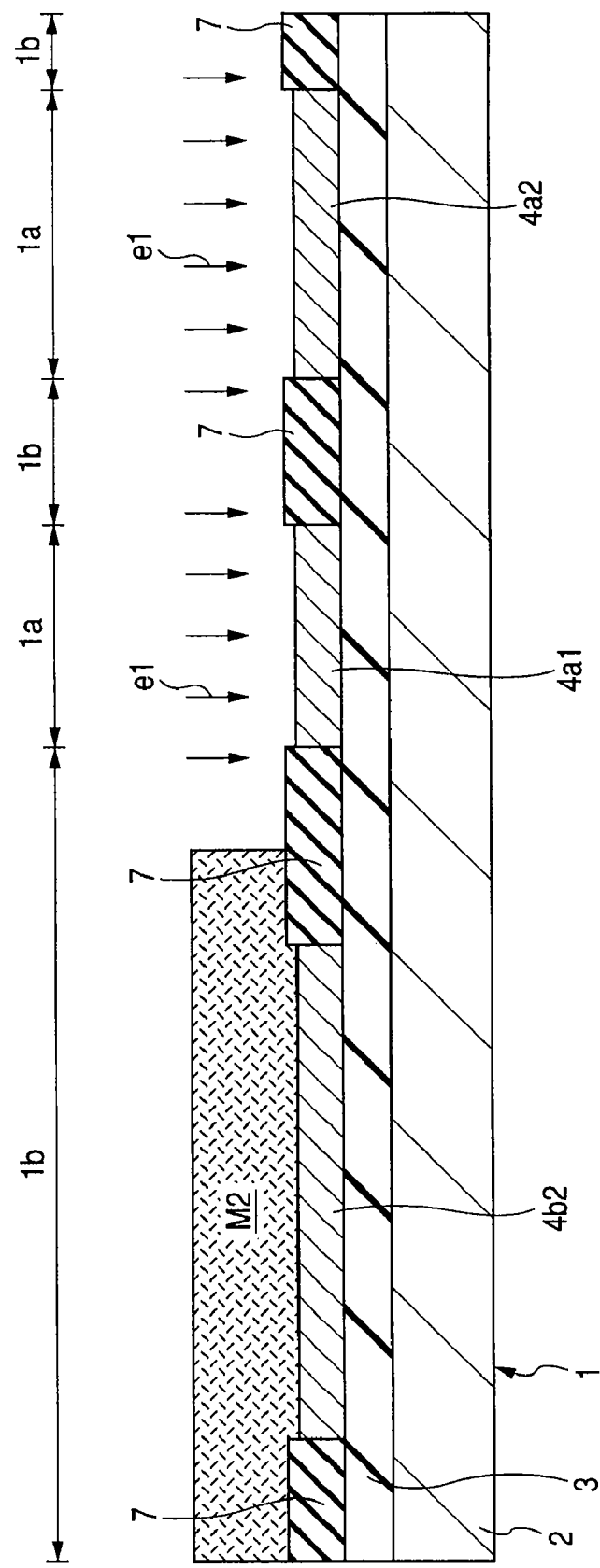
FIG. 13 is a schematic cross-sectional view showing a manufacturing step of the semiconductor device which follows FIG. 12.

Next, as shown in FIG. 13, in a state that the upper portions of the semiconductor layers (4b1, 4b2) are covered with a mask M2 formed of a photoresist film, for example, an impurity e1 for reducing a resistance value of the semiconductor layer or an impurity e1 for adjusting a threshold value or the like are injected into main surfaces of the semiconductor layers (4a1, 4a2) by ion implantation. In this step, ion implantation of the impurity e1 is not applied to the semiconductor layers (4b1, 4b2).

Next, after the mask M2 is removed, the thermal treatment for activating the impurity e1 is applied.

Figure 14:
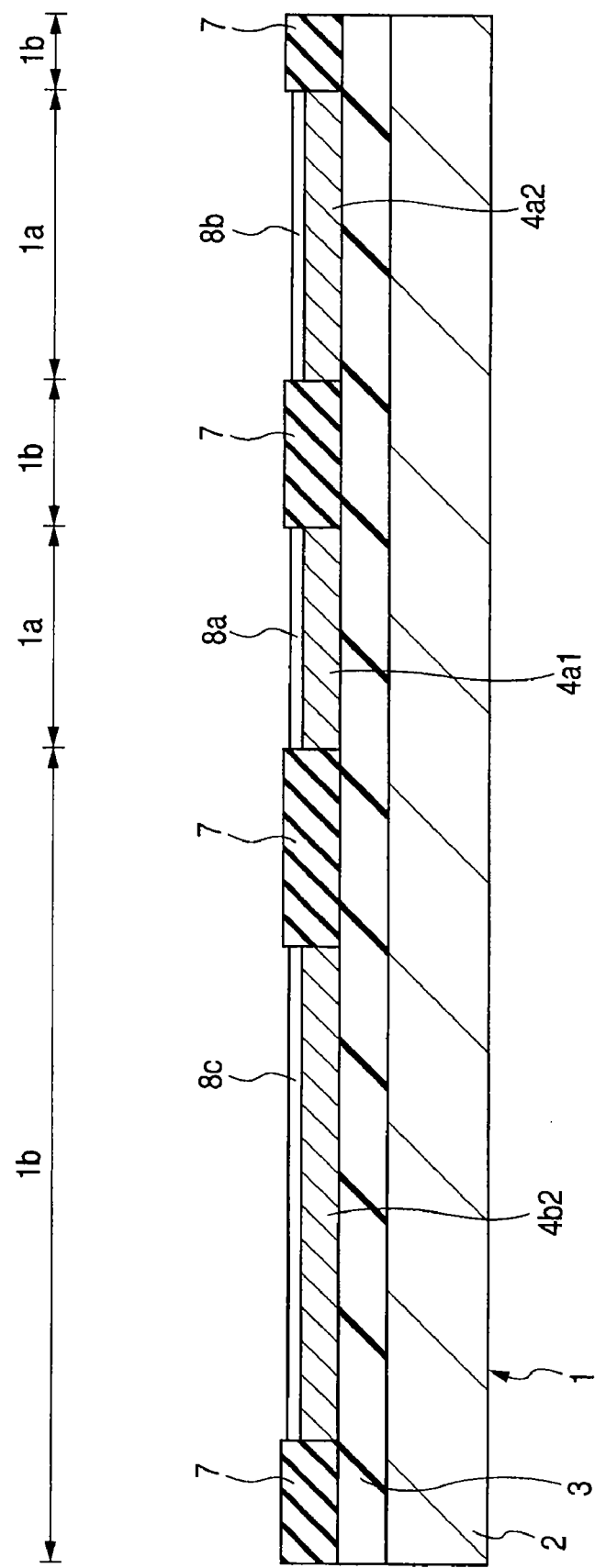
FIG. 14 is a schematic cross-sectional view showing a manufacturing step of the semiconductor device which follows FIG. 13.

Next, by applying the thermal oxidation treatment, as shown in FIG. 14, the insulation films (8a, 8b, 8c) formed of a silicon oxide film are formed over the main surfaces of the respective semiconductor layers (4a1, 4a2, 4b1, 4b2). The insulation films (8a, 8b, 8c) are formed such that the insulation films have thicknesses of approximately 7 [nm], for example. The insulation film 8b is used as a gate insulation film of high breakdown voltage MISFET-QH. The insulation film 8c is used as an insulation film which electrically separates the semiconductor layer 4b2 and the resistance element 13.

Figure 15:
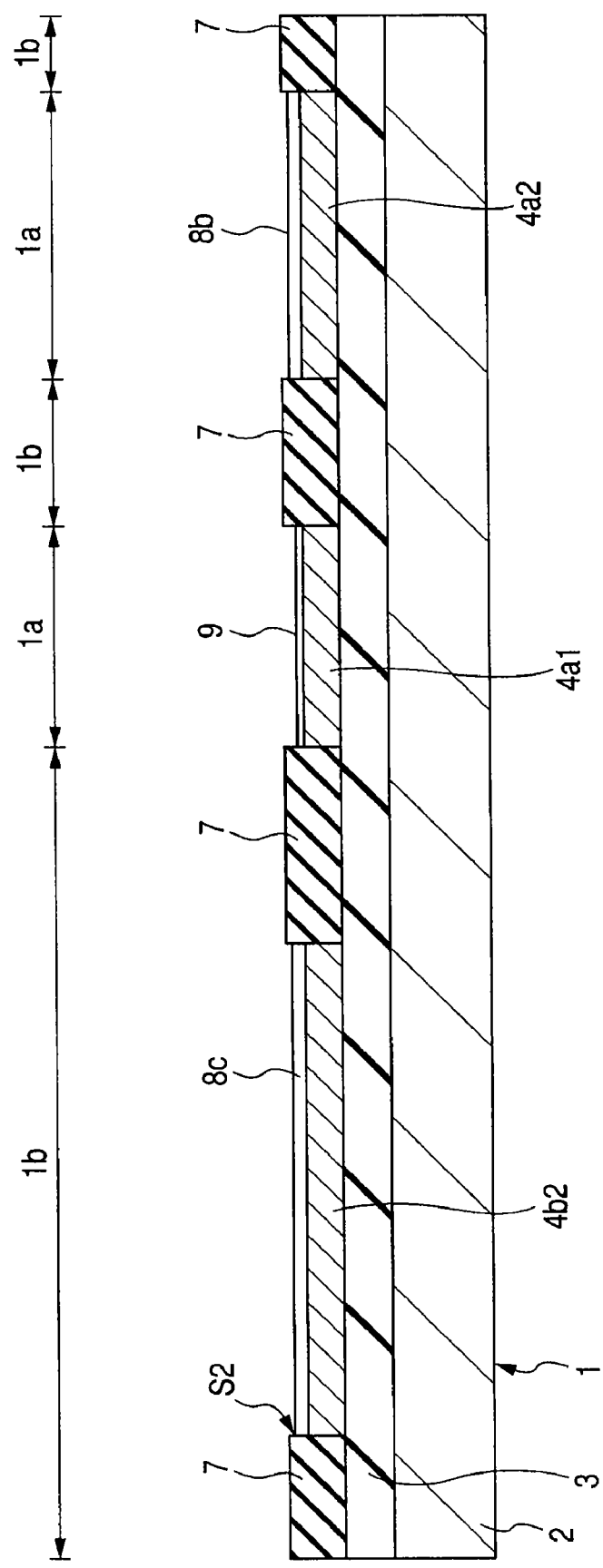
FIG. 15 is a schematic cross-sectional view showing a manufacturing step of the semiconductor device which follows FIG. 14.

Next, the insulation film 8a formed over the semiconductor layer 4a1 is selectively removed and, thereafter, by applying the thermal oxidation treatment, as shown in FIG. 15, an insulation film 9 which is formed of silicon oxide film is formed over the main surface of the semiconductor layer 4a1. The insulation film 9 is formed such that the insulation film 9 has a thickness of approximately 2 [nm], for example. The insulation film 9 is used as a gate insulation film of low breakdown voltage MISFET-QL.

In this step, an upper surface of the insulation film 8c has a height lower than a height of the upper surface of the insulation film 7 and hence, the stepped portion S2 attributed to the difference in height (height difference) between the insulation film 8c and the insulation film 7 is formed along the outer periphery of the semiconductor layer 4b2. Further, in other semiconductor layers (4a1, 4a2, 4b1) also, stepped portions attributed to the height difference between the insulation films (8b, 8c, 9) over the semiconductor layers and the insulation film 7 are formed along the peripheries of the respective semiconductor layers.

Figure 16:
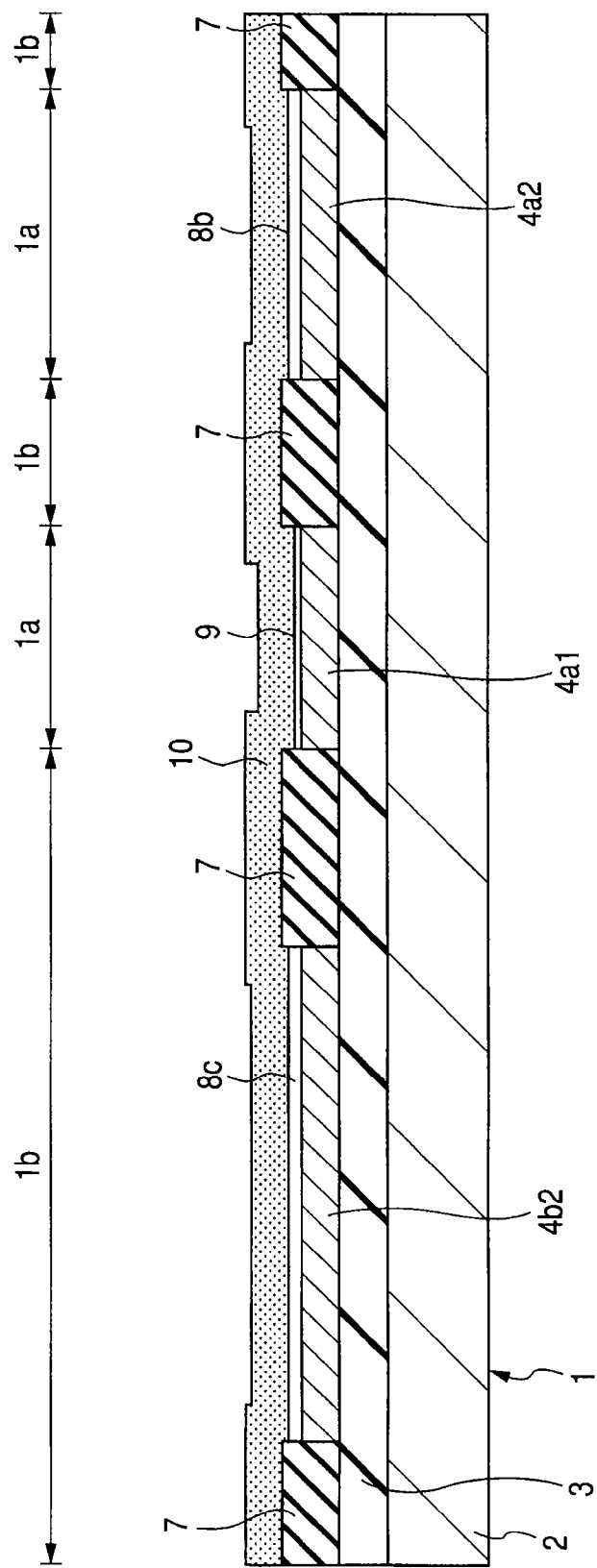
FIG. 16 is a schematic cross-sectional view showing a manufacturing step of the semiconductor device which follows FIG. 15.

Next, as shown in FIG. 16, for example, the poly-silicon film 10 which constitutes a semiconductor film is formed over the whole main surface of the semiconductor base body 1 including the upper portions of the insulation films (8b, 8c, 9) using a CVD method.

Figure 17:
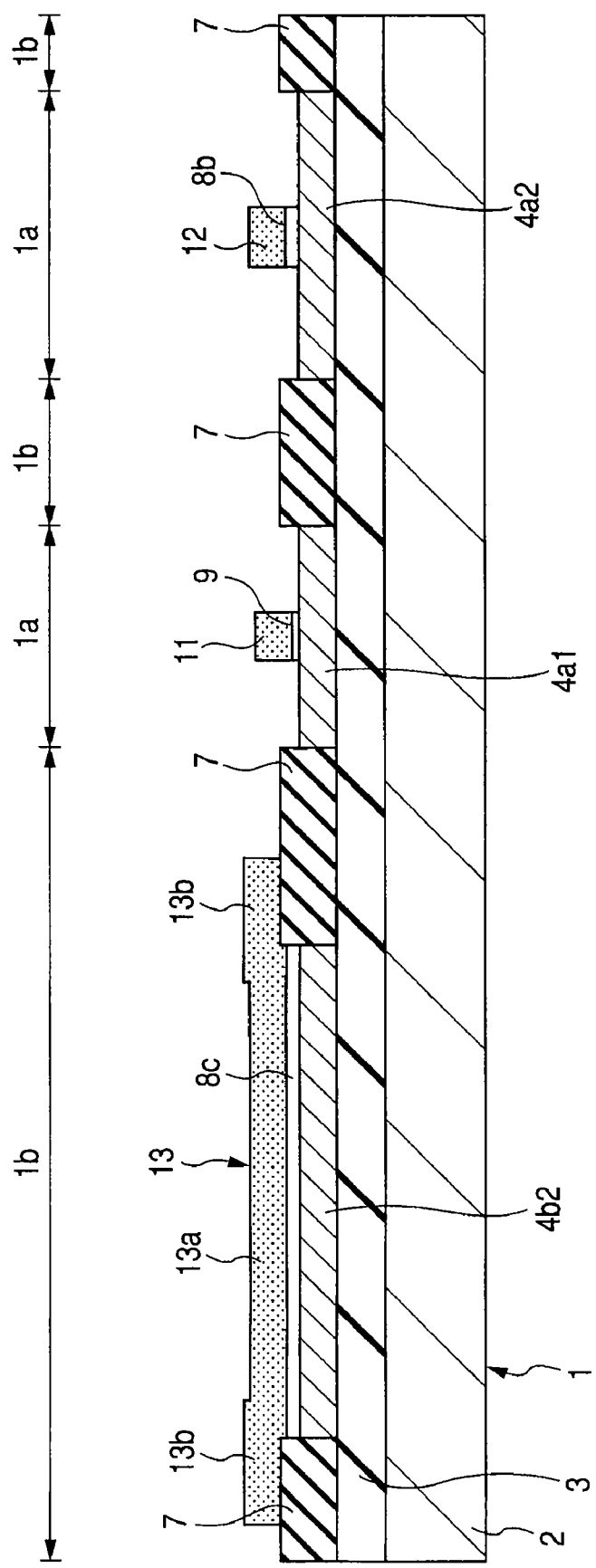
FIG. 17 is a schematic cross-sectional view showing a manufacturing step of the semiconductor device which follows FIG. 16.

Next, an impurity which reduces a resistance value (for example, arsenic (As)) is injected into the poly-silicon film 10 by ion implantation and, thereafter, the poly-silicon film 10 is formed by patterning such that, as shown in FIG. 17, the gate electrode 11 is formed over the semiconductor layer 4a1 by way of the insulation film 9, the gate electrode 12 is formed over the semiconductor layer 4a2 by way of the insulation film 8b and the resistance element 13 is formed over the semiconductor layer 4b2 by way of the insulation film 8c, respectively. The body portion 13a of the resistance element 13 traverses the stepped portion S2 in the long-side direction as well as in the short-side direction and is arranged to extend over (astride) the semiconductor layer 4b2 (over the insulation film 8c) and the insulation film 7. Respective contact portions (13b, 13c) of the resistance element 13 are arranged over the insulation film 7.

Figure 18:
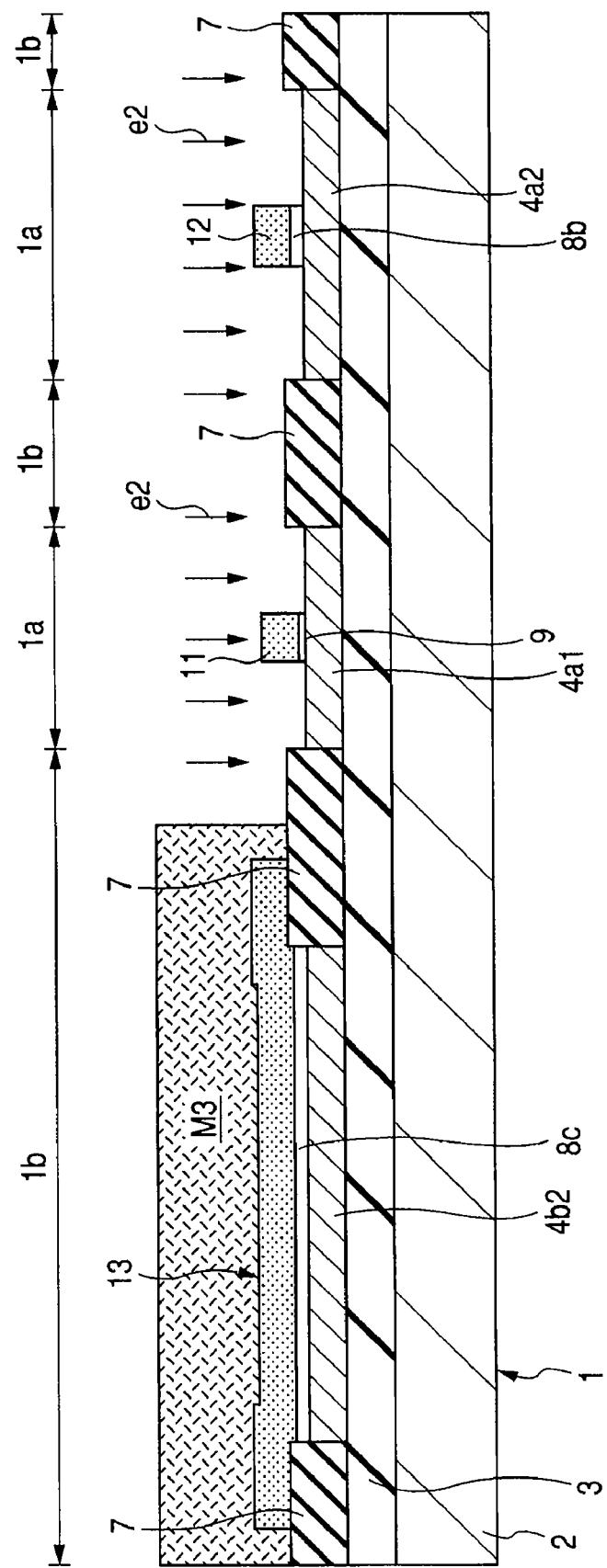
FIG. 18 is a schematic cross-sectional view showing a manufacturing step of the semiconductor device which follows FIG. 17.

Next, as shown in FIG. 18, in a state that the resistance element 13 is covered with a mask M3 formed of a photoresist film, for example, an impurity (for example, As) e2 is injected into the semiconductor layers 4a1 and 4a2 by ion implantation. In this step, ion implantation of the impurity e2 is not applied to the resistance element 13.

Figure 19:
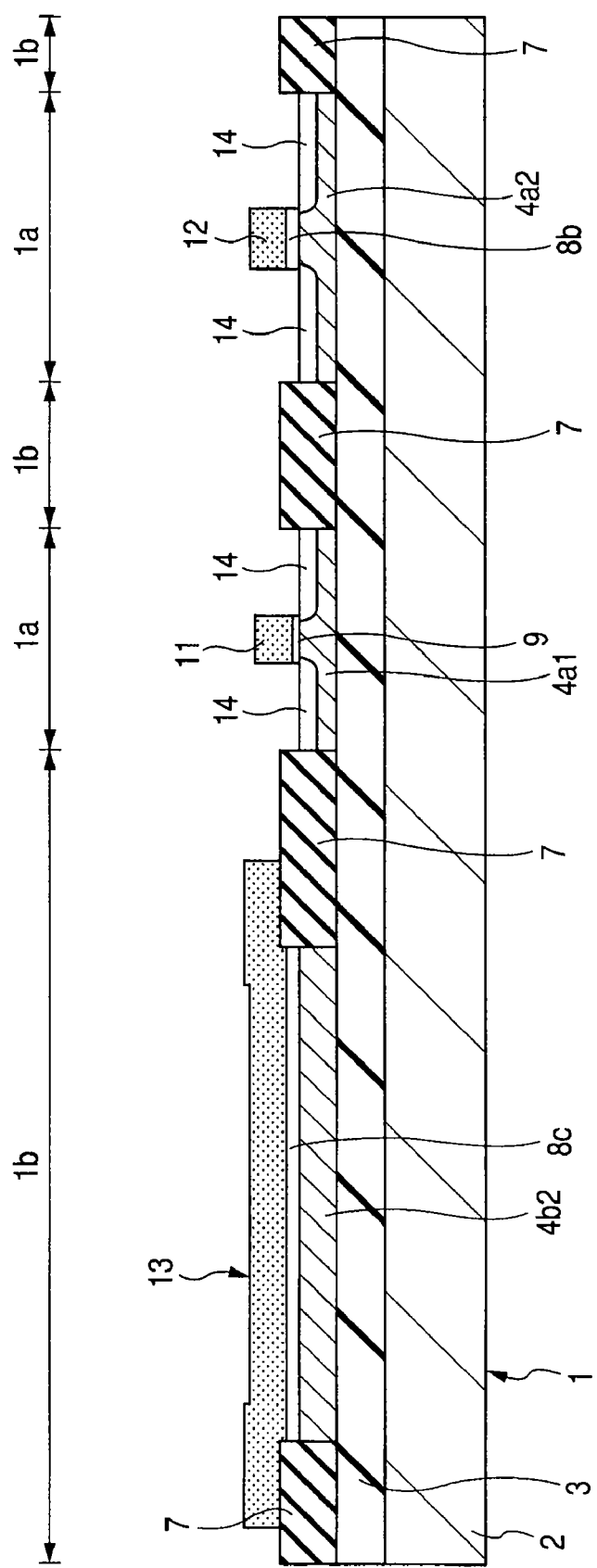
FIG. 19 is a schematic cross-sectional view showing a manufacturing step of the semiconductor device which follows FIG. 18.

Next, the mask M3 is removed and, thereafter, a thermal treatment which activates the impurity e2 is applied and, as shown in FIG. 19, a pair of n-type semiconductor regions (extension regions) 14 which is aligned with the gate electrode 11 is formed over the main surface of the semiconductor layer 4a1 and a pair of n-type semiconductor regions (extension regions) 14 which is aligned with the gate electrode 12 is formed over the main surface of the semiconductor layer 4a2, respectively.

Figure 20:
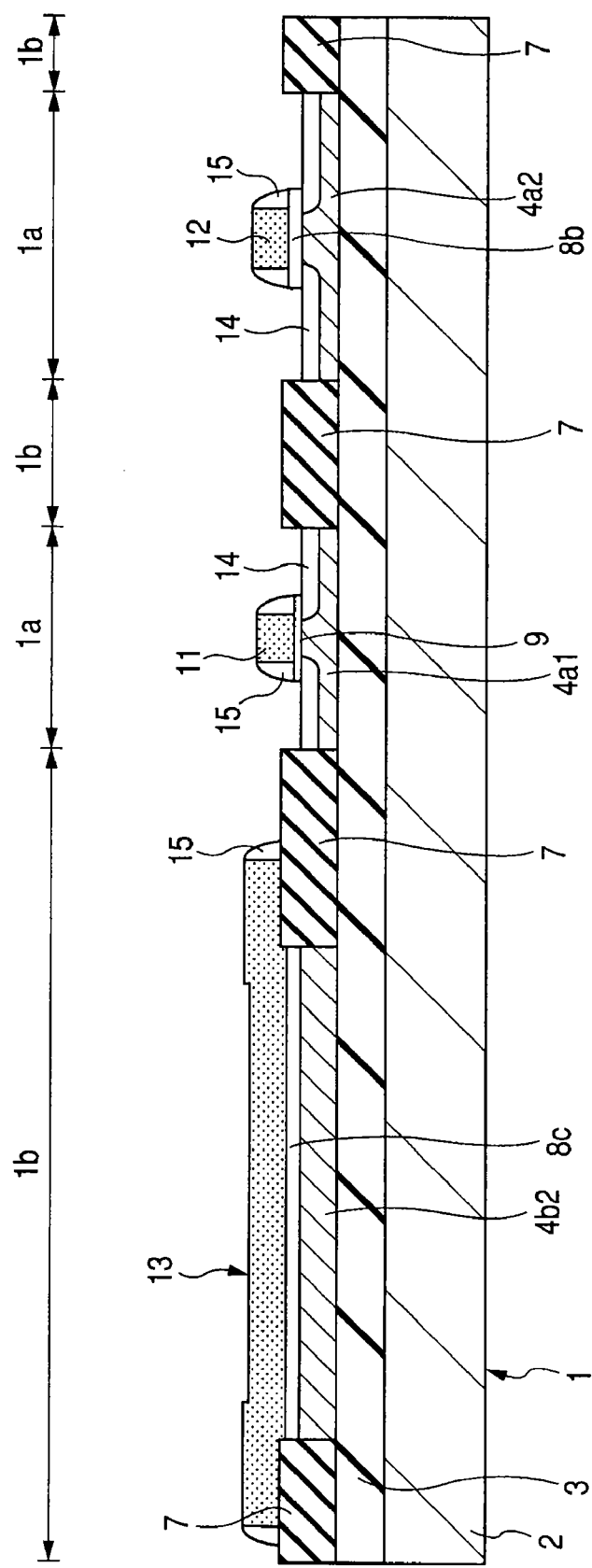
FIG. 20 is a schematic cross-sectional view showing a manufacturing step of the semiconductor device which follows FIG. 19.

Next, as shown in FIG. 20, the side wall spacers 15 are formed over the side walls of the gate electrodes (11, 12) and the side wall of the resistance element 13. The side wall spacers 15 are formed in the following manner. That is, the insulation film which is formed of silicon oxide film, for example, is formed over the whole main surface of the semiconductor base body 1 using a CVD method and, thereafter, an anisotropic etching such as RIE (Reactive Ion Etching) or the like is applied to the insulation film.

Figure 21:
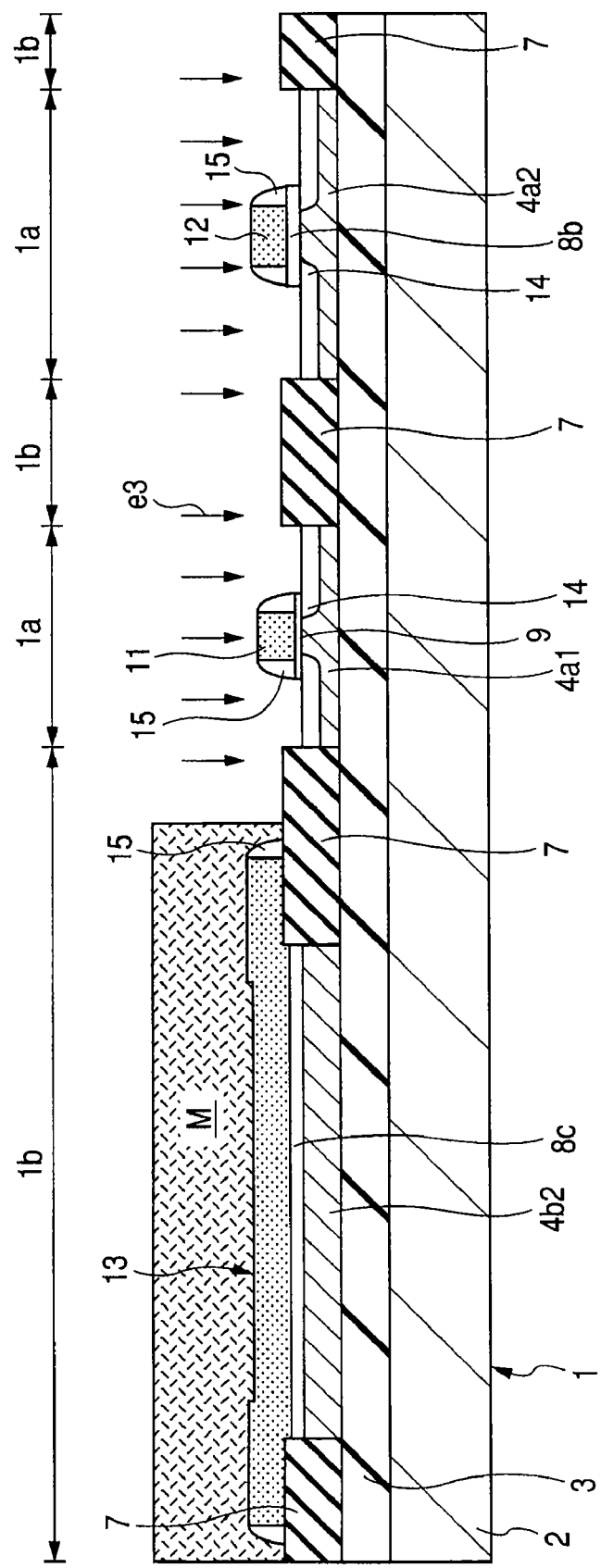
FIG. 21 is a schematic cross-sectional view showing a manufacturing step of the semiconductor device which follows FIG. 20.

Next, as shown in FIG. 21, in a state that the resistance element 13 is covered with a mask M4 formed of a photoresist film, for example, an impurity (for example, As) e3 is injected into the semiconductor layers 4a1 and 4a2 by ion implantation. In this step, the ion implantation of the impurity e3 is not applied to the semiconductor layers 4b1 and 4b2.

Figure 22:
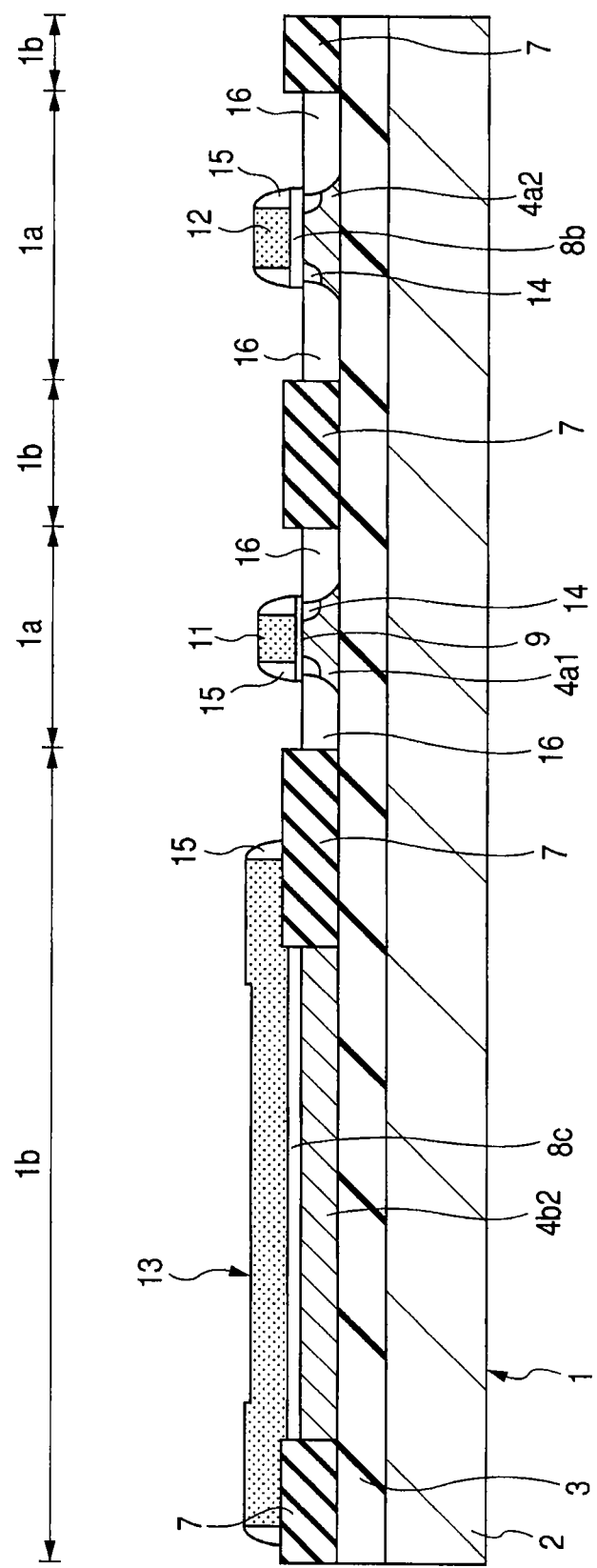
FIG. 22 is a schematic cross-sectional view showing a manufacturing step of the semiconductor device which follows FIG. 21.

Next, the mask M4 is removed and, thereafter, the thermal treatment which activates the impurity e3 is applied and, as shown in FIG. 22, a pair of n-type semiconductor regions (contact regions) 16 which is aligned with the side wall spacer 15 of the side wall of the gate electrode 11 is formed over the main surface of the semiconductor layer 4a1 and the pair of n-type semiconductor regions (contact regions) 16 which is aligned with the side wall spacer 15 of the gate electrode 12 is formed over the main surface of the semiconductor layer 4a2, respectively.

Figure 23:
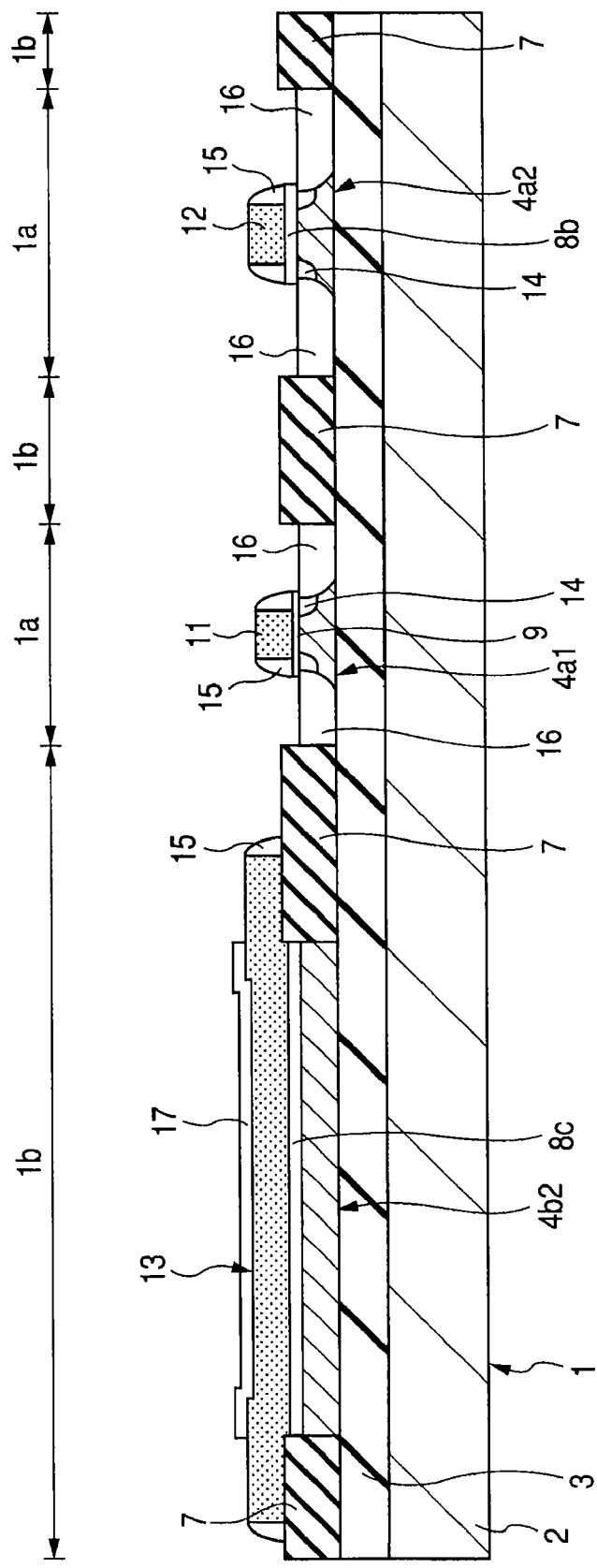
FIG. 23 is a schematic cross-sectional view showing a manufacturing step of the semiconductor device which follows FIG. 22.

Next, as shown in FIG. 23, the insulation film 17 which covers the body portion 13a and does not cover the respective contact portions (13b, 13c) is formed over the upper surface of the resistance element 13. The insulation film 17 is formed of a silicon oxide film, for example, and constitutes a silicide layer which is formed over the upper surface of the resistance element 13.

Figure 24:
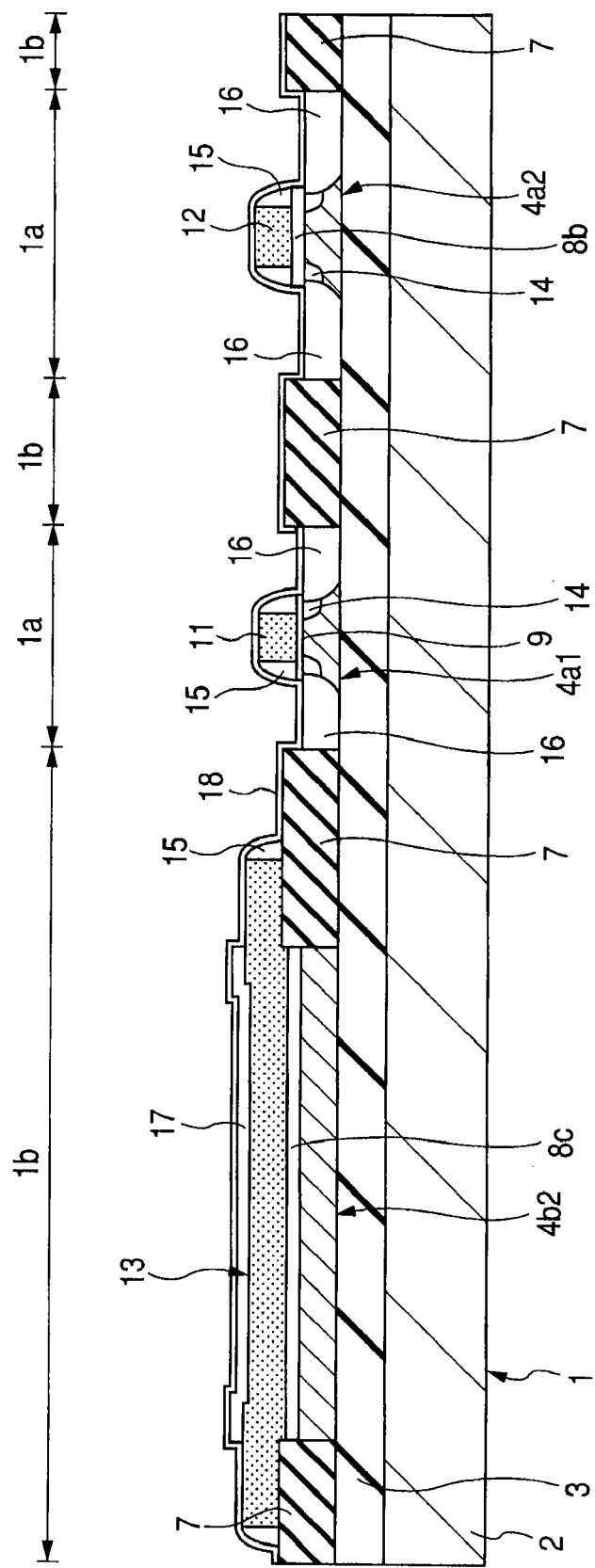
FIG. 24 is a schematic cross-sectional view showing a manufacturing step of the semiconductor device which follows FIG. 23.

Next, a natural oxide film or the like is removed and the surfaces of the respective contact portions (13b, 13c) of the resistance element 13, the surfaces of the gate electrodes (11, 12) and the surfaces of the n-type semiconductor regions 16 are exposed and, thereafter, as shown in FIG. 24, the high-melting-point metal film (for example, cobalt (Co) film) 18 is formed over the whole main surface of the semiconductor base body 1 including these surfaces by a sputtering method.

Figure 25:
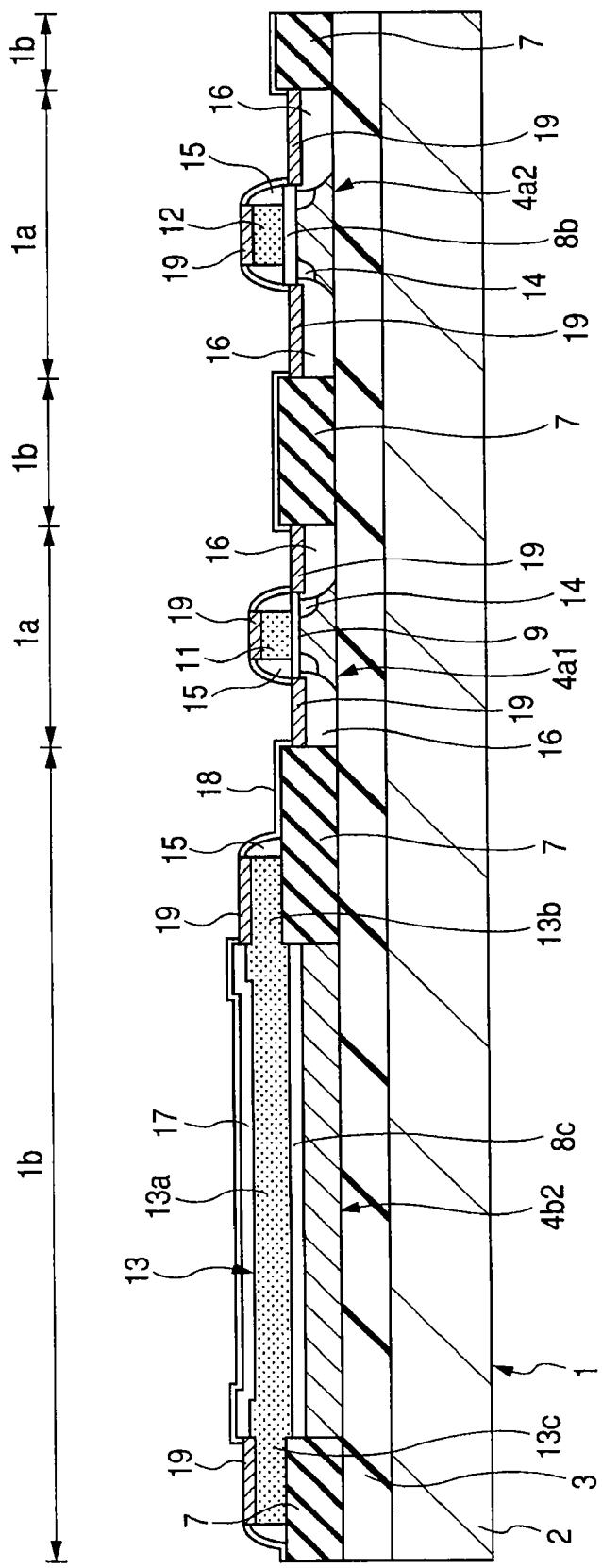
FIG. 25 is a schematic cross-sectional view showing a manufacturing step of the semiconductor device which follows FIG. 24.

Next, the thermal treatment which allows the respective contact portions (13b, 13c) of the resistance element 13, the gate electrodes (11, 12) and the n-type semiconductor regions 16 to react with the high-melting point metal film 18 is applied and hence, as shown in FIG. 25, silicide layers (for example, CoSi2 layer) 19 are formed over the surfaces of the respective contact portions (13b, 13c), the surfaces of the gate electrodes (11, 12) and the surfaces of the n-type semiconductor regions 16. The silicide layers 19 which is formed over the gate electrodes (11, 12) and in the n-type semiconductor regions 16 are formed such that the silicide layers 19 are aligned with the side wall spacers 15. The silicide layer 19 formed on the resistance element 13 is formed to be aligned with the insulation film 17. Further, although a cobalt silicide layer is exemplified as the silicide layer 19 in this embodiment, the silicide layer 19 is not limited to the cobalt silicide layer and, the silicide layer may be made of titanium silicide (TiSi2), nickel silicide (NiSi2) or the like.

Next, the high-melting-point metal film 18 which has not reacted is selectively removed. Due to this step, the low and high breakdown voltage MISFETs (QL, QH) having the silicide structure are substantially completed. Further, the resistance element 13 which is formed of a poly-silicon film and has the silicide layers 19 on the respective contact portions (13b, 13c) are substantially completed.

Thereafter, the interlayer insulation film 20 is formed over the main surface of the semiconductor base body 1 and, thereafter, the connection holes (21, 22), the conductive plugs (23, 24), the lines (25, 26) and the like are sequentially formed thus constituting the structure shown in FIG. 3.

In the manufacture of the semiconductor device, in electrically separating the element forming regions 1a formed on the main surface of the semiconductor base body 1 using the groove-type element isolation, to suppress the lowering of flatness of the wafer attributed to the dishing phenomenon, the main surface of the wafer is divided into a plurality of imaginary regions in a mesh form, and an occupation ratio of the semiconductor layer (a ratio between the insulation film in the groove and the semiconductor layer) in each imaginary region is determined. There exists a de-facto standard that, for example, the main surface of the wafer is divided into a plurality of imaginary regions having a size of 20 [µm] square, and the occupation ratio of the semiconductor layers in each imaginary region is set to a value which falls within a range from 15 to 20% or more. When the imaginary region which does not satisfy the occupation ratio of the semiconductor layer exists, as shown in FIG. 2 and FIG. 3, dummy semiconductor layers (4b1, 4b2) are provided to the element isolation regions 1b and hence, the occupation ratio of the semiconductor layer is satisfied.

In the embodiment 1, the semiconductor layer 4b2 is, as shown in FIG. 3, formed over the insulation film 3 in a state that the semiconductor layer 4b2 is formed structurally independent from the semiconductor layers which are used as forming regions of the transistor elements (4a1, 4a2) and in a state that the semiconductor layer 4b2 is electrically separated by the insulation film 3 and the insulation film 7. Due to such a constitution, the semiconductor layer 4b2 is not influenced by a substrate bias attributed to fixing of potential of the semiconductor layers (4a1, 4a2) and fixing of potential of the support substrate 2 and hence, even when the resistance element 13 is arranged in a state that the resistance element 13 is overlapped to the semiconductor layer 4b2 in plane, it is possible to suppress the fluctuation of characteristics of the resistance elements 13 due to the substrate bias effect.

Figure 40:
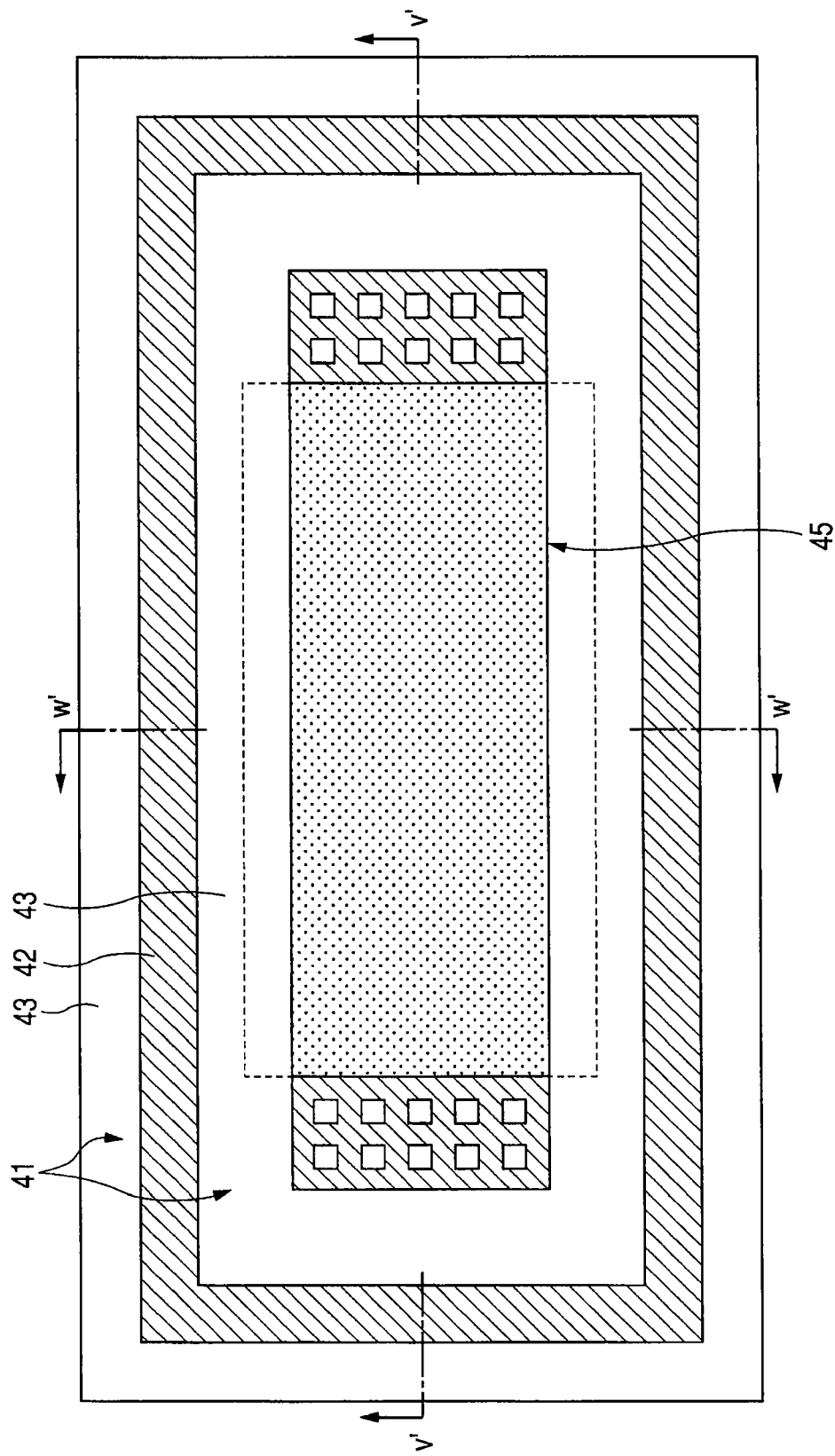
FIG. 40 is a schematic plan view showing the schematic constitution of a resistance element which is mounted on a conventional semiconductor device.

Accordingly, over the semiconductor layers 4b2 which are provided aiming at the suppression of the dishing phenomenon (aiming at the leveling of a wafer and the increase of an occupation ratio of the semiconductor layer), it is possible to arrange the resistance elements 13 in a state that the resistance elements 13 are overlapped to the semiconductor layer 4b2 in plane and hence, in comparison with the conventional case shown in FIG. 40 and FIG. 41 in which the resistance element 45 and the dummy semiconductor layer 42 are arranged in plane, it is possible to reduce the area of the element isolation region 1b thus realizing the miniaturization of the semiconductor device.

It is possible to perform the reduction of the area of the element isolation region 1b by overlapping a portion of the semiconductor layer 4b2 and the resistance element 13 in plane. However, as shown in the embodiment 1, by arranging the resistance element 13 in a state that the resistance element 13 covers the whole semiconductor layer 4b2, the occupied area of the semiconductor layer 4b2 is offset by the occupied area of the resistance element 13 and hence, it is further effective in reducing the area of the element isolation region 1b.

In this embodiment 1, the contact portions (13b, 13c) which are positioned at both end portions of the resistance element 13 are, as shown in FIG. 4 and FIG. 5, formed over the insulation film 7, while the contact portions (13b, 13c) are not formed over the semiconductor layer 4b2. Since the contact portions (13b, 13c) are not formed over the semiconductor layer 4b2, it is possible to suppress a drawback that the insulation film 8c is broken due to a contact forming damage so that the semiconductor layer 4b2 and the resistance element 13 are short-circuited.

In the embodiment 1, the insulation film 8c which is arranged between the semiconductor layer 4b2 and the resistance element 13 is, as shown in FIG. 14, formed in the same step as the formation of the insulation film 8b which is used as the gate insulation film of the high breakdown voltage MISFET-QH. By forming the insulation film 8c in the same step as the gate insulation film forming step of the high breakdown voltage MISFET-QH in such a manner, it is possible to simplify the process.

Further, it is also possible to simplify the process by forming the insulation film 8c in the same step as the forming step of the insulation film 9 which is used as the gate insulation film of the low breakdown voltage MISFET-QL (see FIG. 15). However, since the insulation film 9 has a film thickness smaller than the insulation film 8b, by taking the insulation property between the semiconductor layer 4b2 and the resistance element 13 into consideration, as shown in the embodiment 1, it is preferable to form the insulation film 8c in the same step as the gate insulation film forming step of the high breakdown voltage MISFET-QH.

Further, by forming the insulation film 8c having a large thickness in the same step as the gate insulation film forming step of the high breakdown voltage MISFET-QH, it is possible to reduce a parasitic capacitance which is applied to the resistance element 13.

In the manufacture of the semiconductor device of the embodiment 1, as shown in FIG. 13, in a state that the upper portions of the semiconductor layers (4b1, 4b2) are covered with the mask M2 formed of the photoresist film, for example, the impurity e1 for reducing a resistance value of the semiconductor layer or the impurity e1 for adjusting a threshold value or the like are injected into main surfaces of the semiconductor layers (4a1, 4a2) by ion implantation while the impurity e1 is not injected into the semiconductor layer 4b2 by ion implantation. By obviating the injection of the impurity e1 into the semiconductor layer 4b by ion implantation in this manner, the semiconductor layer 4b2 is liable to be easily depleted and hence, it is possible to reduce the parasitic capacitance of the support substrate 2 in view of the resistance elements 13.

In the manufacture of the semiconductor device of the embodiment 1, in the step which forms the extension region (semiconductor region 14) of the MISFET, as shown in FIG. 18, in a state that the resistance element 13 is covered with the mask M3 formed of the photoresist film, for example, the impurity (for example, As) e2 is injected into the semiconductor layers 4a1 and 4a2 by ion implantation while the impurity e2 is not injected into the resistance element 13 by ion implantation. Further, in the step which forms the contact region (semiconductor region 16) of the MISFET, as shown in FIG. 21, in a state that the resistance element 13 is covered with the mask M4 formed of the photoresist film, for example, the impurity (for example, As) e3 is injected into the semiconductor layers 4a1 and 4a2 by ion implantation while the impurity e3 is not injected into the semiconductor layer 4b2 by ion implantation.

There may be a case that insulation films such as the natural oxide films remain on an upper surface of the resistance element 13 formed of poly-silicon film thus generating irregularities in the injection of an impurity by ion implantation. Accordingly, as described in the embodiment 1, in the impurity injection step for forming the source region and the drain region of the MISFET by ion implantation, by obviating the injection of impurities into the resistance element 13 by ion implantation, it is possible to enhance the uniformity of resistance value of the resistance element 13 thus forming a resistance element 13 having high accuracy.

Embodiment 2

Figure 26:
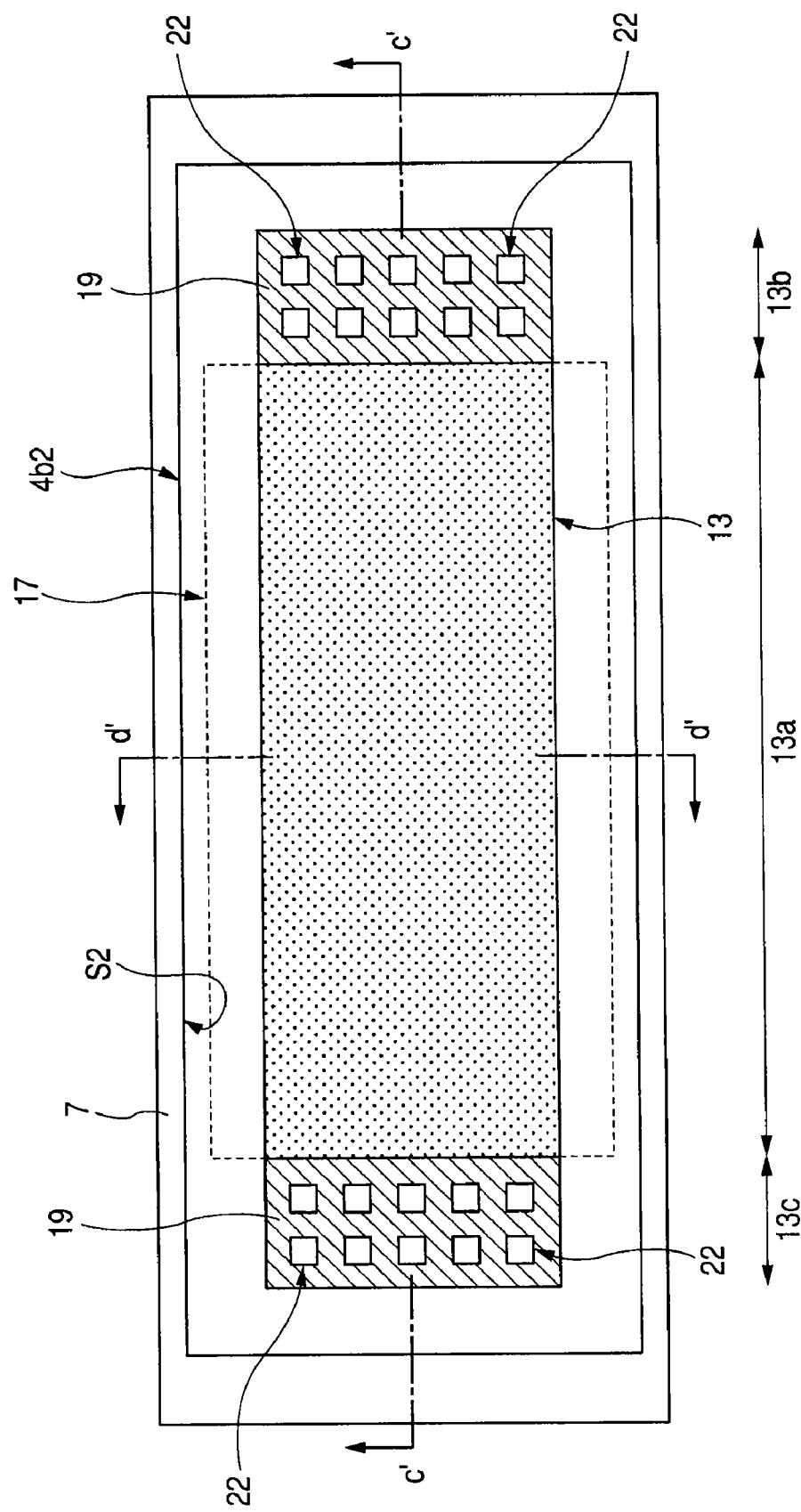
FIG. 26 is a schematic plan view showing the schematic constitution of a resistance element which is mounted on a semiconductor device of an embodiment 2 according to the present invention.

FIG. 26 is a schematic plan view showing the schematic constitution of a resistance element which is mounted on the semiconductor device of an embodiment 2 according to the present invention, and FIG. 27A and FIG. 27B are views showing the cross-sectional structure of the resistance element shown in FIG. 26, in which FIG. 27A is a schematic cross-sectional view taken along a line c'-c' in FIG. 26, and FIG. 27B is a schematic cross-sectional view taken along a line d'-d' in FIG. 26.

As shown in FIG. 26, FIG. 27A and FIG. 27B, the semiconductor layer 4b2 has a planar shape which intersects the thickness direction thereof formed in a rectangular shape having long sides and short sides. In this embodiment 2, the semiconductor layer 4b2 has a planar size larger than a planar size of the resistance element 13 (7 [μm]×2 [μm]). That is, the semiconductor layer 4b2 is formed into a rectangular planar shape of 7.6 [μm]×2.6 [μm], for example.

The resistance element 13 is arranged so as to overlap a portion of the semiconductor layer 4b2 in plane in a state that the long sides (or the short sides) of the resistance element 13 extend along the same direction as the long sides (or the short sides) of the semiconductor layer 4b2. That is, the resistance element 13 is arranged so as to cover a portion of the semiconductor layer 4b2. Further, the resistance element 13 is arranged in a state that the long sides of the resistance element 13 are positioned inside the long sides of the semiconductor layer 4b2, and the short sides of the resistance element 13 are positioned inside the short sides of the semiconductor layer 4b2.

An upper surface of the semiconductor layer 4b2 is covered with an insulation film 8c. The upper surface of the insulation film 8c has a height lower than the upper surface of the insulation film 7, and a stepped portion S2 attributed to the difference in height (height difference) between the insulation film 8c and the insulation film 7 is formed along the outer periphery of the semiconductor layer 4b2.

The whole resistance element 13 is arranged over the semiconductor layer 4b2 (over the insulation film 8c) and hence, the resistance element 13 does not traverse the stepped portion S2 in the long-side direction as well as in the short-side direction. Due to such a constitution, the resistance element 13 is not influenced by the stepped portion S2 in the long-side direction as well as in the short-side direction of the resistance element 13 and hence, the flat resistance element 13 can be formed thus enhancing the resistance value uniformity of the resistance element 13.

Embodiment 3

Figure 28:
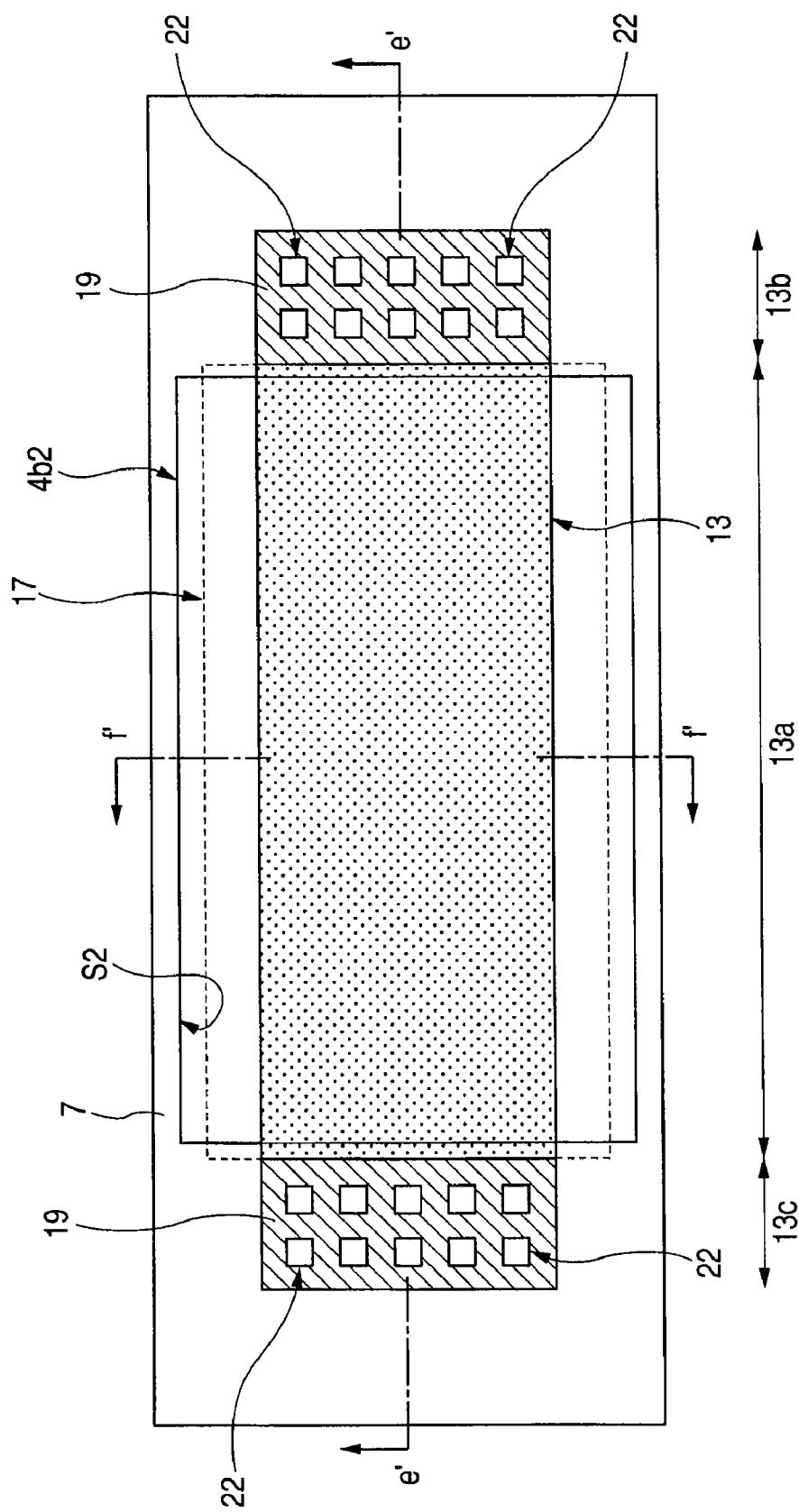
FIG. 28 is a schematic plan view showing the schematic constitution of a resistance element which is mounted on a semiconductor device of an embodiment 3 according to the present invention.

FIG. 28 is a schematic plan view showing the schematic constitution of a resistance element which is mounted on the semiconductor device of an embodiment 3 according to the present invention, and FIG. 29A and FIG. 29B are views showing the cross-sectional structure of the resistance element shown in FIG. 28, in which FIG. 29A is a schematic cross-sectional view taken along a line e'-e' in FIG. 28, and FIG. 29B is a schematic cross-sectional view taken along a line f'-f' in FIG. 28.

As shown in FIG. 28, FIG. 29A and FIG. 29B, the semiconductor layer 4b2 has a planar shape which intersects the thickness direction thereof formed in a rectangular shape having long sides and short sides. In the embodiment 3, the semiconductor layer 4b2 has a planar size having shorter long sides and longer short sides with respect to a planar size of the resistance element 13 (7 [μm]×2 [μm]), that is, the semiconductor layer 4b2 is formed into a rectangular planar shape of 4.8 [μm]×2.6 [μm], for example.

The resistance element 13 is arranged so as to overlap to a portion of the semiconductor layer 4b2 in plane in a state that the long sides (or the short sides) of the resistance element 13 extend along the same direction as the long sides (or the short sides) of the semiconductor layer 4b2, in other words, the resistance element 13 is arranged so as to cover a portion of the semiconductor layer 4b2. Further, the resistance element 13 is arranged in a state that the long sides of the resistance element 13 are positioned inside the long sides of the semiconductor layer 4b2 and the short sides of the resistance element 13 are positioned outside the short sides of the semiconductor layer 4b2.

An upper surface of the semiconductor layer 4b2 is covered with an insulation film 8c. The upper surface of the insulation film 8c has a height lower than the upper surface of the insulation film 7, and a stepped portion S2 due to the difference in height (height difference) between the insulation film 8c and the insulation film 7 is formed along the outer periphery of the semiconductor layer 4b2.

A body portion 13a of the resistance element 13 traverses the stepped portion S2 in the long-side direction and is arranged to extend over (astride) the semiconductor layer 4b2 (over the insulation film 8c) and the insulation film 7, while the body portion 13a of the resistance element 13 does not traverse the stepped portion S2 in the short-side direction and is not arranged over the insulation film 7.

Respective contact portions (13b, 13c) of the resistance element 13 are arranged over the insulation film 7, and silicide layers 19 of the respective contact portions are also arranged over the insulation film 7, while silicide layers 19 of the respective contact portions are not formed over the semiconductor layer 4b2.

The resistance element 13 is arranged over the semiconductor layer 4b2 (on the insulation film 8c) in a state that the resistance element 13 covers a portion of the semiconductor layer 4b2, and the resistance element 13 does not traverse the stepped portion S2 in the short-side direction. Due to such a constitution, the resistance element 13 is not influenced by the stepped portion S2 in the short-side direction of the resistance element 13 and hence, a flat resistance element 13 can be formed thus enhancing a resistance value uniformity of the resistance element 13.

Further, contact portions (13b, 13c) of both end portions of the resistance element 13 are arranged over the insulation film 7, and are not arranged over the semiconductor layer 4b2.

Further, since the contact portions (13b, 13c) are not formed over the semiconductor layer 4b2, it is possible to suppress a drawback that the insulation film 8c is broken due to a contact forming damage so as to short-circuit the semiconductor layer 4b2 and the resistance element 13.

Embodiment 4

Figure 30:
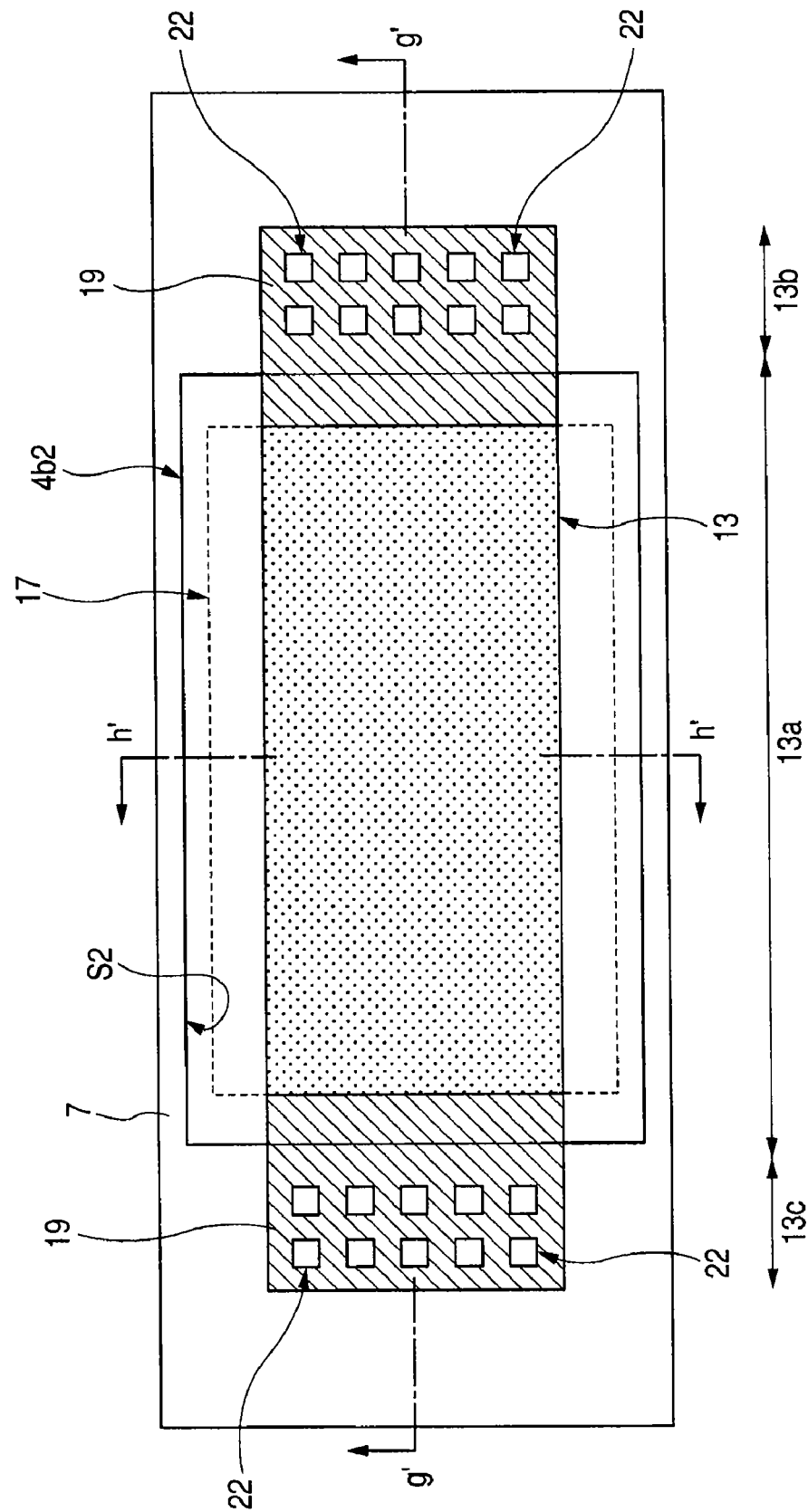
FIG. 30 is a schematic plan view showing the schematic constitution of a resistance element which is mounted on a semiconductor device of an embodiment 4 according to the present invention.

FIG. 30 is a schematic plan view showing the schematic constitution of a resistance element which is mounted on the semiconductor device of an embodiment 4 according to the present invention, and FIG. 31A and FIG. 31B are views showing the cross-sectional structure of the resistance element shown in FIG. 30, in which FIG. 31A is a schematic cross-sectional view taken along a line g'-g' in FIG. 30, and FIG. 31B is a schematic cross-sectional view taken along a line h'-h' in FIG. 30.

As shown in FIG. 30, FIG. 31A and FIG. 31B, the semiconductor layer 4b2 has a planar shape which intersects the thickness direction thereof formed in a rectangular shape having long sides and short sides. In the embodiment 4, the semiconductor layer 4b2 has a planar size having shorter long sides and longer short sides with respect to a planar size of the resistance element 13 (7 [μm]×2 [μm]), that is, the semiconductor layer 4b2 is formed into a rectangular planar shape of 4.8 [μm]×2.6 [μm], for example.

The resistance element 13 is arranged so as to overlap a portion of the semiconductor layer 4b2 in plane in a state that the long sides (or the short sides) of the resistance element 13 are arranged to extend along the same direction as the long sides (or the short sides) of the semiconductor layer 4b2. That is, the resistance element 13 is arranged so as to cover a portion of the semiconductor layer 4b2. Further, the resistance element 13 is arranged in a state that the long sides of the resistance element 13 are positioned inside the long sides of the semiconductor layer 4b2 and the short sides of the resistance element 13 are positioned outside the short sides of the semiconductor layer 4b2.

A body portion 13a of the resistance element 13 does not traverse the stepped portion S2 in the long-side direction as well as in the short-side direction and is arranged over the semiconductor layer 4b2. The contact portions (13b, 13c) of the resistance element 13 traverse the stepped portion S2 in the long-side direction and are arranged to extend over (astride) the semiconductor layer 4b2 (over the insulation film 8c) and the insulation film 7. Silicide layers 19 of the contact portions (13b, 13c) also traverse the stepped portion S2 in the long-side direction and are arranged to extend over (astride) the semiconductor layer 4b2 (over the insulation film 8c) and the insulation film 7.

A resistance value of the resistance element 13 is set mainly based on a resistance value of the body portion 13a. Accordingly, by allowing the contact portions (13b, 13c) to traverse the stepped portion S2 and the body portion 13a and not to traverse the stepped portion S2, an influence of the stepped portion S2 in the long-side direction and the short-side direction of the resistance element 13 can be eliminated and hence, the uniformity of resistance value of the resistance element 13 can be enhanced.

Embodiment 5

Figure 32:
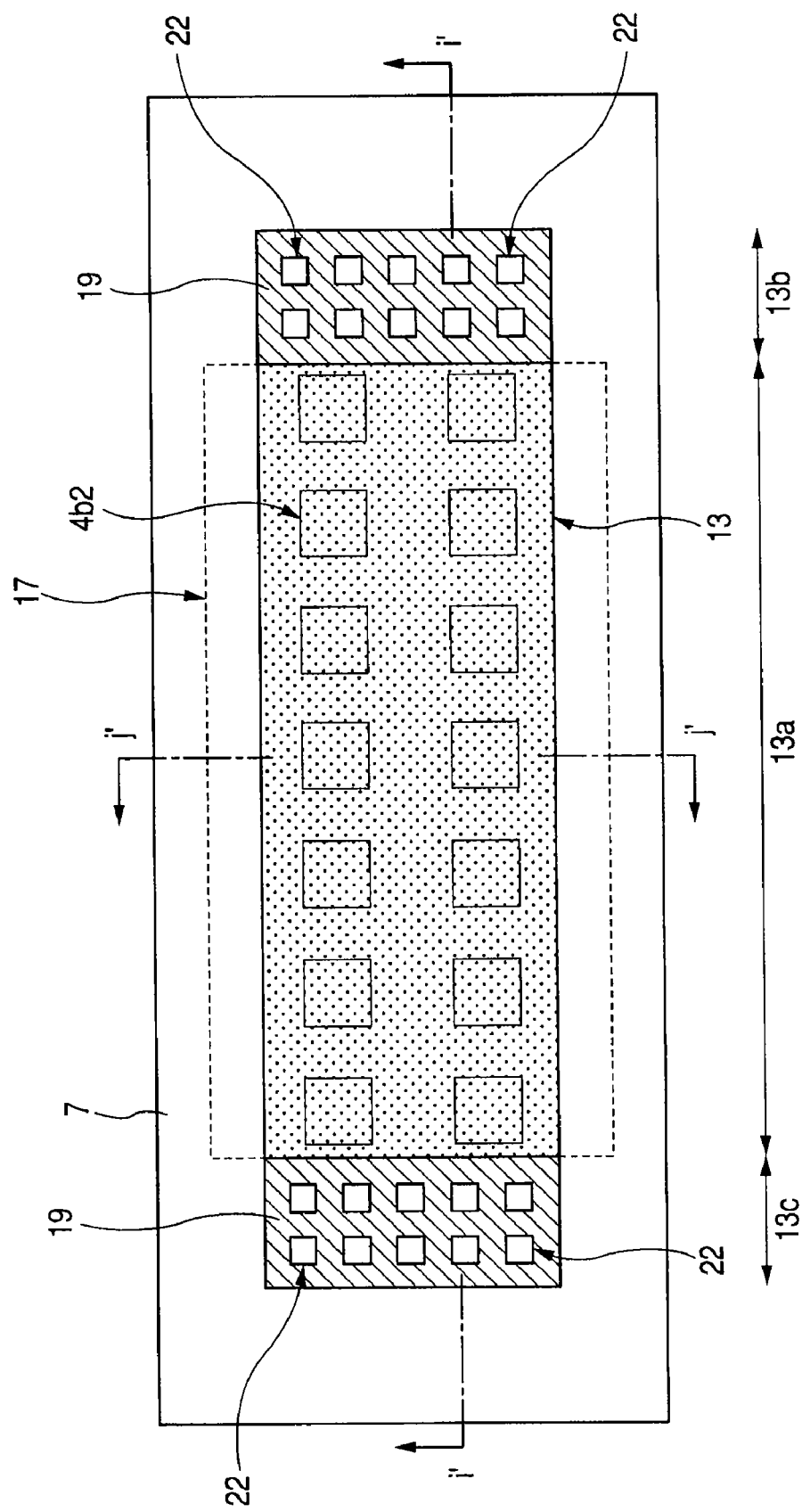
FIG. 32 is a schematic plan view showing the schematic constitution of a resistance element which is mounted on a semiconductor device of an embodiment 5 according to the present invention.

FIG. 32 is a schematic plan view showing the schematic constitution of a resistance element which is mounted on the semiconductor device of an embodiment 5 according to the present invention, and FIG. 33A and FIG. 33B are views showing the cross-sectional structure of the resistance element shown in FIG. 32, in which FIG. 33A is a schematic cross-sectional view taken along a line i'-i' in FIG. 32, and FIG. 33B is a schematic cross-sectional view taken along a line j'-j' in FIG. 32).

In the above-mentioned embodiments 1 to 4, the explanation has been made with respect to the case in which one semiconductor layer 4b2 is arranged below one resistance element 13. However, in the embodiment 5, as shown in FIG. 32 and FIG. 33, a plurality of small rectangular-shaped semiconductor layers 4b2 is arranged below one resistance element 13. In the embodiment 5, a plurality of semiconductor layers 4b2 having a square planar shape is arranged in two rows.

In this manner, by arranging a plurality of small rectangular-shaped semiconductor layers 4b2 below one resistance element 13, it is possible to finely control an occupation ratio of the semiconductor layer.

Further, by arranging a plurality of semiconductor layers 4b2 below one resistance element 13, the influence of the stepped portion S2 with respect to a plurality of resistance elements 13 can be leveled and hence, it is possible to enhance the pair accuracy of the resistance elements 13.

Figure 34A:
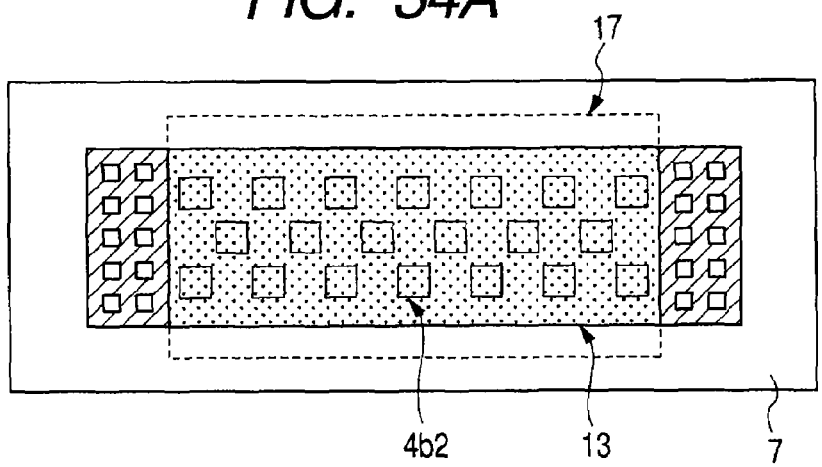
FIG. 34A, FIG. 34B and FIG. 34C are schematic plan views showing the schematic constitution of a resistance element which is a modification of the embodiment 5 according to the present invention.
Figure 34B:
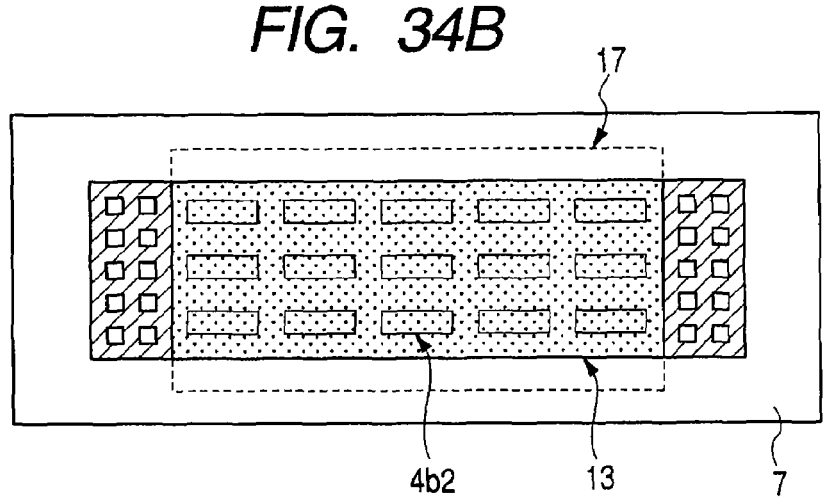
Figure 34C:
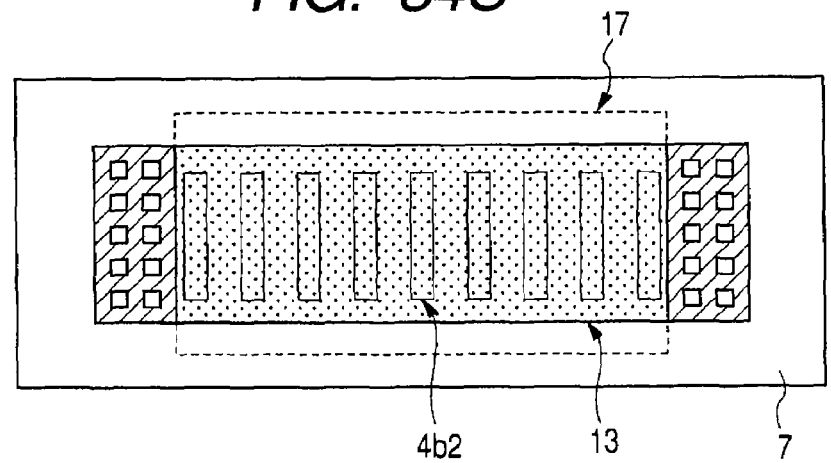

FIGS. 34A, 34B, and 34C are schematic plan views of the resistance element according to a modification of the embodiment 5. A plurality of small rectangular-shaped semiconductor layers 4b2 may be, as shown in FIG. 34A, arranged in a staggered pattern. Further, a plurality of small rectangular-shaped semiconductor layer 4b2 may be, as shown in FIG. 34B, formed in a rectangular shape and may be arranged a plurality of rows. Further, a plurality of small rectangular-shaped semiconductor layer 4b2 may be, as shown in FIG. 34C, formed in a rectangular shape and may be arranged in one row.

Embodiment 6

Figure 35:
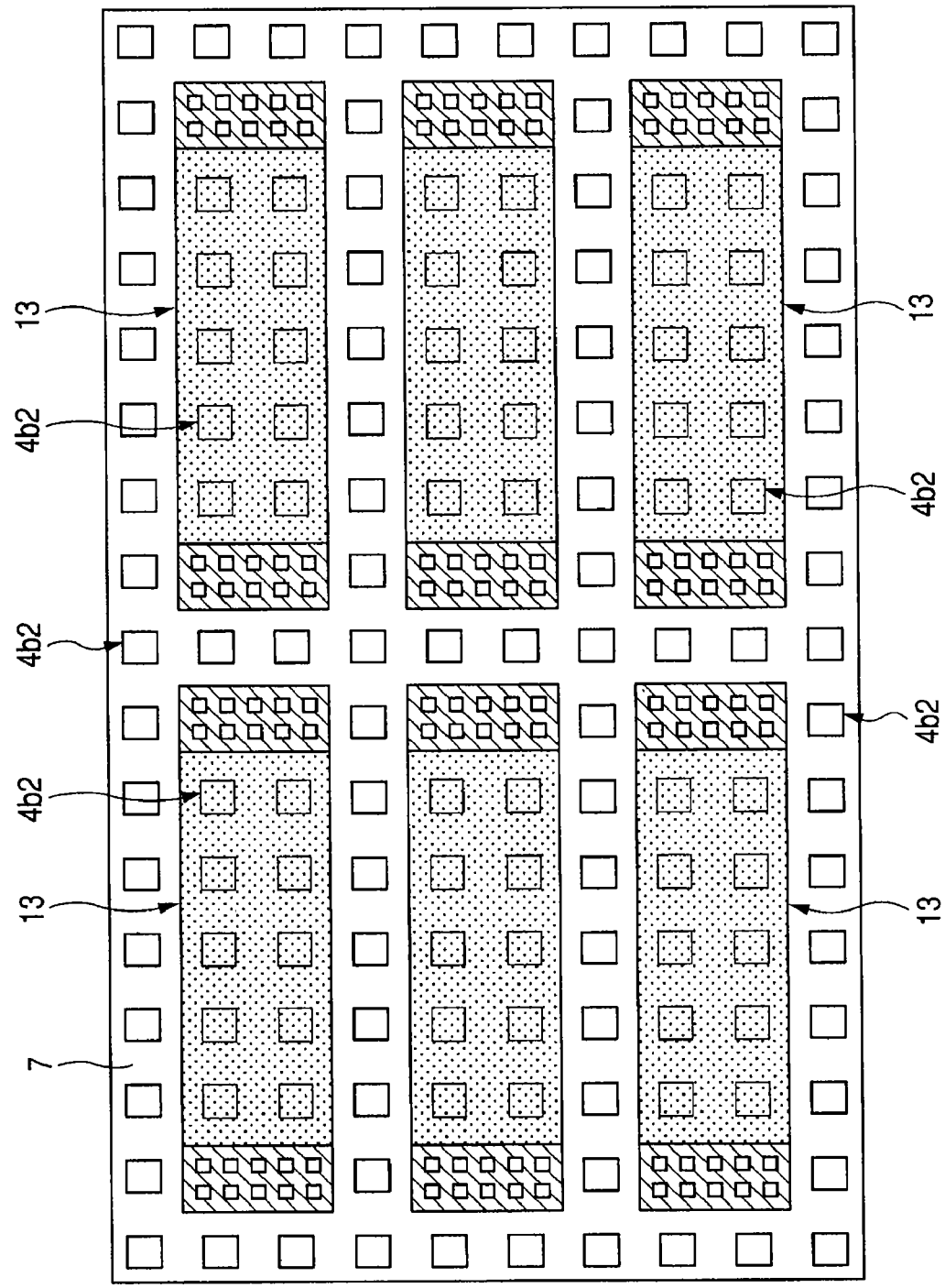
FIG. 35 is a schematic plan view showing one part (an element isolation region on which a plurality of resistance element is formed) of a semiconductor device of an embodiment 6 according to the present invention.

FIG. 35 is a schematic plan view showing the schematic constitution of a resistance element mounted on a semiconductor device of an embodiment 6 according to the present invention.

As shown in FIG. 35, in an element isolation region 1b formed on the main surface of a semiconductor base body 1, a plurality of semiconductor layer 4b2 may be arranged in a matrix array, and a plurality of resistance element 13 may be arranged over the semiconductor layer 4b2. In this case, it is unnecessary to take the misalignment of the mask into consideration.

Embodiment 7

Figure 36:
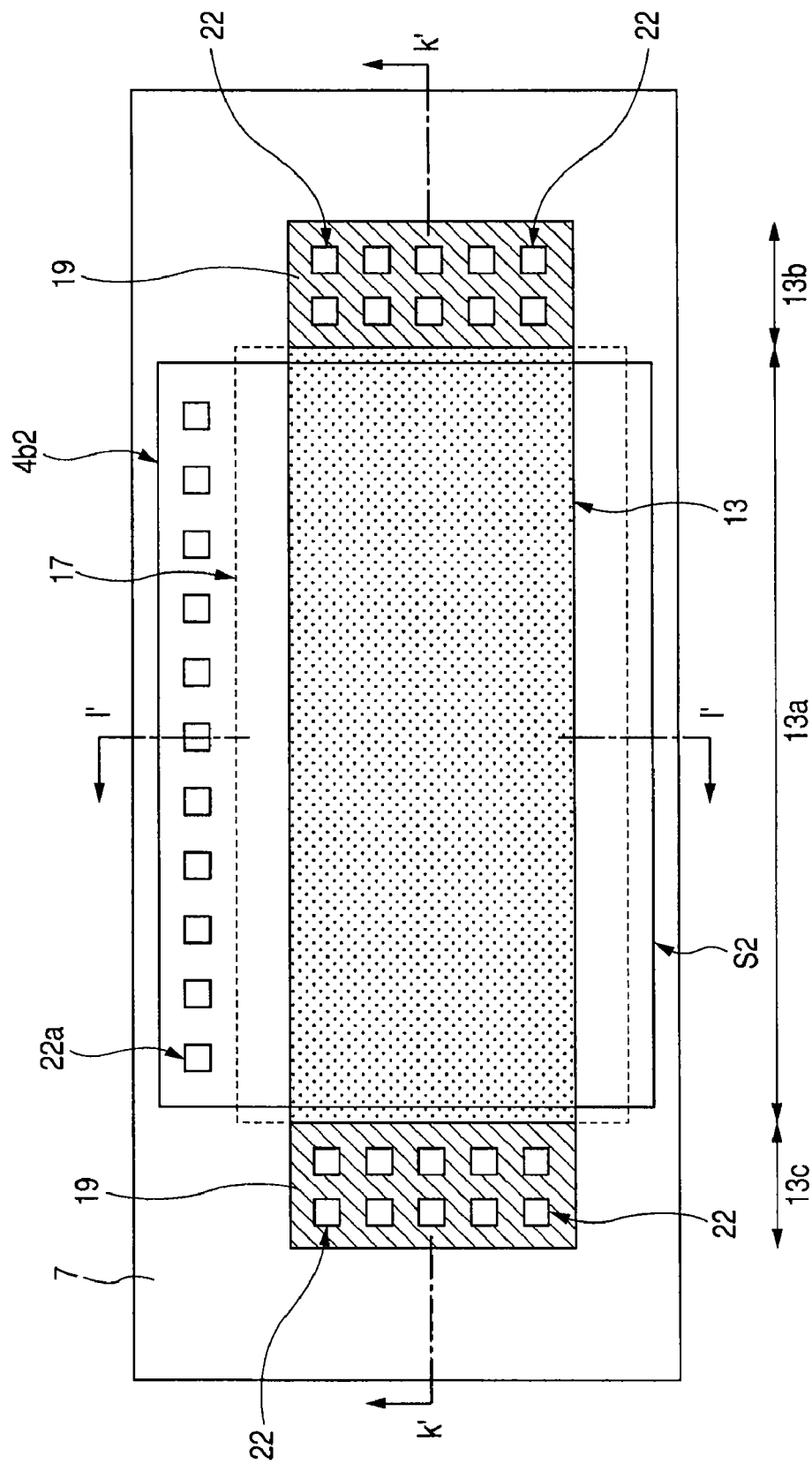
FIG. 36 is a schematic plan view showing the schematic constitution of a resistance element which is mounted on a semiconductor device of an embodiment 7 according to the present invention.
Figures 37A, 37B:
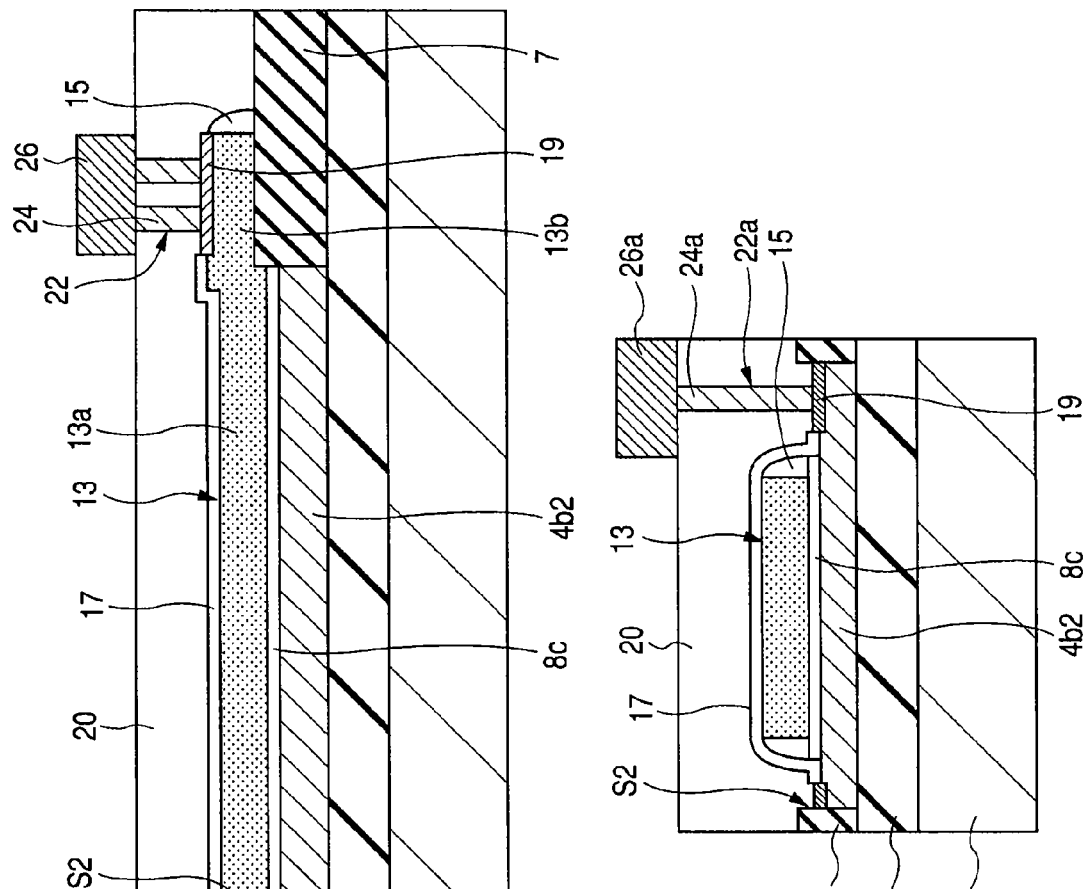

FIG. 36 is a schematic plan view showing the schematic constitution of a resistance element which is mounted on a semiconductor device of an embodiment 7 according to the present invention, and FIG. 37A and FIG. 37B are views showing the cross-sectional structure of the resistance element shown in FIG. 36, in which FIG. 37A is a schematic cross-sectional view taken along a line k'-k' in FIG. 36, and FIG. 37B is a schematic cross-sectional view taken along a line l'-l' in FIG. 36.

In the above-mentioned embodiments 1 to 6, the explanation has been made with respect to the case in which the potential of the semiconductor layer 4b2 is not fixed. However, in the embodiment 7, the explanation is made with respect to the case in which the potential of the semiconductor layer 4b2 is fixed.

As shown in FIG. 36, FIG. 37A and FIG. 37B, the resistance element 13 is arranged to be overlapped to a portion of the semiconductor layer 4b2 in plane. In a region of the semiconductor layer 4b2 which does not overlap to the resistance element 13, silicide layers 19 are formed. Connection holes 22a are provided above the silicide layer 19 such that the connection holes 22a reach the silicide layer 19 after penetrating the interlayer insulation film 20 from a surface of the interlayer insulation film 20, and conductive plugs 24a are embedded in the inside of the connection holes 22a. The semiconductor layer 4b2 is electrically connected to a line 26a which extends on the interlayer insulation film 20 by way of the silicide layer 19 and the conductive plug 24a. The line 26a is a line which serves to fix the potential of the semiconductor layer 4b2 to a power source potential or to a reference potential.

In this manner, by fixing the potential of the semiconductor layer 4b2, it is possible to use the semiconductor layer 4b2 as a shielding layer and hence, the semiconductor layer 4b2 can absorb noises whereby the fluctuation of the resistance value of the resistance element 13 can be suppressed thus enhancing the resistance value accuracy of the resistance element 13.

Embodiment 8

Figure 38:
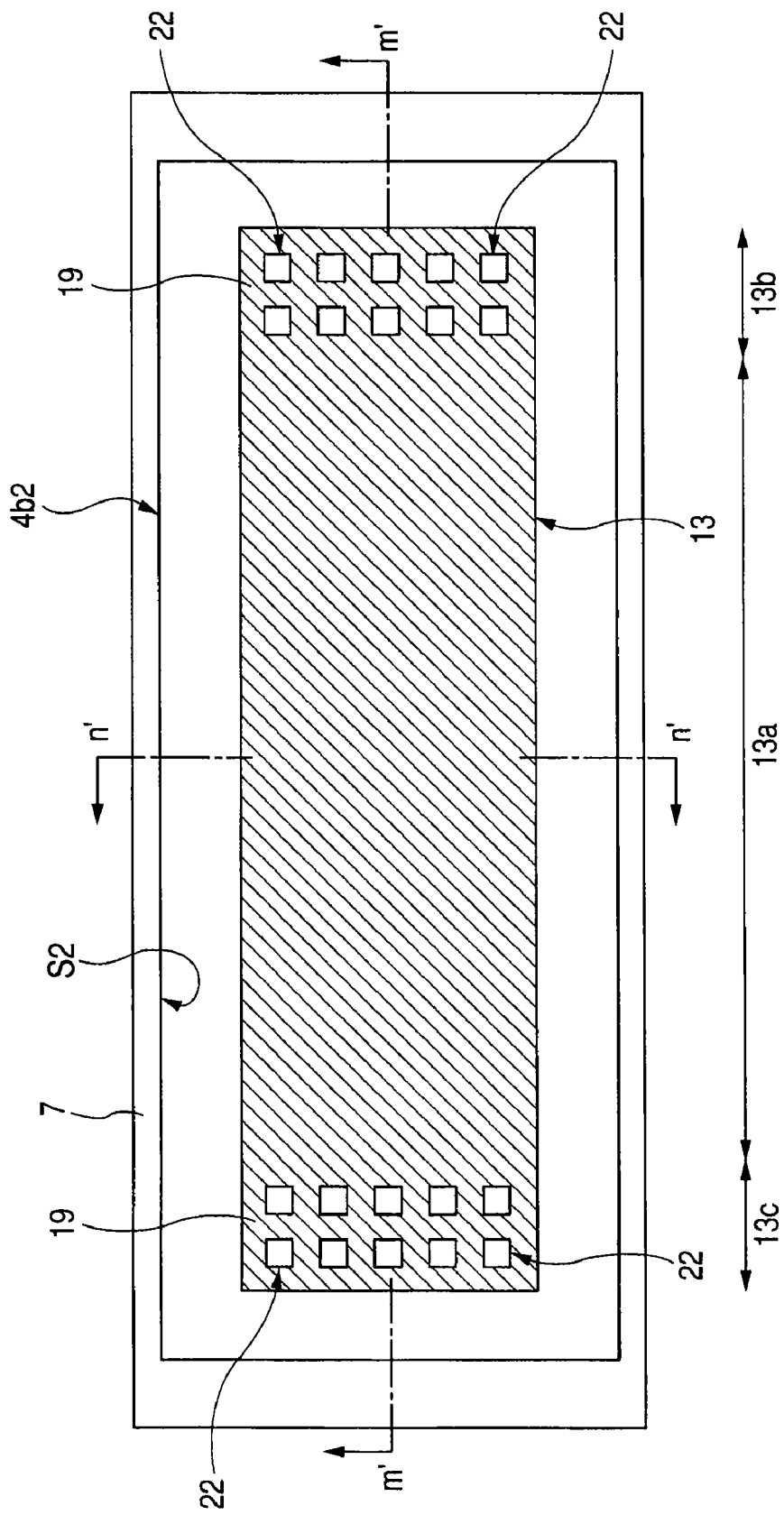
FIG. 38 is a schematic plan view showing the schematic constitution of a resistance element which is mounted on a semiconductor device of an embodiment 8 according to the present invention.

FIG. 38 is a schematic plan view showing the schematic constitution of a resistance element which is mounted on the semiconductor device of the embodiment 8 according to the present invention, and FIG. 39A and FIG. 39B are views showing the cross-sectional structure of the resistance element shown in FIG. 38, in which FIG. 39A is a schematic cross-sectional view taken along a line m'-m' in FIG. 38, and FIG. 39B is a schematic cross-sectional view taken along a line n'-n' in FIG. 38.

In the above-mentioned embodiment 1, the silicide layers 19 are selectively formed over regions of the resistance element 13 where the resistance element 13 is coupled to the conductive plug 24. In the embodiment 8, the silicide layers 19 are formed over the whole surface of the body portion 13a of the resistance element 13.

When the resistance value which the resistance element 13 is requested to possess is small, the whole surface of the resistance element 13 may be formed into silicide as in the case of this embodiment.

Here, the insulation film 17 shown in FIG. 23 of the above-mentioned embodiment 1 may be omitted. In this case, the manufacturing steps of the resistance element 13 can be simplified.

Further, as a modification of the embodiment, it may be possible to arrange the resistance elements which form the silicide layers 19 selectively on the resistance element 13 using the above-mentioned insulation film 17 as in the case of the embodiment 1 and resistance elements which form the silicide layers 19 on the whole resistance element 13 as in the case of the embodiment 8 in mixture.

Further, the constitution of the embodiment 8 may be used in combination with other embodiments 2 to 7. Such a combination can also obtain advantageous effects similar to the advantageous effects obtained by the embodiments 2 to 7.

Although the invention which is made by inventors of the present invention has been specifically explained in conjunction with the embodiments heretofore, it is needless to say that the present invention is not limited to the above-mentioned embodiments and various modifications can be made without departing from the gist of the present invention.

What is claimed is:

1. A semiconductor device comprising:
   a first insulation film formed over a semiconductor base body;
   an island-like semiconductor layer which is formed over the first insulation film;
   a second insulation film which is formed over the first insulation film so that the second insulation film is embedded into a gap formed by patterning the semiconductor layer and is connected to the first insulation film; and a resistance element which is formed over the semiconductor layer in a state that the resistance element is overlapped to an upper surface of the semiconductor layer in plane, wherein the semiconductor layer has a planar size smaller than a planar size of the resistance element, wherein the resistance element is arranged in a state that the resistance element covers the whole semiconductor layer, and wherein the semiconductor layer is formed as a dummy pattern and is in a floating state.

2. A semiconductor device comprising:
a semiconductor base body;
a first insulation film formed over the semiconductor base body;
a semiconductor layer formed over the first insulation film;
a second insulation film formed over the first insulation film;
a third insulation film formed over the semiconductor layer; and
a resistance element which is arranged over the third insulation film,
wherein the second insulation film is embedded into a gap formed by patterning the semiconductor layer so as to divide the semiconductor layer into a plurality of island-like semiconductor layers and is connected to the first insulation film,
wherein the resistance element is overlapped to an upper surface of one of the plurality of island-like semiconductor layers in plane and is insulated electrically from one of the plurality of island-like semiconductor layers by the third insulation film,
wherein the resistance element is arranged to be in a state that the resistance element covers the whole semiconductor layer, and
wherein the semiconductor layer is formed as a dummy pattern and is in a floating state.

3. A semiconductor device according to claim 1,
wherein the upper surface of the semiconductor layer is covered with a third insulation film which has a height lower than the upper surface of the second insulation film, and
wherein the resistance element is insulated electrically from the semiconductor layer by the third insulation film.

4. A semiconductor device according to claim 1,
wherein the resistance element is formed of a silicon film.

5. A semiconductor device according to claim 1,
wherein the resistance element includes a silicon film and silicide layers which are formed over both end portions of the upper surface of the silicon film, and
wherein the silicide layers are arranged over the second insulation film.

6. A semiconductor device according to claim 1,
wherein the resistance element includes a silicon film and silicide layers which are formed over the both end portions of the upper surface of the silicon film, and
wherein the silicide layers are arranged to extend over the second insulation film and the semiconductor layer.

7. A semiconductor device comprising:
a semiconductor base body;
a first insulation film formed over the semiconductor base body;
a semiconductor layer formed over the first insulation film;
a second insulation film formed over the first insulation film;
a third insulation film formed over the semiconductor layer; and
a resistance element which is arranged over the third insulation film,
wherein the second insulation film is embedded into a gap formed by patterning the semiconductor layer so as to divide the semiconductor layer into a plurality of island-like semiconductor layers and is connected to the first insulation film,
wherein the resistance element is overlapped to upper surfaces of the plurality of island-like semiconductor layers in plane and is insulated electrically from the plurality of island-like semiconductor layers by the third insulation film, and
wherein each of the island-like semiconductor layers is formed as a dummy pattern and is in a respective floating state.

8. A semiconductor device comprising:
a semiconductor base body;
a first insulation film formed over the semiconductor base body;
a semiconductor layer formed over the first insulation film;
a second insulation film formed over the first insulation film;
a third insulation film formed over the semiconductor layer; and
a resistance element which is arranged over the third insulation film,
wherein the second insulation film is embedded into a gap formed by patterning the semiconductor layer so as to divide the semiconductor layer into a plurality of island-like semiconductor layers and is connected to the first insulation film, and
wherein the plurality of island-like semiconductor layers includes a plurality of first semiconductor layers and, a plurality of second semiconductor layers,
wherein the resistance element is overlapped to upper surfaces of the plurality of first semiconductor layers in plane, arranged so as to be surrounded by the plurality of second semiconductor layers, and is insulated electrically from the plurality of first semiconductor layers by the third insulation film, and
wherein the plurality of first semiconductor layers and the plurality of second semiconductor layers are formed as a dummy patterns and are in respective floating states.

9. A semiconductor device comprising:
a semiconductor base body;
a first insulation film formed over the semiconductor base body;
a semiconductor layer formed over the first insulation film;
a second insulation film formed over the first insulation film which is embedded into a gap formed by patterning the semiconductor layer so as to divide the semiconductor layer into a plurality of first semiconductor layers and a plurality of second semiconductor layers, and said second insulation film connected to the first insulation film;
a third insulation film formed over one of the plurality of second semiconductor layers;
a resistance element which is overlapped to an upper surface of one of the plurality of second semiconductor layers in plane and is insulated electrically from the one of the plurality of second semiconductor layers by the third insulation film; and a transistor element which has a first source and a first drain formed in one of the plurality of first semiconductor layers, a first gate insulation film formed over one of the plurality of first semiconductor layers, and a first gate formed over the gate insulation film, wherein the first gate insulation film is composed of the same film as the third insulation film, wherein the first gate is composed of the same film as the resistance element, and wherein the second semiconductor layer is formed as a dummy pattern and is in a floating state.

10. A semiconductor device according to claim 9, wherein the resistance element is arranged in a state that the resistance element is overlapped to a portion of or the whole of one of plurality of second semiconductor layers in plane.

11. A semiconductor device according to claim 9, wherein one of the plurality of second semiconductor layers has a planar size smaller than a planar size of the resistance element, and wherein the resistance element is arranged in a state that the resistance element covers the whole of one of the plurality of second semiconductor layers.

12. A semiconductor device according to claim 9, wherein one of the plurality of second semiconductor layers has a planar size larger than a planar size of the resistance element, and wherein the resistance element is arranged in a state that the whole resistance element is positioned over one of the plurality of second semiconductor layers.

13. A semiconductor device according to claim 9, wherein the resistance element is formed in a rectangular planar shape, having long sides and short sides, wherein the plurality of first semiconductor layers and the plurality of second semiconductor layers are formed in a rectangular planar shape having long sides shorter than long sides of the resistance element and short sides longer than short sides of the resistance element, and wherein the resistance element is arranged in a state that the short sides of the resistance element are positioned inside the short sides of the semiconductor layer and the long sides of the resistance element are positioned outside the long sides of the semiconductor layer.

14. A semiconductor device according to claim 9, wherein the upper surface of one of the plurality of second semiconductor layers is covered with a third insulation film which has a height lower than the upper surface of the second insulation film, and wherein the resistance element is insulated electrically from one of the plurality of second semiconductor layers by the third insulation film.

15. A semiconductor device according to claim 9, wherein the resistance element is formed of a silicon film.

16. A semiconductor device according to claim 9, wherein the transistor element is constituted of a MISFET.

17. A semiconductor device according to claim 13, wherein the resistance element includes a silicon film and silicide layers which are formed over both end portions of the upper surface of the silicon film, and wherein the silicide layers are arranged over the second insulation films.

18. A semiconductor device according to claim 13, wherein the resistance element includes a silicon film and silicide layers which are formed over the both end portions of the upper surface of the silicon film, and wherein the silicide layers are arranged to extend over the second insulation film and one of the plurality of second semiconductor layers.

19. A semiconductor device comprising:

a semiconductor base body;

a first insulation film formed over the semiconductor base body;

a semiconductor layer formed over the first insulation film;

a second insulation film formed over the first insulation film which is embedded into a gap formed by patterning the semiconductor layer so as to divide the semiconductor layer into a plurality of first semiconductor layers and a plurality of second semiconductor layers, and said second insulation film connected to the first insulation film;

a third insulation film formed over one of the plurality of second semiconductor layers;

a resistance element which is overlapped to an upper surface of the plurality of second semiconductor layers in plane and is insulated electrically from the one of the plurality of second semiconductor layers by the third insulation film; and a transistor element which has a first source and a first drain formed in one of the plurality of first semiconductor layers, a first gate insulation film formed over one of the plurality of first semiconductor layers, and a first gate formed over the gate insulation film, wherein the first gate insulation film is composed of the same film as the third insulation film, wherein the first gate is composed of the same film as the resistance element, and wherein the plurality of second semiconductor layers are formed as a dummy pattern and are in respective floating states.

20. A semiconductor device comprising:

a semiconductor base body;

a first insulation film formed over the semiconductor base body;

a semiconductor layer formed over the first insulation film;

a second insulation film formed over the first insulation film which is embedded into a gap formed by patterning the semiconductor layer so as to divide the semiconductor layer into a plurality of first semiconductor layers, a plurality of second semiconductor layers, and a plurality of third semiconductor layers, and said second insulation film is connected to the first insulation film;

a third insulation film formed over one of the plurality of second semiconductor layers;

a resistance element which is overlapped to an upper surface of the plurality of second semiconductor layers in plane, arranged so as to be surrounded by the plurality of third semiconductor layers, and is insulated electrically from the one of the plurality of second semiconductor layers by the third insulation film; and a transistor element which has a first source and a first drain formed in one of the plurality of first semiconductor layers, a first gate insulation film formed over one of the plurality of first semiconductor layers, and a first gate formed over the gate insulation film, wherein the first gate insulation film is composed of the same film as the third insulation film, wherein the first gate is composed of the same film as the resistance element, and wherein the plurality of second semiconductor layers and the plurality of third semiconductor layers are formed as a dummy patterns and are in respective floating states.

21. A semiconductor device comprising:
a semiconductor base body;
a first insulation film formed over the semiconductor base body;
a semiconductor layer formed over the first insulation film;
a second insulation film formed over the first insulation film which is embedded into a gap formed by patterning the semiconductor layer so as to divide the semiconductor layer into a plurality of first semiconductor layers and a plurality of second semiconductor layers, and is connected to the first insulation film;
a third insulation film formed over one of the plurality of second semiconductor layers;
a resistance element which is overlapped to an upper surface of one of the plurality of second semiconductor layers in plane and is insulated electrically from the one of the plurality of second semiconductor layers by the third insulation film; and
a transistor element which has a first source and a first drain formed in one of the plurality of first semiconductor layers, a first gate insulation film formed over one of the plurality of first semiconductor layers, and a first gate formed over the gate insulation film,
wherein the first gate insulation film is composed of the same film as the third insulation film,
wherein the first gate is composed of the same film as the resistance element, and
wherein a wiring for fixing a potential of one of the plurality of second semiconductor layers is coupled to one of the plurality of second semiconductor layers.

22. A semiconductor device according to claim 19, wherein the transistor element is constituted of a MISFET.

23. A semiconductor device according to claim 2, wherein the resistance element includes a silicon film and silicide layers which are formed over both end portions of the upper surface of the silicon film, and
wherein the silicide layers are arranged over the second insulation films.

24. A semiconductor device according to claim 2, wherein the resistance element includes a silicon film and silicide layers which are formed over both end portions of the upper surface of the silicon film, and
wherein the silicide layers are arranged to extend over the second insulation film and one of the plurality of island-like semiconductor layers.

25. A semiconductor device according to claim 20, wherein the transistor element is constituted of a MISFET.

26. A semiconductor device according to claim 21, wherein the transistor element is constituted of a MISFET.

27. A semiconductor device according to claim 2, wherein the resistance element is formed of a silicon film.

28. A semiconductor device according to claim 1, further comprising:
a fourth insulation film and first silicide layers,
wherein the fourth insulation film is formed over the resistance element selectively, and
wherein the first silicide layers are formed over the surface of the resistance element so as to be aligned with the fourth insulation film.

29. A semiconductor device according to claim 9, wherein the transistor element includes a low breakdown voltage transistor and a high breakdown voltage transistor,
wherein a thickness of the high breakdown voltage transistor is larger than a thickness of the low breakdown voltage transistor, and
wherein the third insulation film is the gate insulation film of the high breakdown voltage transistor.

30. A semiconductor device according to claim 9, further comprising:
a fourth insulation film and a plurality of silicide layers,
wherein the silicide layers are formed over a surface of the resistance element, the first source, and the first gate,
wherein the fourth insulation film is formed over the resistance element selectively, and
wherein the silicide layers formed over the surface of the resistance element are arranged to be aligned with the fourth insulation film.

31. A semiconductor device according to claim 19, further comprising:
a fourth insulation film and a plurality of silicide layers,
wherein the silicide layers are formed over a surface of the resistance element, the first source, and the first gate,
wherein the fourth insulation film is formed over the resistance element selectively, and
wherein the silicide layers formed over the surface of the resistance element are arranged to be aligned with the fourth insulation film.

32. A semiconductor device according to claim 20, further comprising:
a fourth insulation film and a plurality of silicide layers,
wherein the silicide layers are formed over a surface of the resistance element, the first source, and the first gate,
wherein the fourth insulation film is formed over the resistance element selectively, and
wherein the silicide layers formed over the surface of the resistance element are arranged to be aligned with the fourth insulation film.

33. A semiconductor device according to claim 21, further comprising:
a fourth insulation film and a plurality of silicide layers,
wherein the silicide layers are formed over a surface of the resistance element, the first source, and the first gate,
wherein the fourth insulation film is formed over the resistance element selectively, and
wherein the silicide layers formed over the surface of the resistance element are arranged to be aligned with the fourth insulation film.

34. A semiconductor device comprising:
a first insulation film formed over a semiconductor base body;
an island-like semiconductor layer which is formed over the first insulation film;
a second insulation film which is formed over the first insulation film so that the second insulation film is embedded into a gap formed by patterning the semiconductor layer and is connected to the first insulation film; and
a resistance element which is formed over the semiconductor layer in a state that the resistance element is overlapped to an upper surface of the semiconductor layer in plane,
wherein the resistance element is formed in a rectangular planar shape having long sides and short sides,
wherein the semiconductor layer is formed in a rectangular planar shape having long sides shorter than long sides of the resistance element and short sides longer than short sides of the resistance element,
wherein the resistance element is arranged in a state that the short sides of the resistance element are positioned outside the short sides of the semiconductor layer and the long sides of the resistance element are positioned inside the long sides of the semiconductor layer, and wherein the semiconductor layer is formed as a dummy pattern and is in a floating state.

35. A semiconductor device according to claim 34,
wherein the upper surface of the semiconductor layer is covered with a third insulation film which has a height lower than the upper surface of the second insulation film, and
wherein the resistance element is insulated electrically from one of the semiconductor layers by the third insulation film.

36. A semiconductor device according to claim 34,
wherein the resistance element is formed of a silicon film.

37. A semiconductor device according to claim 34,
wherein the resistance element includes a silicon film and silicide layers which are formed over both end portions of the upper surface of the silicon film, and
wherein the silicide layers are arranged over the second insulation film.

38. A semiconductor device according to claim 34,
wherein the resistance element includes a silicon film and silicide layers which are formed over the both end portions of the upper surface of the silicon film, and
wherein the silicide layers are arranged to extend over the second insulation film and the semiconductor layer.

39. A semiconductor device according to claim 34, further comprising:
a fourth insulation film and first silicide layers,
wherein the fourth insulation film is formed over the resistance element selectively, and
wherein the first silicide layers are formed over the surface of the resistance element so as to be aligned with the fourth insulation film.

* * * * *